(12) United States Patent
Kay et al.

(10) Patent No.: US 9,401,678 B2
(45) Date of Patent: Jul. 26, 2016

(54) OUTPUT IMPEDANCE COMPENSATION OF A PSEUDO-ENVELOPE FOLLOWER POWER MANAGEMENT SYSTEM

(71) Applicant: RF Micro Devices, Inc., Greensboro, NC (US)

(72) Inventors: Michael R. Kay, Summerfield, NC (US); Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 323 days.

(21) Appl. No.: 14/151,167

(22) Filed: Jan. 9, 2014

(65) Prior Publication Data

US 2014/0125408 A1 May 8, 2014

Related U.S. Application Data

(63) Continuation of application No. 14/022,858, filed on Sep. 10, 2013, now Pat. No. 9,099,961, which is a continuation-in-part of application No. 13/316,229, filed on Dec. 9, 2011, now Pat. No. 8,633,766, said (Continued)

(51) Int. Cl.
*H03F 3/04* (2006.01)
*H03G 3/00* (2006.01)
(Continued)

(52) U.S. Cl.
CPC . *H03F 1/02* (2013.01); *H02M 3/07* (2013.01); *H03F 1/025* (2013.01); *H03F 1/0244* (2013.01);
(Continued)

(58) Field of Classification Search
CPC ................................... H03F 3/04; H03F 3/00
USPC .................................. 330/295, 297, 127, 302
See application file for complete search history.

(56) References Cited

U.S. PATENT DOCUMENTS 3,969,682 A   7/1976   Rossum
3,980,964 A   9/1976   Grodinsky
(Continued)

FOREIGN PATENT DOCUMENTS

CN   1076567 A   9/1993
CN   1211355 A   3/1999
(Continued)

OTHER PUBLICATIONS

Non-Final Office Action for U.S. Appl. No. 12/836,307, mailed Sep. 25, 2014, 5 pages.
(Continued)

*Primary Examiner* — Patricia T Nguyen
(74) *Attorney, Agent, or Firm* — Withrow & Terranova, P.L.L.C.

(57) ABSTRACT

A switch mode power supply converter, a parallel amplifier, and a parallel amplifier output impedance compensation circuit are disclosed. The switch mode power supply converter provides a switching voltage and generates an estimated switching voltage output, which is indicative of the switching voltage. The parallel amplifier generates a power amplifier supply voltage at a power amplifier supply output based on a combination of a $V_{RAMP}$ signal and a high frequency ripple compensation signal. The parallel amplifier output impedance compensation circuit provides the high frequency ripple compensation signal based on a difference between the $V_{RAMP}$ signal and the estimated switching voltage output.

21 Claims, 14 Drawing Sheets

Related U.S. Application Data application No. 14/022,858 is a continuation-in-part of application No. 13/089,917, filed on Apr. 19, 2011, now Pat. No. 8,493,141, and a continuation-in-part of application No. 13/218,400, filed on Aug. 25, 2011, now Pat. No. 8,519,788, and a continuation-in-part of application No. 13/089,917, filed on Apr. 19, 2011, now Pat. No. 8,493,141.

(60) Provisional application No. 61/421,348, filed on Dec. 9, 2010, provisional application No. 61/421,475, filed on Dec. 9, 2010, provisional application No. 61/469,276, filed on Mar. 30, 2011, provisional application No. 61/325,659, filed on Apr. 19, 2010, provisional application No. 61/376,877, filed on Aug. 25, 2010.

(51) Int. Cl.
*H03F 1/02* (2006.01)
*H02M 3/07* (2006.01)
*H03F 1/42* (2006.01)
*H03F 3/195* (2006.01)
*H03F 3/24* (2006.01)
*H03F 3/30* (2006.01)
*H03F 3/45* (2006.01)
*H03F 3/50* (2006.01)
*H03F 3/72* (2006.01)

(52) U.S. Cl.
CPC ............ *H03F 1/0277* (2013.01); *H03F 1/42* (2013.01); *H03F 3/195* (2013.01); *H03F 3/245* (2013.01); *H03F 3/3022* (2013.01); *H03F 3/45475* (2013.01); *H03F 3/505* (2013.01); *H03F 3/72* (2013.01); *H03F 2200/102* (2013.01); *H03F 2200/204* (2013.01); *H03F 2200/36* (2013.01); *H03F 2200/375* (2013.01); *H03F 2200/451* (2013.01); *H03F 2200/555* (2013.01); *H03F 2200/78* (2013.01); *H03F 2203/45526* (2013.01); *H03F 2203/45544* (2013.01); *H03F 2203/45594* (2013.01); *H03F 2203/45694* (2013.01); *H03F 2203/45712* (2013.01); *H03F 2203/45718* (2013.01); *H03F 2203/7221* (2013.01)

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,339,041 A | 8/1994 | Nitardy |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,646,501 B1 | 11/2003 | Wessel |
| 6,658,445 B1 | 12/2003 | Gau et al. |
| 6,681,101 B1 | 1/2004 | Eidson et al. |
| 6,686,727 B2 | 2/2004 | Ledenev et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 * | 3/2010 | Li .................... H03F 1/0244 330/10 |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |

(56) References Cited

U.S. PATENT DOCUMENTS

| | | |
|---|---|---|
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,358,113 B2 | 1/2013 | Cheng et al. |
| 8,362,837 B2 | 1/2013 | Koren et al. |
| 8,446,135 B2 | 5/2013 | Chen et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 * | 1/2014 | Khlat .................. H03F 1/0216 455/115.1 |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,693,676 B2 | 4/2014 | Xiao et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,099,961 B2 | 8/2015 | Kay et al. |
| 9,112,452 B1 | 8/2015 | Khlat |
| 2002/0071497 A1 | 6/2002 | Bengtsson et al. |
| 2002/0125869 A1 | 9/2002 | Groom et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |

(56) References Cited

U.S. PATENT DOCUMENTS

| | | |
|---|---|---|
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0015229 A1 | 1/2009 | Kotikalapoodi |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Taufik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0193629 A1* | 8/2011 | Hou .................... H03F 1/0227 330/127 |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1* | 12/2011 | Stanley .................... H03F 1/26 330/295 |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1* | 8/2012 | Fayed .................... H02M 3/158 323/271 |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1* | 2/2014 | Barth .................... H02M 5/293 323/271 |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0285164 A1* | 9/2014 | Oishi .................... H03F 1/0222 323/266 |
| 2014/0306769 A1 | 10/2014 | Khlat et al. |
| 2015/0048891 A1 | 2/2015 | Rozek et al. |
| 2015/0180422 A1 | 6/2015 | Khlat et al. |
| 2015/0234402 A1 | 8/2015 | Kay et al. |

FOREIGN PATENT DOCUMENTS

| | | |
|---|---|---|
| CN | 1518209 A | 8/2004 |
| CN | 1898860 A | 1/2007 |
| CN | 101106357 A | 1/2008 |
| CN | 101201891 A | 6/2008 |

(56) References Cited

FOREIGN PATENT DOCUMENTS

| | | | |
|---|---|---|---|
| CN | 101379695 A | 3/2009 | |
| CN | 101405671 A | 4/2009 | |
| CN | 101416385 A | 4/2009 | |
| CN | 101427459 A | 5/2009 | |
| CN | 101548476 A | 9/2009 | |
| CN | 101626355 A | 1/2010 | |
| CN | 101635697 A | 1/2010 | |
| CN | 101669280 A | 3/2010 | |
| CN | 101867284 A | 10/2010 | |
| CN | 201674399 U | 12/2010 | |
| EP | 0755121 A2 | 1/1997 | |
| EP | 1047188 A2 | 10/2000 | |
| EP | 1317105 A1 | 6/2003 | |
| EP | 1492227 A1 | 12/2004 | |
| EP | 1557955 A1 | 7/2005 | |
| EP | 1569330 A1 | 8/2005 | |
| EP | 2214304 A1 | 8/2010 | |
| EP | 2244366 A1 | 10/2010 | |
| EP | 2372904 A1 | 10/2011 | |
| EP | 2579456 A1 | 4/2013 | |
| GB | 2398648 A | 8/2004 | |
| GB | 2462204 A | 2/2010 | |
| GB | 2465552 A | 5/2010 | |
| GB | 2484475 A | 4/2012 | |
| JP | 2010166157 A | 7/2010 | |
| TW | 461168 B | 10/2001 | |
| WO | 0048306 A1 | 8/2000 | |
| WO | 04002006 A1 | 12/2003 | |
| WO | 2004082135 A2 | 9/2004 | |
| WO | 2005013084 A2 | 2/2005 | |
| WO | 2006021774 A1 | 3/2006 | |
| WO | 2006070319 A1 | 7/2006 | |
| WO | 2006073208 A1 | 7/2006 | |
| WO | 2007107919 A1 | 9/2007 | |
| WO | 2007149346 A2 | 12/2007 | |
| WO | 2012151594 A2 | 11/2012 | |
| WO | 2012172544 A1 | 12/2012 | |

OTHER PUBLICATIONS

Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Notice of Allowance for U.S. Appl. No. 14/072,140, mailed Dec. 2, 2014, 8 pages.
First Office Action for Chinese Patent Application No. 2012800265590, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Notice of Allowance for U.S. Appl. No. 13/948,291, mailed Feb. 11, 2015, 7 pages.
First Office Action for Chinese Patent Application No. 2011800302735, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
European Search Report for European Patent Application No. 14190851.7, issued Mar. 5, 2015, 6 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.

(56) References Cited

OTHER PUBLICATIONS

Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
First Office Action and Search Report for Chinese Patent Application No. 201280007941.7, issued May 13, 2015, 13 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Author Unknown, "Automatically," Definition, Dictionary.com Unabridged, 2015, pp. 1-6, http://dictionary.reference.com/browse/automatically.
Final Office Action for U.S. Appl. No. 13/689,883, mailed Dec. 23, 2015, 12 pages.
Final Office Action for U.S. Appl. No. 13/714,600, mailed Dec. 24, 2015, 15 pages.
Notice of Allowance for U.S. Appl. No. 13/747,725, mailed Oct. 28, 2015, 9 pages.
Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.
corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.
Non-Final Office Action for U.S. Appl. No. 14/458,341, mailed Nov. 12, 2015, 5 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.

(56) References Cited

OTHER PUBLICATIONS

Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mmA2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619, mailed May 8, 2007, 2 pages.

(56) References Cited

OTHER PUBLICATIONS

Extended European Search Report for application 06740532.4, mailed Dec. 27, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.
Examination Report for European Patent Application No. 11720630, mailed Aug. 16, 2013, 5 pages.
Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
Notice of Allowance for U.S. Appl. No. 13/661,164, mailed Oct. 21, 2015, 7 pages.
Non-Final Office Action for U.S. Appl. No. 14/254,215, mailed Oct. 15, 2015, 5 pages.
First Office Action for Chinese Patent Application No. 201180067293.X, mailed Aug. 6, 2015, 13 pages.
Notice of Allowance for U.S. Appl. No. 14/072,225, mailed Feb. 3, 2016, 7 pages.
First Office Action for Chinese Patent Application No. 201280042523.1, issued Dec. 4, 2015, 12 pages.
Final Office Action for U.S. Appl. No. 13/661,227, mailed Feb. 9, 2016, 28 pages.
Advisory Action for U.S. Appl. No. 14/082,629, mailed Jan. 22, 2016, 3 pages.
Non-Final Office Action for U.S. Appl. No. 13/876,518, mailed Jan. 20, 2016, 16 pages.
Notice of Allowance for U.S. Appl. No. 14/163,256, mailed Feb. 10, 2016, 8 pages.
Advisory Action for U.S. Appl. No. 13/689,883, mailed Mar. 4, 2016, 3 pages.
Advisory Action for U.S. Appl. No. 13/714,600, mailed Mar. 14, 2016, 3 pages.
Notice of Allowance for U.S. Appl. No. 13/689,922, mailed Mar. 18, 2016, 9 pages.
Notice of Allowance for U.S. Appl. No. 14/101,770, mailed Apr. 11, 2016, 6 pages.
Non-Final Office Action for U.S. Appl. No. 14/082,629, mailed Mar. 16, 2016, 23 pages.
Notice of Allowance for U.S. Appl. No. 14/702,192, mailed Feb. 22, 2016, 8 pages.
Notice of Allowance for U.S. Appl. No. 14/254,215, mailed Feb. 18, 2016, 7 pages.
Notice of Allowance for U.S. Appl. No. 14/458,341, mailed Feb. 18, 2016, 6 pages.
First Office Action for Chinese Patent Application No. 201280052739.6, mailed Mar. 3, 2016, 31 pages.
Communication under Rule 164(2)(a) EPC for European Patent Application No. 12725911.7, mailed Feb. 17, 2016, 8 pages.
Non-Final Office Action for U.S. Appl. No. 13/689,883, mailed Apr. 20, 2016, 13 pages.
Notice of Allowance and Examiner Initiated Interview Summary for U.S. Appl. No. 13/661,227, mailed May 13, 2016, 10 pages.
Non-Final Office Action for U.S. Appl. No. 13/714,600, mailed May 4, 2016, 14 pages.
Examination Report for European Patent Application No. 14190851.7, mailed May 2, 2016, 5 pages.

\* cited by examiner

OUTPUT IMPEDANCE COMPENSATION OF A PSEUDO-ENVELOPE FOLLOWER POWER MANAGEMENT SYSTEM

RELATED APPLICATION

The present application claims priority to and is a continuation of U.S. patent application Ser. No. 14/022,858, filed Sep. 10, 2013, entitled "OUTPUT IMPEDANCE COMPENSATION OF A PSEUDO-ENVELOPE FOLLOWER POWER MANAGEMENT SYSTEM," now U.S. Pat. No. 9,099,961.

U.S. patent application Ser. No. 14/022,858 claims priority to and is a continuation-in-part of U.S. patent application Ser. No. 13/316,229, filed Dec. 9, 2011, entitled "PSEUDO-ENVELOPE FOLLOWER POWER MANAGEMENT SYSTEM WITH HIGH FREQUENCY RIPPLE CURRENT COMPENSATION," now U.S. Pat. No. 8,633,766, which claims priority to U.S. Provisional Patent Applications No. 61/421,348, filed Dec. 9, 2010; No. 61/421,475, filed Dec. 9, 2010; and No. 61/469,276, filed Mar. 30, 2011.

U.S. patent application Ser. No. 14/022,858 claims priority to and is a continuation-in-part of U.S. patent application Ser. No. 13/089,917, filed Apr. 19, 2011, entitled "PSEUDO-ENVELOPE FOLLOWING POWER MANAGEMENT SYSTEM," now U.S. Pat. No. 8,493,141, which claims priority to U.S. Provisional Patent Application No. 61/325,659, filed Apr. 19, 2010.

U.S. patent application Ser. No. 14/022,858 claims priority to and is a continuation-in-part of U.S. patent application Ser. No. 13/218,400, filed Aug. 25, 2011, entitled "BOOST CHARGE-PUMP WITH FRACTIONAL RATIO AND OFFSET LOOP FOR SUPPLY MODULATION," now U.S. Pat. No. 8,519,788, which claims priority to U.S. Provisional Patent Application No. 61/376,877, filed Aug. 25, 2010. U.S. patent application Ser. No. 13/218,400 is a continuation-in-part of U.S. patent application Ser. No. 13/089,917, filed Apr. 19, 2011, which claims priority to U.S. Provisional Patent Application No. 61/325,659, filed Apr. 19, 2010.

All of the applications listed above are hereby incorporated herein by reference in their entireties.

FIELD OF THE DISCLOSURE

The embodiments described herein relate to a power management system for delivering current to a linear RF power amplifier. More particularly, the embodiments relate to the use of a pseudo-envelope tracker in a power management system of mobile communications equipment.

BACKGROUND

Next-generation mobile devices are morphing from voice-centric telephones to message and multimedia-based "smart" phones that offer attractive new features. As an example, smart phones offer robust multimedia features such as web-browsing, audio and video playback and streaming, email access and a rich gaming environment. But even as manufacturers race to deliver ever more feature rich mobile devices, the challenge of powering them looms large.

In particular, the impressive growth of high bandwidth applications for radio frequency (RF) hand-held devices has led to increased demand for efficient power saving techniques to increase battery life. Because the power amplifier of the mobile device consumes a large percentage of the overall power budget of the mobile device, various power management systems have been proposed to increase the overall power efficiency of the power amplifier.

As an example, some power management systems may use a $V_{RAMP}$ power control voltage to control the voltage presented on a power amplifier collector of a linear RF power amplifier. As another example, other power management schemes may use a buck converter power supply and a class AB amplifier in tandem to provide power to the linear RF power amplifier.

Even so, there remains a need to further improve the power efficiency of mobile devices to provide extended battery life. As a result, there is a need to improve the power management system of mobile devices.

SUMMARY

A switch mode power supply converter, a parallel amplifier, and a parallel amplifier output impedance compensation circuit are disclosed. The switch mode power supply converter provides a switching voltage and generates an estimated switching voltage output, which is indicative of the switching voltage. The parallel amplifier generates a power amplifier supply voltage at a power amplifier supply output based on a combination of a $V_{RAMP}$ signal and a high frequency ripple compensation signal. The parallel amplifier output impedance compensation circuit provides the high frequency ripple compensation signal based on a difference between the $V_{RAMP}$ signal and the estimated switching voltage output.

In one embodiment of the parallel amplifier output impedance compensation circuit, the parallel amplifier output impedance compensation circuit compensates for a non-ideal output impedance of the parallel amplifier by providing the combination of the $V_{RAMP}$ signal and a high frequency ripple compensation signal. In one embodiment of the parallel amplifier output impedance compensation circuit, the combination of the $V_{RAMP}$ signal and the high frequency ripple compensation signal is based on pre-filtering the $V_{RAMP}$ signal to equalize the overall frequency response of the switch mode power supply converter and the parallel amplifier to provide a proper transfer function of the switch mode power supply converter and the parallel amplifier.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A switch mode power supply converter, a parallel amplifier, and a parallel amplifier output impedance compensation circuit are disclosed. The switch mode power supply converter provides a current to a power amplifier supply output via an inductor. The parallel amplifier generates a power amplifier supply voltage at the power amplifier supply output based on a compensated $V_{RAMP}$ signal. The parallel amplifier output impedance compensation circuit compensates for a non-ideal output impedance of the parallel amplifier based on a combination of a $V_{RAMP}$ signal and a high frequency ripple compensation signal. The high frequency ripple compensation signal is based on a difference between the $V_{RAMP}$ signal and an estimated switching voltage output, which is provided by the switch mode power supply converter.

In one embodiment of the parallel amplifier output impedance compensation circuit, the combination of the $V_{RAMP}$ signal and the high frequency ripple compensation signal is based on pre-filtering the $V_{RAMP}$ signal to equalize the overall frequency response of the switch mode power supply converter and the parallel amplifier to provide a proper transfer function of the switch mode power supply converter and the parallel amplifier.

Figure 1A:
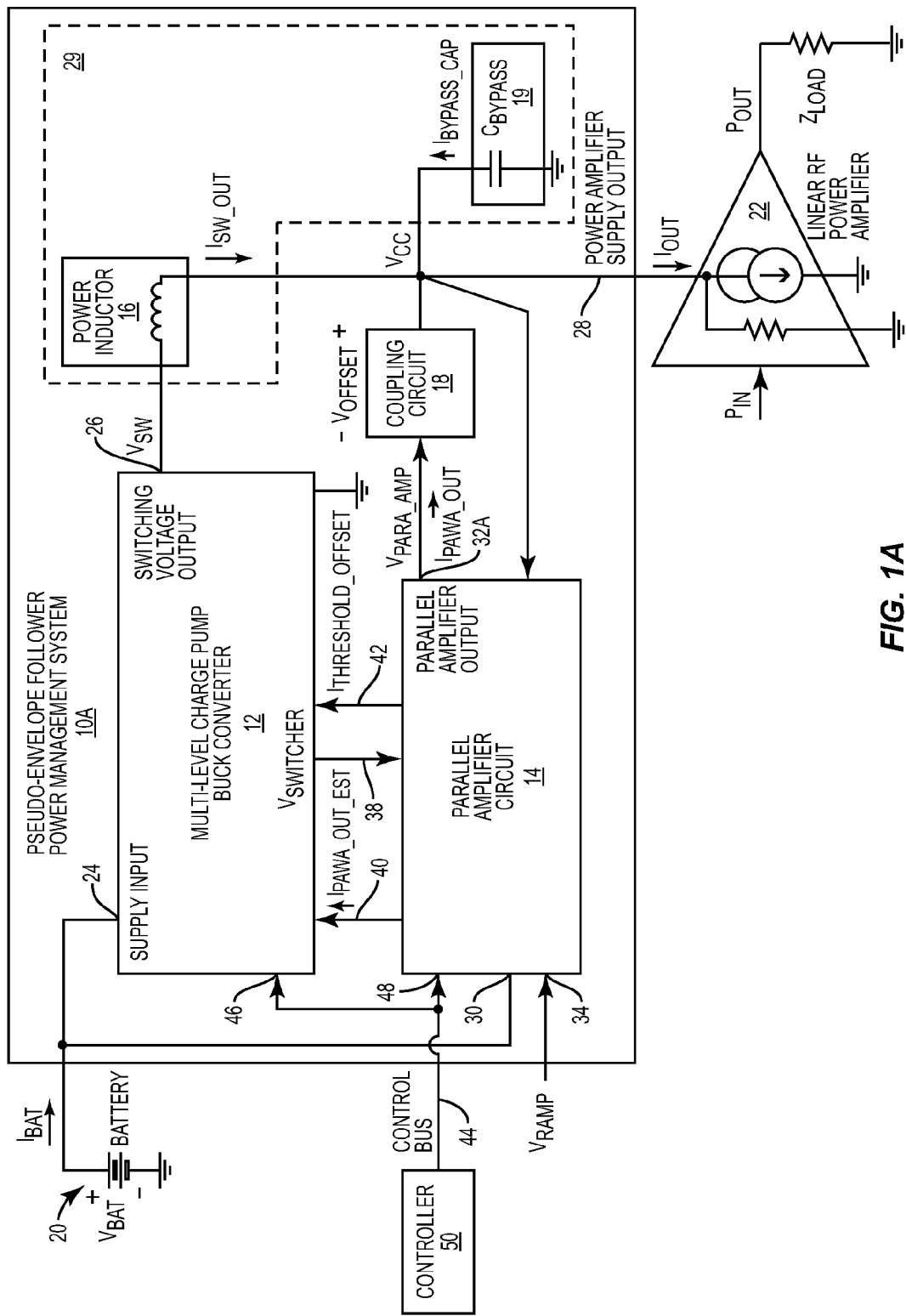
FIG. 1A depicts an embodiment of a pseudo-envelope follower power management system for managing power supplied to a linear RF power amplifier.
Figure 2A:
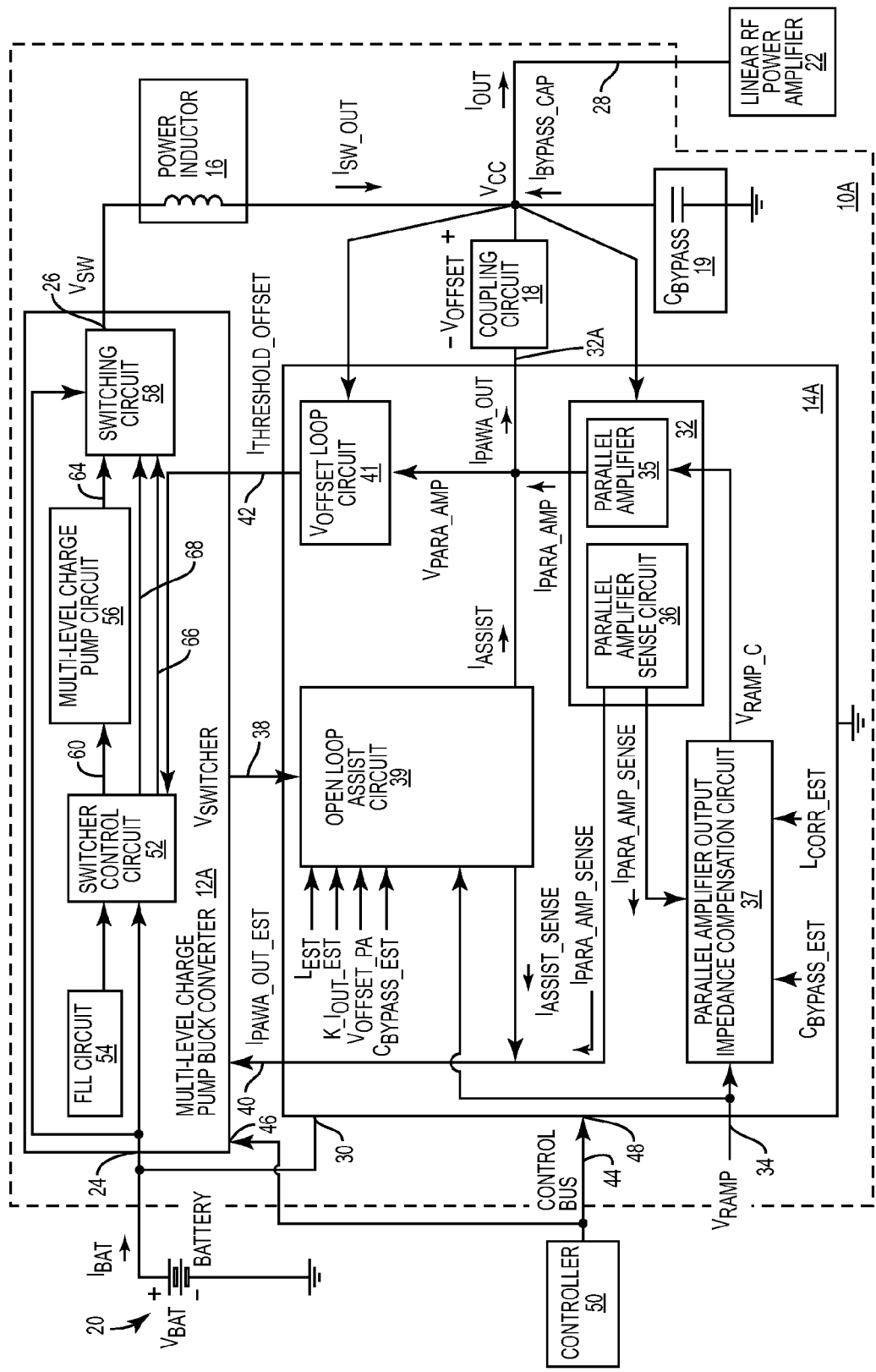
FIG. 2A depicts an embodiment of the pseudo-envelope follower power management system of FIG. 1A in further detail.

FIGS. 1A and 2A depict an example embodiment of a pseudo-envelope follower power management system 10A including a multi-level charge pump buck converter 12, a parallel amplifier circuit 14, a power inductor 16, a coupling circuit 18, and a bypass capacitor 19. The bypass capacitor 19 has a bypass capacitor capacitance, $C_{BYPASS}$. The multi-level charge pump buck converter 12 and the parallel amplifier circuit 14 may be configured to operate in tandem to generate a power amplifier supply voltage, $V_{CC}$, at a power amplifier supply output 28 of the pseudo-envelope follower power management system 10A for a linear RF power amplifier 22. The power amplifier supply output 28 provides an output current, $I_{OUT}$, to the linear RF power amplifier 22. The linear RF power amplifier 22 may include a power amplifier input, $P_{IN}$, which is configured to receive a modulated RF signal, and a power amplifier output, $P_{OUT}$, coupled to an output load, $Z_{LOAD}$. As an example, the output load, $Z_{LOAD}$, may be an antenna.

The multi-level charge pump buck converter 12 may include a supply input 24, which is configured to receive a direct current (DC) voltage, $V_{BAT}$, from a battery 20, and a switching voltage output 26, which is configured to provide a switching voltage, $V_{SW}$. The switching voltage output 26 may be coupled to the power amplifier supply output 28 by the power inductor 16, where the power inductor 16 couples to the bypass capacitor 19 to form an output filter 29 for the switching voltage output 26 of the multi-level charge pump buck converter 12. The power inductor 16 provides an inductor current, $I_{SW\_OUT}$, to the power amplifier supply output 28. The parallel amplifier circuit 14 may include a parallel amplifier supply input 30, which is configured to receive the DC voltage, $V_{BAT}$, from the battery 20, a parallel amplifier output 32A, a first control input 34, which is configured to receive a $V_{RAMP}$ signal, and a second control input configured to receive the power amplifier supply voltage, $V_{CC}$. The parallel amplifier output 32A of the parallel amplifier circuit 14 may be coupled to the power amplifier supply voltage $V_{CC}$ by the coupling circuit 18. A parallel amplifier output voltage, $V_{PARA\_AMP}$, is provided by the parallel amplifier circuit 14 via the parallel amplifier output 32A.

As an example, the parallel amplifier circuit 14 may generate the parallel amplifier output voltage, $V_{PARA\_AMP}$, based on the difference between the $V_{RAMP}$ signal and the power amplifier supply voltage, $V_{CC}$. Thus, the $V_{RAMP}$ signal may represent either an analog or digital signal that contains the required supply modulation information for a power amplifier collector of the linear RF power amplifier 22. Typically, the $V_{RAMP}$ signal is provided to the parallel amplifier circuit 14 as a differential analog signal to provide common mode rejection against any noise or spurs that could appear on this signal. The $V_{RAMP}$ signal may be a time domain signal, $V_{RAMP}(t)$, generated by a transceiver or modem and used to transmit radio frequency (RF) signals. For example, the $V_{RAMP}$ signal may be generated by a digital baseband processing portion of the transceiver or modem, where the digital $V_{RAMP}$ signal, $V_{RAMP\_DIGITAL}$, is digital-to-analog converted to form the $V_{RAMP}$ signal in the analog domain. In some embodiments, the "analog" $V_{RAMP}$ signal is a differential signal. The transceiver or a modem may generate the $V_{RAMP}$ signal based upon a known RF modulation Amp(t)*cos(2*pi*$f_{RF}$*t+Phase(t)). The $V_{RAMP}$ signal may represent the target voltage for the power amplifier supply voltage, $V_{CC}$, to be generated at the power amplifier supply output 28 of the pseudo-envelope follower power management system 10A, where the pseudo-envelope follower power management system 10A provides the power amplifier supply voltage, $V_{CC}$, to the linear RF power amplifier 22. Also the $V_{RAMP}$ signal may be generated from a detector coupled to the linear RF power amplifier 22.

For example, the parallel amplifier circuit 14 includes the parallel amplifier output 32A that provides the parallel amplifier output voltage, $V_{PARA\_AMP}$, to the coupling circuit 18. The parallel amplifier output 32A sources a parallel amplifier circuit output current, $I_{PAWA\_OUT}$, to the coupling circuit 18. The parallel amplifier circuit 14, depicted in FIG. 1A and FIG. 1B, may provide a parallel amplifier circuit output current estimate 40, $I_{PAWA\_OUT\_EST}$, to the multi-level charge pump buck converter 12 as an estimate of the parallel amplifier circuit output current $I_{PAWA\_OUT}$, of the parallel amplifier circuit 14. Thus, the parallel amplifier circuit output current estimate 40, $I_{PAWA\_OUT\_EST}$, represents an estimate of the parallel amplifier circuit output current $I_{PAWA\_OUT}$, provided by the parallel amplifier circuit 14 as a feedback signal to the multi-level charge pump buck converter 12. Based on the parallel amplifier circuit output current estimate 40, $I_{PAWA\_OUT\_EST}$, the multi-level charge pump buck converter 12 may be configured to control the switching voltage, $V_{SW}$, provided at the switching voltage output 26 of the multi-level charge pump buck converter 12.

Figure 1B:
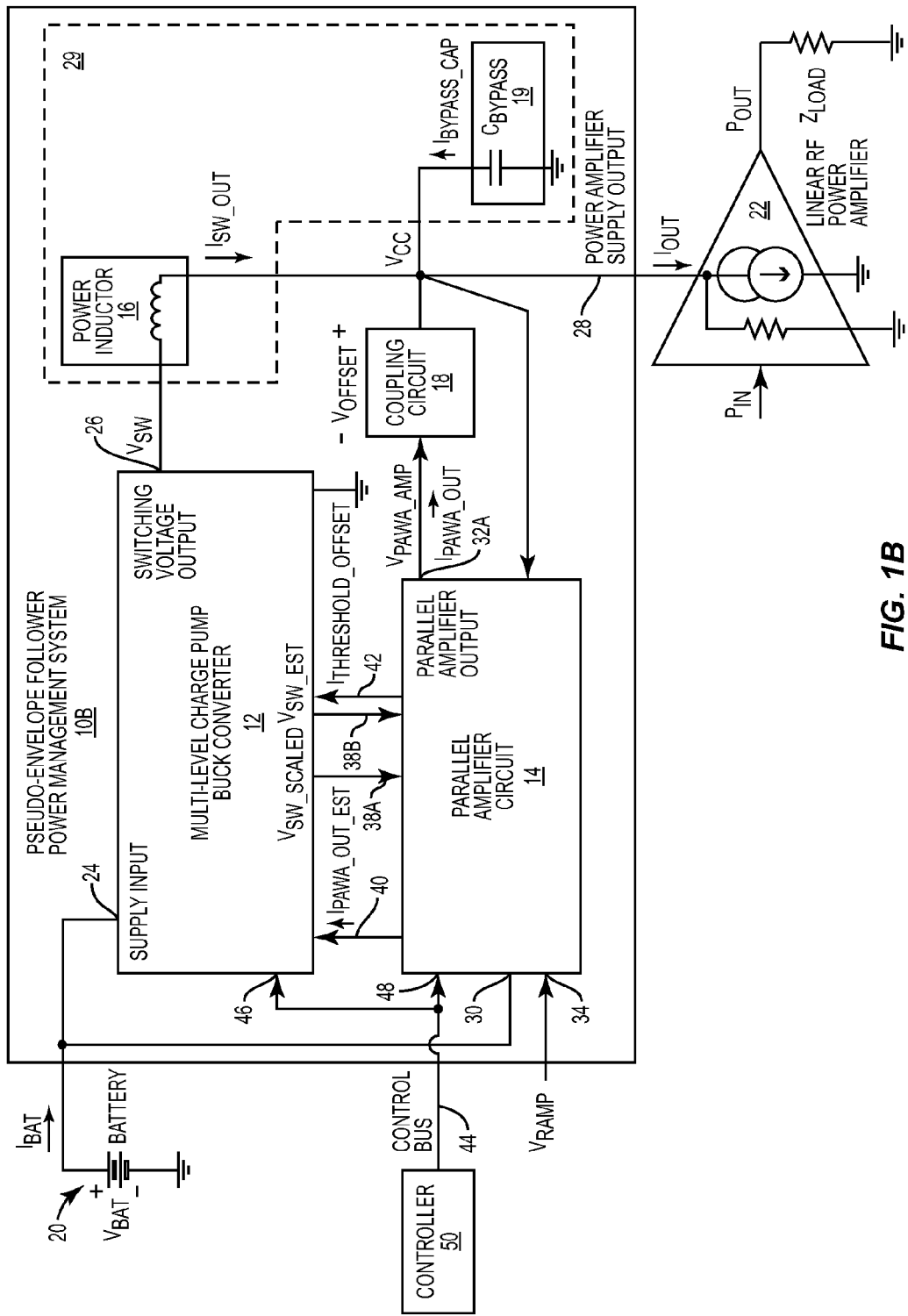
FIG. 1B depicts an embodiment of a pseudo-envelope follower power management system for managing power supplied to a linear RF power amplifier.

In some embodiments of the pseudo-envelope follower power management system 10A, depicted in FIG. 1A, and the pseudo-envelope follower power management system 10B, depicted in FIG. 1B, the coupling circuit 18 may be an offset capacitor, $C_{OFFSET}$. An offset voltage, $V_{OFFSET}$, may be developed across the coupling circuit 18. In other alternative embodiments, the coupling circuit 18 may be a wire trace such that the offset voltage, $V_{OFFSET}$, between the parallel amplifier output voltage, $V_{PARA\_AMP}$, and the power amplifier supply voltage, $V_{CC}$, is zero volts. In still other embodiments, the coupling circuit 18 may be a transformer.

A pseudo-envelope follower power management system 10A, depicted in FIG. 2A, is an example embodiment of the pseudo-envelope follower power management system 10 depicted in FIG. 1A. Unlike the pseudo-envelope follower power management system 10 depicted in FIG. 1A, the pseudo-envelope follower power management system 10A depicted in FIG. 2A includes an embodiment of the multi-level charge pump buck converter 12A and a parallel amplifier circuit 14A having parallel amplifier circuitry 32. The parallel amplifier circuitry 32 includes a parallel amplifier 35 and a parallel amplifier sense circuit 36. The parallel amplifier circuit 14A further includes a parallel amplifier output impedance compensation circuit 37 configured to receive the $V_{RAMP}$ signal and provide a compensated $V_{RAMP}$ signal, $V_{RAMP\_C}$, to an input to the parallel amplifier 35. The compensated $V_{RAMP}$ signal, $V_{RAMP\_C}$, is a function of the $V_{RAMP}$ signal. The parallel amplifier 35 generates a parallel amplifier output current, $I_{PARA\_AMP}$, to produce a parallel amplifier output voltage, $V_{PARA\_AMP}$, at the parallel amplifier output 32A based on the difference between the compensated $V_{RAMP}$ signal, $V_{RAMP\_C}$ and the power amplifier supply voltage, $V_{CC}$, generated at power amplifier supply output 28. The parallel amplifier sense circuit 36 generates a scaled parallel amplifier output current estimate, $I_{PARA\_AMP\_SENSE}$, which is a fractional representation of the parallel amplifier output current, $I_{PARA\_AMP}$, generated by the parallel amplifier 35. Alternatively, in those embodiments of the parallel amplifier circuit 14 that do not include the parallel amplifier output impedance compensation circuit 37, the parallel amplifier 35 generates the parallel amplifier output current, $I_{PARA\_AMP}$, to produce the parallel amplifier output voltage, $V_{PARA\_AMP}$, based on the difference between the $V_{RAMP}$ signal and the power amplifier supply voltage, $V_{CC}$.

The parallel amplifier circuit 14A may further include an open loop assist circuit 39 configured to receive a feed forward control signal 38, $V_{SWITCHER}$, the scaled parallel amplifier output current estimate, $I_{PARA\_AMP\_SENSE}$, and the $V_{RAMP}$ signal. In response to the feed forward control signal 38, $V_{SWITCHER}$, the scaled parallel amplifier output current estimate, $I_{PARA\_AMP\_SENSE}$, and the $V_{RAMP}$ signal; the open loop assist circuit 39 may be configured to generate an open loop assist current, $I_{ASSIST}$. The open loop assist current, $I_{ASSIST}$, may be provided to the parallel amplifier output 32A. The parallel amplifier output current, $I_{PARA\_AMP}$, generated by the parallel amplifier 35 and the open loop assist circuit current, $I_{ASSIST}$, generated by the open loop assist circuit 39, may be combined to form the parallel amplifier circuit output current, $I_{PAWA\_OUT}$, of the parallel amplifier circuit 14A. The parallel amplifier circuit 14A may further include a $V_{OFFSET}$ loop circuit 41 configured to generate a threshold offset current 42, $I_{THRESHOLD\_OFFSET}$. The threshold offset current 42, $I_{THRESHOLD\_OFFSET}$, may be provided from the parallel amplifier circuit 14A as a feedback signal to the multi-level charge pump buck converter 12A. The $V_{OFFSET}$ loop circuit 41 may be configured to provide a threshold offset current 42, $I_{THRESHOLD\_OFFSET}$, as an estimate of the magnitude of the offset voltage, $V_{OFFSET}$, appearing across the coupling circuit 18. In those cases where the coupling circuit is a wire trace such that the offset voltage, $V_{OFFSET}$, is always zero volts, the parallel amplifier circuit 14A may not provide the threshold offset current 42, $I_{THRESHOLD\_OFFSET}$, to the multi-level charge pump buck converter 12A.

Figure 2B:
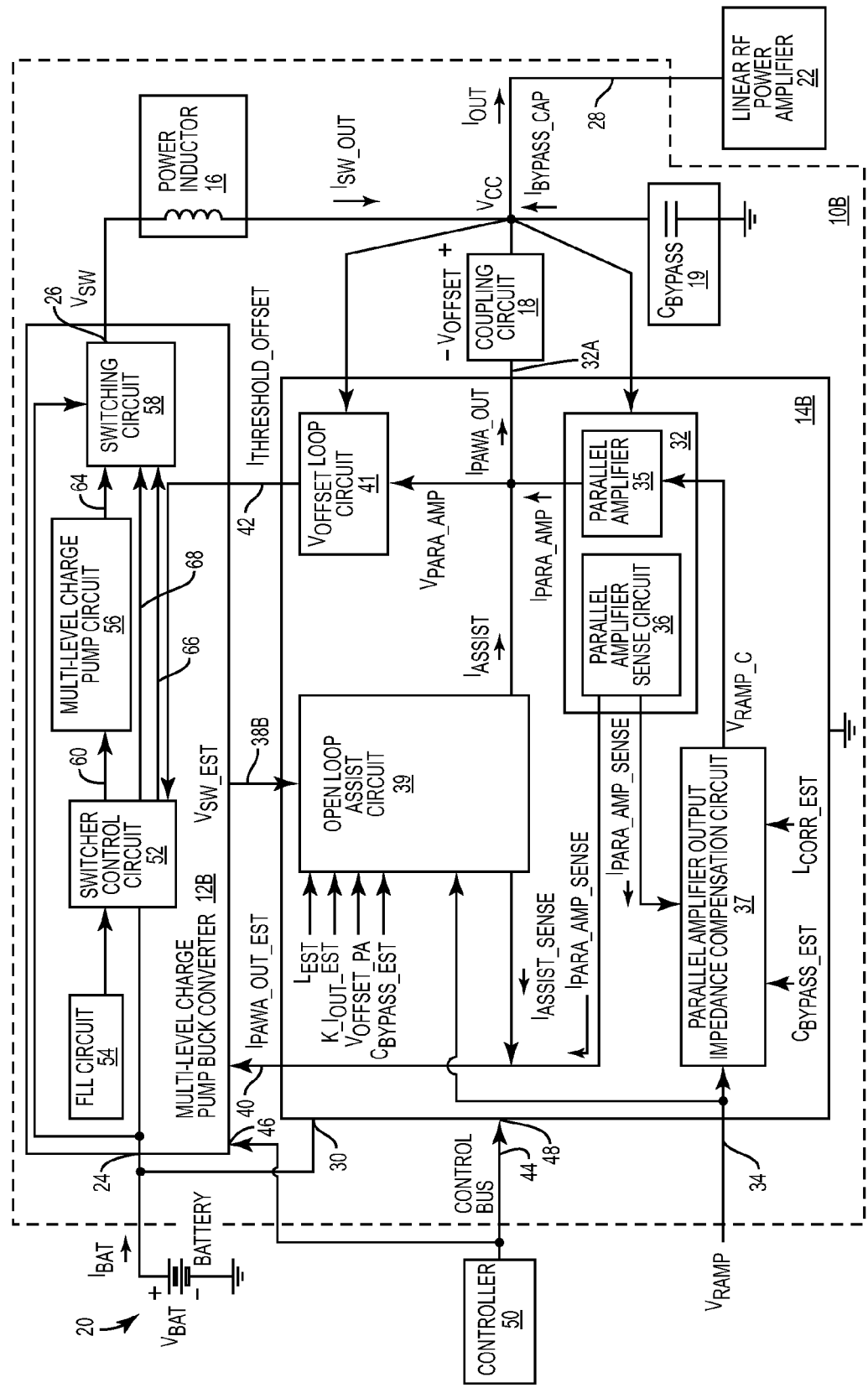
FIG. 2B depicts an embodiment of the pseudo-envelope follower power management system of FIG. 1B in further detail.

Another example is the pseudo-envelope follower power management system 10B depicted in FIG. 2B, which is similar to the embodiment of the pseudo-envelope follower power management system 10B depicted in FIG. 1B. The pseudo-envelope follower power management system 10B is operationally and functionally similar in form and function to the pseudo-envelope follower power management system 10A is depicted in FIG. 2A. However, unlike the pseudo-envelope follower power management system 10A depicted in FIG. 2A, the pseudo-envelope follower power management system 10B depicted in FIG. 2B includes a multi-level charge pump buck converter 12B configured to generate an estimated switching voltage output 38B, $V_{SW\_EST}$, and a parallel amplifier circuit 14B configured to receive the estimated switching voltage output 38B, $V_{SW\_EST}$, instead of the feed forward control signal 38, $V_{SWITCHER}$. Consequentially, as depicted in FIG. 2B, the open loop assist circuit 39 of the parallel amplifier circuit 14B is configured to use only the estimated switching voltage output 38B, $V_{SW\_EST}$, instead of the feed forward control signal 38, $V_{SWITCHER}$. The estimated switching voltage output 38B, $V_{SW\_EST}$, provides an indication of the switching voltage, $V_{SW}$.

The generation of the parallel amplifier circuit output current estimate 40, $I_{PAWA\_OUT\_EST}$, depicted in FIGS. 1A and 1B will now be described with continuing reference to the embodiment of the parallel amplifier circuit 14A, depicted in FIG. 2A, and the embodiment of the parallel amplifier circuit 14B depicted in FIG. 2B. Embodiments of the parallel amplifier circuit 14A and the parallel amplifier circuit 14B, depicted in FIGS. 2A and 2B, may provide the parallel amplifier circuit output current estimate 40, $I_{PAWA\_OUT\_EST}$, where the parallel amplifier circuit output current estimate 40, $I_{PAWA\_OUT\_EST}$, includes a scaled parallel amplifier output current estimate, $I_{PARA\_AMP\_SENSE}$, and a scaled open loop assist circuit output current estimate, $I_{ASSIST\_SENSE}$. The scaled parallel amplifier output current estimate, $I_{PARA\_AMP\_SENSE}$, is a scaled estimate of the parallel amplifier output current, $I_{PARA\_AMP}$, generated by the parallel amplifier sense circuit 36 of the parallel amplifier circuitry 32. In some alternative embodiments, the parallel amplifier 35 may generate the scaled estimate of the parallel amplifier output current, $I_{PARA\_AMP\_SENSE}$, directly. The scaled open loop assist circuit current estimate, $I_{ASSIST\_SENSE}$, is a scaled estimate of the open loop assist circuit current, $I_{ASSIST}$, generated by the open loop assist circuit 39. In other alternative embodiments of the parallel amplifier circuit 14 depicted in FIG. 1A and FIG. 1B, the parallel amplifier circuit 14 does not include the open loop assist circuit 39. In those embodiments of the parallel amplifier circuit 14 depicted in FIG. 1A and FIG. 1B that do not include the open loop assist circuit 39, the parallel amplifier circuit output current estimate 40, $I_{PAWA\_OUT\_EST}$, may only be based on the scaled parallel amplifier output current estimate, $I_{PARA\_AMP\_SENSE}$.

Returning to FIGS. 1A and 1B, the pseudo-envelope follower power management systems 10A and 10B may further include a control bus 44 coupled to a controller 50. The control bus 44 may be coupled to a control bus interface 46 of the multi-level charge pump buck converter 12 and a control bus interface 48 of the parallel amplifier circuit 14. The controller 50 may include various logical blocks, modules, and circuits. The controller 50 may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices. As an example, a combination of computing devices may include a combination of a DSP and a microprocessor, a plurality of microprocessors, one or more microprocessors in conjunction with a DSP core, or any other such configuration. The controller may further include or be embodied in hardware and in computer executable instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium may be coupled to the processor such that a processor can read information from, and write information to, the storage medium. In the alternative, the storage medium or a portion of the storage medium may be integral to the processor. The processor and the storage medium may reside in an ASIC.

FIGS. 2A and 2B depict a pseudo-envelope follower power management system 10A and a pseudo-envelope follower power management system 10B, respectively, that include embodiments of the multi-level charge pump buck converter 12A and the multi-level charge pump buck converter 12B. As depicted in FIGS. 2A and 2B, some embodiments of the multi-level charge pump buck converter 12 of FIGS. 1A and 1B may include an FLL circuit 54 configured to interoperate with a switcher control circuit 52. Alternatively, some embodiments of the multi-level charge pump buck converter 12A and the multi-level charge pump buck converter 12B may not include an FLL circuit 54 or be configured to operate with the FLL circuit 54 being disabled.

As further depicted in FIGS. 2A and 2B, some embodiments of the switcher control circuit 52 may be configured to control the operation of a multi-level charge pump circuit 56 and a switching circuit 58 to generate the switching voltage, $V_{SW}$, on the switching voltage output 26 of the multi-level charge pump buck converter 12A or the multi-level charge pump buck converter 12B, respectively. For example, the switcher control circuit 52 may use a charge pump mode control signal 60 to configure the operation of the multi-level charge pump circuit 56 to provide a charge pump output 64 to the switching circuit 58. Alternatively, the switcher control circuit 52 may generate a series switch control signal 66 to configure the switching circuit 58 to provide the switching voltage, $V_{SW}$, substantially equal to the DC voltage, $V_{BAT}$, from the battery 20 via a first switching element coupled between the supply input 24 and the switching voltage output 26. As another example, the switcher control circuit 52 may configure the switching circuit 58 to provide the switching voltage, $V_{SW}$, through a second switching element coupled to ground such that the switching voltage, $V_{SW}$, is substantially equal to ground.

In addition, the parallel amplifier circuit 14A, depicted in FIG. 2A, and the parallel amplifier circuit 14B, depicted in FIG. 2B, may be configured to provide the parallel amplifier circuit output current estimate 40, $I_{PAWA\_OUT\_EST}$, and the threshold offset current 42, $I_{THRESHOLD\_OFFSET}$, to the switcher control circuit 52 in order to control the operation of the switcher control circuit 52. As discussed in detail below, some embodiments of the switcher control circuit 52 may be configured to receive and use the parallel amplifier circuit output current estimate 40, $I_{PAWA\_OUT\_EST}$, the threshold offset current 42, $I_{THRESHOLD\_OFFSET}$, and/or a combination thereof to control the operation of the switcher control circuit 52.

For example, the switcher control circuit 52 may use the parallel amplifier circuit output current estimate 40, $I_{PAWA\_OUT\_EST}$, the threshold offset current 42, $I_{THRESHOLD\_OFFSET}$, and/or a combination thereof to determine the magnitude of the voltage provided by the switching voltage, $V_{SW}$, from the multi-level charge pump circuit 56.

Figure 3A:
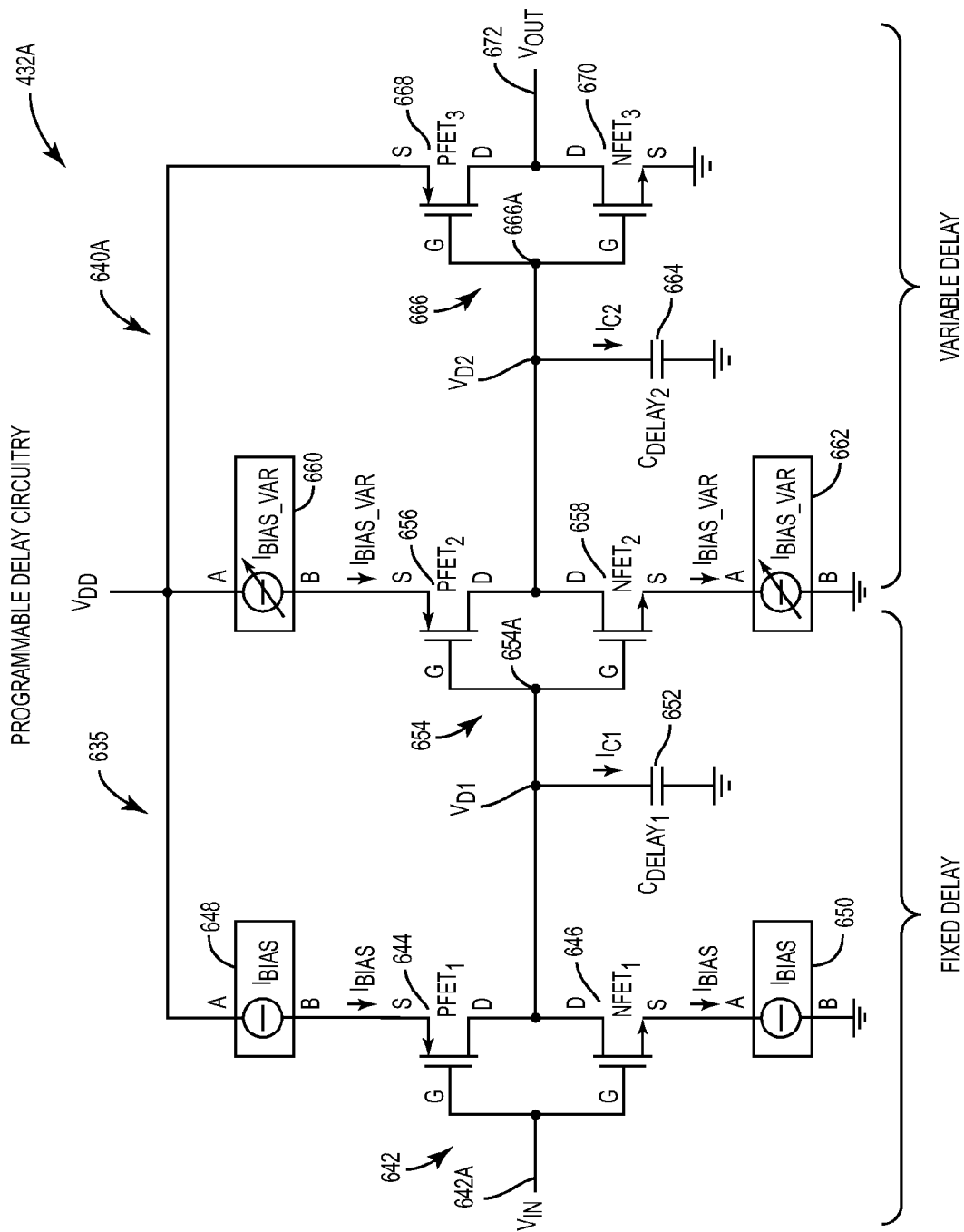
FIG. 3A depicts an embodiment of programmable delay circuitry.

FIG. 3A depicts an embodiment of programmable delay circuitry 432A, where the embodiment of the programmable delay circuitry 432A includes both fixed delay circuitry 635 and variable delay circuitry 640A. The fixed delay circuitry 635 includes an input stage 642 including an input node 642A, a first PFET 644, $PFET_1$, a first NFET 646, $NFET_1$, a first fixed current source 648, a second fixed current source 650, and a first fixed delay capacitor 652. The first fixed delay capacitor 652 has a first delay capacitance, $C_{DELAY1}$. The input node 642A of the input stage 642 is configured to receive an input voltage, $V_{IN}$, having a digital logic level signal, where the digital logic level signal is to be delayed by the programmable delay circuitry 432A. The input stage 642 is formed by coupling the gate of the first PFET 644, $PFET_1$, and the gate of the first NFET 646, $NFET_1$, to the input node 642A. The first fixed current source 648 is coupled between a circuit supply voltage, $V_{DD}$, and the source of the first PFET 644, $PFET_1$. The second fixed current source 650 is coupled between the source of the first NFET 646, $NFET_1$, and ground. The first fixed delay capacitor 652 is coupled between ground and the drain of the first PFET 644, $PFET_1$, and the drain of the first NFET 646, $NFET_1$. During normal operation, when the input voltage, $V_{IN}$, at the input node 642A is sufficiently low such that the input voltage, $V_{IN}$ is substantially equal to a logic low threshold voltage, the first PFET 644, $PFET_1$, is configured to be in a conducting state and the first NFET 646, $NFET_1$, is configured to be in a non-conducting state. When the first PFET 644, $PFET_1$, is turned on, the first fixed current source 648 sources a fixed bias current, $I_{BIAS}$, to the first fixed delay capacitor 652 with a first fixed capacitor current, $I_{C1}$. Assuming that most of the first fixed bias current, $I_{BIAS}$, from the first fixed current source 648 is used to charge the first fixed delay capacitor 652, the first fixed capacitor current, $I_{C1}$, is substantially equal to the fixed bias current, $I_{BIAS}$, provided from the first fixed current source 648 through first PFET 644, $PFET_1$. As the first fixed delay capacitor 652 is charged, a first delay voltage, $V_{D1}$, continues to increase and eventually rises above a voltage level that is greater than a logic high threshold voltage that may trigger an action by the variable delay circuitry 640A.

Otherwise, when the input voltage, $V_{IN}$, at the input node 642A is sufficiently high such that the input voltage, $V_{IN}$ is substantially equal to a logic high threshold voltage, the first PFET 644, $PFET_1$, is configured to be in a non-conducting state and the first NFET 646, NFET$_1$, is configured to be in a conducting state. When the first NFET 646, NFET$_1$, is turned on, the second fixed current source 650 sinks a fixed bias current, I$_{BIAS}$, from the first fixed delay capacitor 652 to generate the first fixed capacitor current, I$_{C1}$, of opposite magnitude than when the first fixed delay capacitor 652 is being charged by the first fixed current source 648. Assuming that most of the fixed bias current, I$_{BIAS}$, sunk through the first NFET 646, NFET$_1$ by the second fixed current source 650 is used to discharge the first fixed delay capacitor 652, the magnitude of the first fixed capacitor current, I$_{C1}$, is substantially equal to the magnitude of the fixed bias current, I$_{BIAS}$, sunk by the second fixed current source 650 through the first NFET 646, NFET$_1$. As the first fixed delay capacitor 652 is discharged, the first delay voltage, V$_{D1}$, continues to decrease and eventually falls below a voltage level that is less than a logic low threshold voltage that may trigger an action by the variable delay circuitry 640A.

Because the first fixed current source 648 and the second fixed current source 650 each source and sink, respectively, a current equal to the fixed bias current, I$_{BIAS}$, the first fixed delay capacitor 652 is charged and discharged at the same rate. The first fixed delay time associated with the fixed delay circuitry 635 is due to the generation of the first delay voltage, V$_{D1}$. Because the current sourced by the first fixed current source 648 and sunk by the second fixed current source 650 are substantially equal, the rise time and fall time of the first delay voltage, V$_{D1}$, are substantially equal. Effectively, the first fixed delay time is due to the time required to propagate the digital logic state represented by the input voltage, V$_{IN}$, through the fixed delay circuitry 635 and provide the first delay voltage, V$_{D1}$, that represents a digital logic state to an input stage 654 of the variable delay circuitry 640A.

The variable delay circuitry 640A includes the input stage 654 having an input node 654A coupled to the drain of the first PFET 644, PFET$_1$, the drain of the first NFET 646, NFET$_1$, and the first fixed delay capacitor 652. The variable delay circuitry 640A further includes a second PFET 656, PFET$_2$, a second NFET 658, NFET$_2$, a first variable current source 660, a second variable current source 662, and a second fixed delay capacitor 664. The second fixed delay capacitor 664 has a second delay capacitance, C$_{DELAY2}$.

The input stage 654 of the variable delay circuitry 640A is formed by coupling the gate of the second PFET 656, PFET$_2$, and the gate of the second NFET 658, NFET$_2$, to the input node 654A. The variable delay circuitry 640A is further formed by coupling the first variable current source 660 between the circuit supply voltage, V$_{DD}$, and the source of the second PFET 656, PFET$_2$, such that the first variable current source 660 may provide a variable bias current, I$_{BIAS\_VAR}$, to the source of the second PFET 656, PFET$_2$ when the second PFET 656, PFET$_2$, is in a conducting state. In addition, the second variable current source 662 is coupled between the source of the second NFET 658, NFET$_2$, and ground such that the second variable current source 662 may sink a variable bias current, I$_{BIAS\_VAR}$, from the source of the second NFET 658, NFET$_2$, when the second NFET 658, NFET$_2$, is in a conducting state. The second fixed delay capacitor 664 is coupled between ground and the drain of the second PFET 656, PFET$_2$, and the drain of the second NFET 658, NFET$_2$.

In addition, the variable delay circuitry 640A further includes an output buffer stage 666 that includes a third PFET 668, PFET$_3$ operably coupled to a third NFET 670, NFET$_3$ to form an input node 666A. The output buffer stage 666 includes an input node 666A formed by coupling the gate of the third PFET 668, PFET$_3$, to the gate of the third NFET 670, NFET$_3$. The source of the third PFET 668, PFET$_3$, is coupled to the circuit supply voltage, V$_{DD}$. The source of the third NFET 670, NFET$_3$, is coupled to ground. The output buffer stage 666 further includes an output buffer stage output 672 that corresponds to the output of the programmable delay circuitry 432A. The output buffer stage output 672 may be formed by coupling the drain of the third PFET 668, PFET$_3$, to the drain of the third NFET 670, NFET$_3$. The output buffer stage 666 is configured to generate an output voltage, V$_{OUT}$, at the output buffer stage output 672. Generally, the output voltage, V$_{OUT}$, generated by the output buffer stage 666 at the output buffer stage output 672 will represent either a digital logic high state or a digital logic low state. For example, when the output voltage, V$_{OUT}$, is substantially equal to the circuit supply voltage, V$_{DD}$, the output voltage, V$_{OUT}$, represents a digital logic high state. When the output voltage, V$_{OUT}$, is substantially equal to the ground voltage, the output voltage, V$_{OUT}$, represents a digital logic low state.

During operation of the variable delay circuitry 640A, a second delay voltage, V$_{D2}$, increases as the second fixed delay capacitor 664 is charged and decreases as the second fixed delay capacitor 664 is discharged. When the second delay voltage, V$_{D2}$, is sufficiently low such that the second delay voltage, V$_{D2}$, is substantially equal to or below a logic low threshold voltage, the third PFET 668, PFET$_3$, is configured to be in a conducting state and the third NFET 670, NFET$_3$ is configured to be in a non-conducting state. In this case, when the third PFET 668, PFET$_3$, is turned on, the output buffer stage output 672 is coupled to the circuit supply voltage, V$_{DD}$, via the third PFET 668, PFET$_3$. As a result, the output voltage, V$_{OUT}$, at the output buffer stage output 672 is substantially equal to the circuit supply voltage, V$_{DD}$, and the output voltage, V$_{OUT}$, represents a digital logic high state.

However, when the second delay voltage, V$_{D2}$, is sufficiently high such that the second delay voltage, V$_{D2}$, is substantially equal to or above a logic high threshold voltage, the third PFET 668, PFET$_3$, is configured to be in a non-conducting state and the third NFET 670, NFET$_3$ is configured to be in a conducting state. In this case, the third NFET 670, NFET$_3$, is turned on and the output buffer stage output 672 is coupled to ground via the third NFET 670, NFET$_3$. As a result, the output voltage, V$_{OUT}$, at the output buffer stage output 672 is substantially equal to the ground voltage, and the output voltage, V$_{OUT}$, represents a digital logic low state.

During normal operation, when the first delay voltage, V$_{D1}$, at the input node 654A is sufficiently low to be equal to or lower than a logic low threshold voltage, the second PFET 656, PFET$_2$, is configured to be in a conducting state and the second NFET 658, NFET$_2$, is configured to be in a non-conducting state. Accordingly, when the second PFET 656, PFET$_2$, is turned on, the first variable current source 660 sources the variable bias current, I$_{BIAS\_VAR}$, through the second PFET 656, PFET$_2$, to charge the second fixed delay capacitor 664 with a second fixed capacitor current, I$_{C2}$. Assuming that most of the variable bias current, I$_{BIAS\_VAR}$, from the first variable current source 660 is used to charge the second fixed delay capacitor 664, the second fixed capacitor current, I$_{C2}$ is substantially equal to the variable bias current, I$_{BIAS\_VAR}$, provided by the first variable current source 660. As the second fixed delay capacitor 664 is charged by the variable bias current, I$_{BIAS\_VAR}$, the magnitude of the second delay voltage, V$_{D2}$, continues to increase and eventually rises above a voltage level that is greater than the logic high threshold voltage that may trigger an action by the output buffer stage 666. For example, once the second delay voltage, V$_{D2}$, reaches or exceeds the logic high threshold voltage, the output buffer stage 666 will trigger so as to generate an output voltage, V$_{OUT}$ that represents a digital logic low state.

Otherwise, during normal operation, when the first delay voltage, $V_{D1}$, at the input node 654A is sufficiently high to be equal to exceed a logic high threshold voltage, the second PFET 656, PFET$_2$, is configured to be in a non-conducting state and the second NFET 658, NFET$_2$, is configured to be in a conducting state. Accordingly, when the second NFET 658, NFET$_2$, is turned on, the second variable current source 662 sinks the variable bias current, $I_{BIAS\_VAR}$, through the second NFET 658, NFET$_2$, to discharge the second fixed delay capacitor 664 with the second fixed capacitor current, $I_{C2}$, by removing charge from the second fixed delay capacitor 664. Assuming that most of the variable bias current, $I_{BIAS\_VAR}$, sunk by the second variable current source 662 is used to discharge the second fixed delay capacitor 664, the magnitude of the second fixed capacitor current, $I_{C2}$, that removes charge from the second fixed delay capacitor 664 is substantially equal to the variable bias current, $I_{BIAS\_VAR}$, sunk by second variable current source 662. As the second fixed delay capacitor 664 is discharged by the variable bias current, $I_{BIAS\_VAR}$, the magnitude of the second delay voltage, $V_{D2}$, continues to decrease or eventually fall below a voltage level that is less than the logic low threshold voltage that may trigger an action by the output buffer stage 666. For example, once the second delay voltage, $V_{D2}$, reaches or falls below the logic low threshold voltage, the output buffer stage 666 will trigger, and the output buffer stage 666 will generate an output voltage, $V_{OUT}$, that represents a digital logic high state.

The variable delay time provided by the variable delay circuitry 640A is created by the time period required to charge and discharge the second fixed delay capacitor 664 with the variable bias current, $I_{BIAS\_VAR}$, where the variable bias current, $I_{BIAS\_VAR}$, varies in magnitude. As depicted in FIG. 3A, the first variable current source 660 and the second variable current source 662 are each configured to respectively source and sink currents that are both equal to the variable bias current, $I_{BIAS\_VAR}$. As a result, the variable delay time of the variable delay circuitry 640A is symmetrically divided into equal parts. However, in some embodiments, the first variable current source 660 and the second variable current source 662 may source and sink different magnitudes of current. Depending upon the magnitude of the variable bias current, $I_{BIAS\_VAR}$, the time to charge and discharge the second fixed delay capacitor 664 such that the magnitude of the second delay voltage, $V_{D2}$, changes logic state represented by the output voltage, $V_{OUT}$, at the output buffer stage output 672 may change.

The controller 50 (FIG. 1A) may be configured to control the programmable delay circuitry 432A. Accordingly, although not depicted in FIG. 3A, in some embodiments of the programmable delay circuitry 432A, the controller 50 may be further configured to control the first variable current source 660 and the second variable current source 662 to set the magnitude of the variable bias current, $I_{BIAS\_VAR}$, and thereby the variable delay time provided by the variable delay circuitry 640A.

Figure 3B:
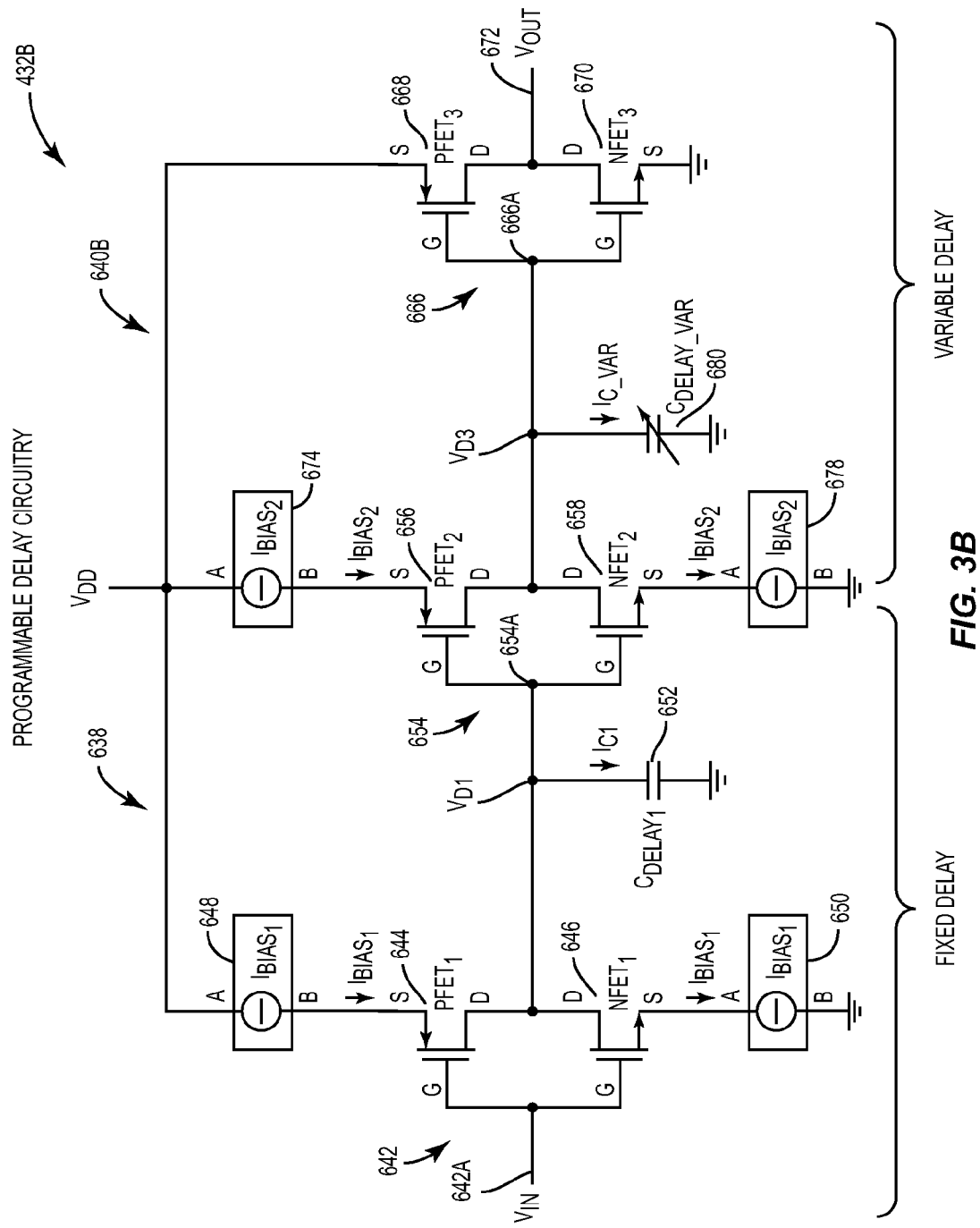
FIG. 3B depicts another embodiment of the programmable delay circuitry.

FIG. 3B depicts the programmable delay circuitry 432B, which is another embodiment of the programmable delay circuitry. The embodiment of the programmable delay circuitry 432B, depicted in FIG. 3B, is similar to the programmable delay circuitry 432A, depicted in FIG. 3A, except the embodiment of the variable delay circuitry 640A, depicted in FIG. 3A, is replaced by the variable delay circuitry 640B, depicted in FIG. 3B.

As depicted in FIG. 3B, the programmable delay circuitry 432B is similar to the programmable delay circuitry 432A, depicted in FIG. 3A, except the first variable current source 660, the second variable current source 662, and the second fixed delay capacitor 664 are replaced, respectively, with a third fixed current source 674, a fourth fixed current source 678, and a variable delay capacitor 680. In addition, for the sake of clarity, and not by way of limitation, the voltage across the variable delay capacitor 680 is the third voltage, $V_{D3}$. The variable delay capacitor 680 having a variable delay capacitance $C_{DELAY\_VAR}$, where the capacitance value of the variable delay capacitance $C_{DELAY\_VAR}$, may be programmatically configured.

As discussed relative to the programmable delay circuitry 432A, the operational parameters of the programmable delay circuitry 432B may be configured by the controller 50 (FIG. 1A). For example, the variable delay capacitor 680 may be a capacitor array or a varactor under the control of the controller 50. Accordingly, as will be described, the controller 50 may be configured to increase the variable delay capacitance, $C_{DELAY\_VAR}$, of the variable delay capacitor 680 in order to increase the delay time provided by the programmable delay circuitry 432B. Likewise, the controller 50 may be configured to decrease the variable delay capacitance, $C_{DELAY\_VAR}$, of the variable delay capacitor 680 to decrease the delay time provided by the programmable delay circuitry 432B.

Continuing with the description of the programmable delay circuitry 432B, depicted in FIG. 3B, the function and operation of the fixed delay circuitry 638 of the programmable delay circuitry 432B, and thereby the fixed delay time provided by the fixed delay circuitry 638, are substantially the same in the programmable delay circuitry 432B, depicted in FIG. 3B. Accordingly, description of the fixed delay circuitry 638 is omitted.

As discussed above, the variable delay circuitry 640B is similar to the variable delay circuitry 640A except that the variable delay circuitry 640B replaces the first variable current source 660, the second variable current source 662, and the second fixed delay capacitor 664 of the variable delay circuitry 640A, with the third fixed current source 674, the fourth fixed current source 678, and the variable delay capacitor 680, respectively. Thus, the variable delay circuitry 640B includes the input stage 654 having the input node 654A, the second PFET 656, PFET$_2$, the second NFET 658, NFET$_2$, the third fixed current source 674, the fourth fixed current source 678, and the variable delay capacitor 680 having a variable delay capacitance, $C_{DELAY\_VAR}$, where the controller 50 (not shown) may be configured to change the capacitance value of the variable delay capacitance, $C_{DELAY\_VAR}$.

Similar to the variable delay circuitry 640A, the variable delay circuitry 640B also includes the output buffer stage 666 that includes the third PFET 668, PFET$_3$, and the third NFET 670, NFET$_3$. The output buffer stage 666 includes the input node 666A formed by coupling the gate of the third PFET 668, PFET$_3$, to the gate of the third NFET 670, NFET$_3$. The source of the third PFET 668, PFET$_3$, is coupled to the circuit supply voltage, $V_{DD}$. The source of the third NFET 670, NFET$_3$, is coupled to ground. The output buffer stage output 672 of the output buffer stage 666, which is also the output of the programmable delay circuitry 432B, is formed by coupling the drain of the third PFET 668, PFET$_3$, to the drain of the third NFET 670, NFET$_3$. The output buffer stage 666 is configured to generate an output voltage, $V_{OUT}$, at the output buffer stage output 672. For example, as will be discussed, a third delay voltage, $V_{D3}$, across the variable delay capacitor 680 increases and decreases at a rate that depends on the capacitance value of the variable delay capacitance, $C_{DELAY\_VAR}$, of the variable delay capacitor 680 and the magnitude of a variable delay capacitor current, $I_{C\_VAR}$, that charges and discharges the variable delay capacitor 680. When the third delay voltage, $V_{D3}$, across the variable delay capacitor 680 is sufficiently low such that the third delay voltage, $V_{D3}$ is substantially equal to a logic low threshold voltage, the third PFET 668, PFET$_3$, is configured to be in a conducting state and the third NFET 670, NFET$_3$, is configured to be in a non-conducting state. In this case, when the third PFET 668, PFET$_3$, is turned on, the output buffer stage output 672 is coupled to the circuit supply voltage, $V_{DD}$. As a result, the output voltage, $V_{OUT}$, at the output buffer stage output 672 is substantially equal to the circuit supply voltage, $V_{DD}$, when the third PFET 668, PFET$_3$, is in the conducting state. However, when the third delay voltage, $V_{D3}$, across the variable delay capacitor 680 is sufficiently high such that the third delay voltage, $V_{D3}$ is substantially equal to a logic high threshold voltage, the third NFET 670, NFET$_3$, is configured to be in a conducting state and the third PFET 668, PFET$_3$, is configured to be in a non-conducting state. In this case, when the third NFET 670, NFET$_3$, is turned on, the output buffer stage output 672 is coupled to ground. As a result, the output voltage, $V_{OUT}$, at the output buffer stage output 672 is substantially equal to the ground voltage when the third NFET 670, NFET$_3$, is turned on. In this way, the output voltage, $V_{OUT}$, at the output buffer stage output 672 toggles between a digital logic high state and a logic log state.

Continuing with the description of the variable delay circuitry 640B, depicted in FIG. 3B, the variable delay circuitry 640B includes an input stage 654 having an input node 654A configured to receive the signal generated by the charging and discharging of the first fixed delay capacitor 652, where the first fixed delay capacitor 652 has a capacitance value substantially equal to the first fixed delay capacitance, $C_{DELAY1}$. The voltage generated across the first fixed delay capacitor 652 is substantially equal to the first delay voltage, $V_{D1}$. The input stage 654 is formed by coupling the gate of the second PFET 656, PFET$_2$, and the gate of the second NFET 658, NFET$_2$, to the input node 654A. The third fixed current source 674 is coupled between the circuit supply voltage, $V_{DD}$, and the source of the second PFET 656, PFET$_2$. The fourth fixed current source 678 is coupled between the source of the second NFET 658, NFET$_2$, and ground. The variable delay capacitor 680 is coupled between ground and the drain of the second PFET 656, PFET$_2$, and the drain of the second NFET 658.

During normal operation, when the first delay voltage, $V_{D1}$, at the input node 654A is sufficiently low, the second PFET 656, PFET$_2$, is configured to be in a conducting state. At the same time, when the first delay voltage, $V_{D1}$, at the input node 654A is sufficiently low to turn on the second PFET 656, PFET$_2$, the second NFET 658, NFET$_2$, is configured to be in a non-conducting state. When the second PFET 656, PFET$_2$, is turned on, the third fixed current source 674 sources a second fixed bias current, $I_{BIAS2}$, to charge the variable delay capacitor 680. The second fixed bias current, $I_{BIAS2}$, charges the variable delay capacitor 680 with a variable delay capacitor current, $I_{C\_VAR}$. The rate of change in the third delay voltage, $V_{D3}$, across the variable delay capacitor 680 depends upon the capacitance value of the variable delay capacitance, $C_{DELAY\_VAR}$, of the variable delay capacitor 680 and the magnitude of the variable delay capacitor current, $I\text{-}_{C\_VAR}$. Assuming that most of the second fixed bias current, $I_{BIAS2}$, from the third fixed current source 674 is used to charge the variable delay capacitor 680, the variable delay capacitor current, $I_{C\_VAR}$, is substantially equal to the second fixed bias current, $I_{BIAS2}$. As the variable delay capacitor 680 is charged by the second fixed bias current, $I_{BIAS2}$, the magnitude of the third delay voltage, $V_{D3}$, increases. As described above, after the third delay voltage, $V_{D3}$, increases to a logic high threshold voltage, the third PFET 668, PFET$_3$, is turned off and the third NFET 670, NFET$_3$, is turned on, which changes the output voltage, $V_{OUT}$, at the output buffer stage output 672 to be substantially equal to ground.

Otherwise, when the first delay voltage, $V_{D1}$, at the input node 654A is sufficiently high, the second NFET 658, NFET$_2$, is configured to be in a conducting state and the fourth fixed current source 678 is permitted to sink a second fixed bias current, $I_{BIAS2}$, in order to discharges the variable delay capacitor 680. At the same time, when the first delay voltage, $V_{D1}$, at the input node 654A is sufficiently low to turn on the second NFET 658, NFET$_2$, the second PFET 656, PFET$_2$, is configured to be in a non-conducting state. When the second NFET 658, NFET$_2$, is turned on, the fourth fixed current source 678 sinks the second fixed bias current, $I_{BIAS2}$, to discharge the variable delay capacitor 680 with a current substantially equal to $I_{C\_VAR}$. The rate of change in the third delay voltage, $V_{D3}$, across the variable delay capacitor 680 depends upon the capacitance value of the variable delay capacitance, $C_{DELAY\_VAR}$, of the variable delay capacitor 680 and the magnitude of the variable delay capacitor current, $I_{C\_VAR}$. Assuming that most of the second fixed bias current, $I_{BIAS2}$, from the fourth fixed current source 678 is used to discharge the variable delay capacitor 680, the variable delay capacitor current, $I_{C\_VAR}$, is substantially equal to the second fixed bias current, $I_{BIAS2}$. As the variable delay capacitor 680 is discharged by the second fixed bias current, $I_{BIAS2}$, the magnitude of the third delay voltage, $V_{D3}$, decreases. As described above, after the third delay voltage, $V_{D3}$, decreases to a logic low threshold voltage, the third NFET 670, NFET$_3$, is turned off and the third PFET 668, PFET$_3$, is turned on, which changes the output voltage, $V_{OUT}$, at the output buffer stage output 672 to be substantially equal to the circuit supply voltage, $V_{DD}$.

The variable delay time provided by the variable delay circuitry 640B is created by the time period required to charge and discharge the variable delay capacitor 680, which depends upon the capacitance value of the variable capacitance, $C_{DELAY\_VAR}$, and the magnitude of the second fixed bias current, $I_{BIAS2}$. Because the variable delay capacitor 680 is either charged or discharged using a current substantially equal to the second fixed bias current, $I_{BiAS2}$, either sourced by the third fixed current source 674 or sunk by the fourth fixed current source 678, the variable time period required for the third delay voltage, $V_{D3}$, to increase to the logic high threshold voltage or decrease to the logic high threshold voltage used to trigger the operation of the operation of the output buffer stage 666 is dependent upon the variable capacitance, $C_{DELAY\_VAR}$ of the variable delay capacitor 680.

As previously discussed, the controller 50 (FIG. 1A) may be configured to control the programmable delay circuitry 432B. Accordingly, although not depicted in FIG. 3B, in some embodiments of the programmable delay circuitry 432B, the controller 50 may be further configured to control the variable capacitance, $C_{DELAY\_VAR}$ of the variable delay capacitor 680 in order to change the delay time provided by the programmable delay circuitry 432B. Assuming that the third fixed current source 674 and the fourth fixed current source 678 respectively source and sink the second fixed bias current, $I_{BIAS2}$, where the second fixed bias current, $I_{BIAS2}$, is constant, the variable delay capacitor current, $I_{C\_VAR}$, will likewise be constant. Consequently, the variable delay time provided by the variable delay circuitry 640B when charging the variable delay capacitor 680 is substantially equal to the variable delay time provided by the variable delay circuitry 640B when discharging the variable delay capacitor 680. In alternative embodiments of the variable delay circuitry 640B, the third fixed current source 674 and the fourth fixed current source 678 could be configured to source and sink different magnitudes of current. In this case, the variable delay time of the variable delay circuitry 640B would have a charging period and a discharging period, where the charging period would not equal the discharging period.

Programmable Delay Circuitry

Programmable delay circuitry, which includes an input buffer circuit and variable delay circuitry, is disclosed. The variable delay circuitry includes an input stage, a correction start voltage circuit, and a variable delay capacitor. The input buffer circuit is coupled to the input stage, the correction start voltage circuit is coupled to the input stage, and the variable delay capacitor is coupled to the input stage. The programmable delay circuitry is configured to provide a fixed time delay and a variable time delay.

In one embodiment of the programmable delay circuitry, the correction start voltage circuit helps stabilize the variable time delay by reducing disturbances in a voltage across the variable delay capacitor when certain transistor elements in the programmable delay circuitry transition to be in a conducting state. Further, the correction start voltage circuit may improve accuracy of the variable time delay by reducing transition times of certain transistor elements in the programmable delay circuitry.

In one embodiment of the programmable delay circuitry, the programmable delay circuitry further includes a voltage divider circuit and a bias current and mirror circuit. The voltage divider circuit is coupled to the bias current and mirror circuit. The bias current and mirror circuit is coupled to the variable delay circuitry. The voltage divider circuit and the bias current and mirror circuit are configured to reduce changes in the variable time delay due to changes in a voltage level of a circuit supply voltage, which is provided to the programmable delay circuitry.

Figure 4:
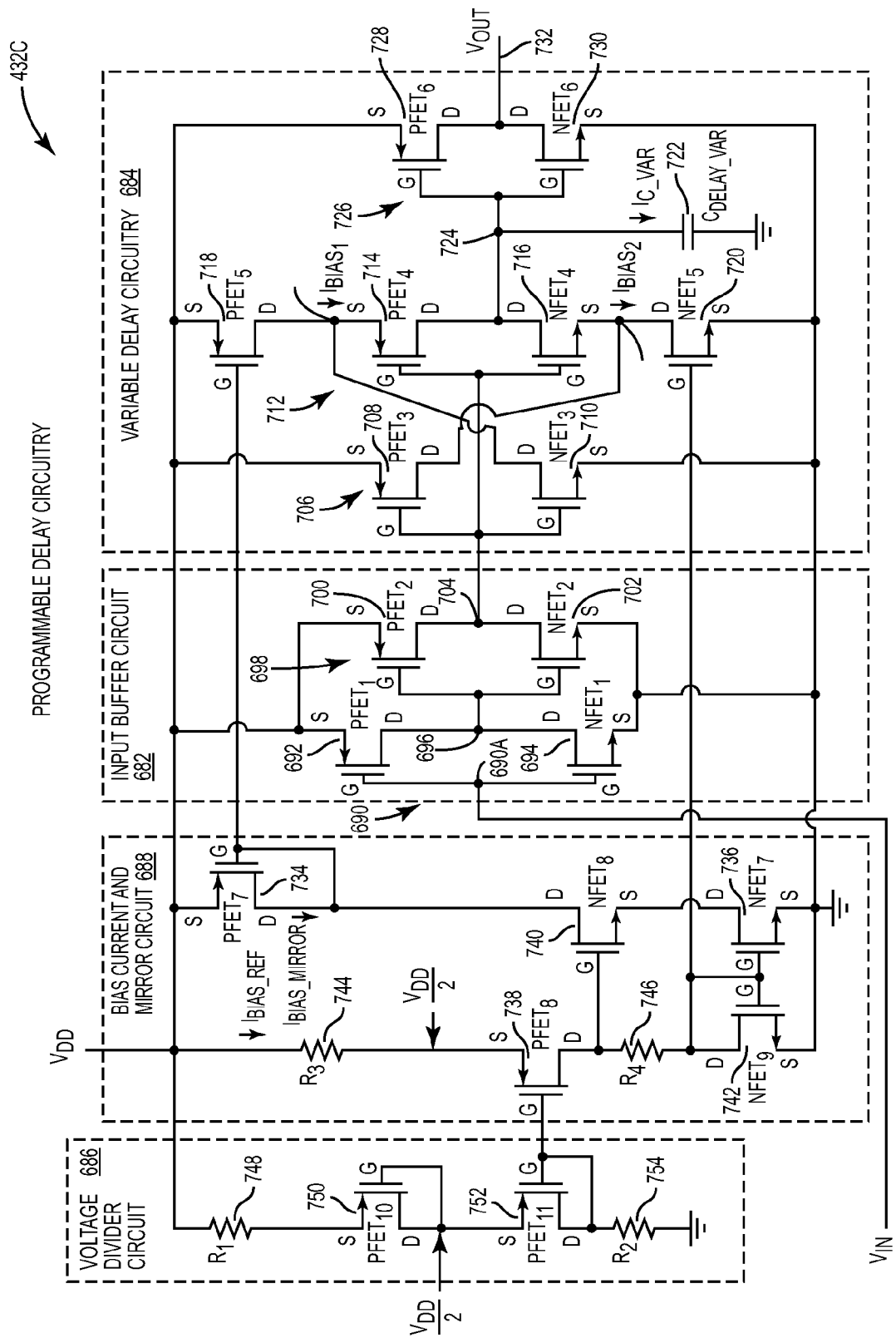
FIG. 4 depicts a further embodiment of the programmable delay circuitry.

FIG. 4 depicts programmable delay circuitry 432C, which is another embodiment of the programmable delay circuitry. Although the controller 50 (FIG. 1A) is not depicted in FIG. 4, it will be understood that the controller 50 (FIG. 1A), may be configured to control, configure, align, or change the parameter values and functions of the various circuits and elements to be described as being part of or related to the embodiment of the programmable delay circuitry 432C, depicted in FIG. 4.

The programmable delay circuitry 432C depicted in FIG. 4 is configured to delay a single digital logic level signal. It will be understood that alternate embodiments may include multiple embodiments of the programmable delay circuitry 432C arranged in parallel to provide a delay signal path for each of the multiple digital logic level signals to be delayed.

In addition, total delay time provided by the programmable delay circuitry 432C may include a fixed delay time and a variable delay time, where the variable delay time may be configured based on the programmable delay parameter(s), as discussed above. In addition, the fixed delay time may be sub-divided and distributed between an input buffer circuit 682 and variable delay circuitry 684.

As depicted in FIG. 4, the programmable delay circuitry 432C includes an input buffer circuit 682, a variable delay circuitry 684, a voltage divider circuit 686, and a bias current and mirror circuit 688. The input buffer circuit 682 may include a first input buffer circuit 690 having a first input buffer input 690A configured to receive an input voltage, $V_{IN}$, where the input voltage, $V_{IN}$, is a digital logic level signal. The digital logic signal may have either a digital logic high state or a digital logic low state. The digital logic signal may have either a digital logic high state or a digital logic low state. The first input buffer circuit 690 may include a first PFET 692, $PFET_1$, and a first NFET 694, $NFET_1$. The gate of the first PFET 692, $PFET_1$, and the gate of the first NFET 694, $NFET_1$, may be coupled to form the first input buffer input 690A of the first input buffer circuit 690. The source of the first PFET 692, $PFET_1$, may be coupled to the circuit supply voltage, $V_{DD}$. The source of the first NFET 694, $NFET_1$, may be coupled to ground. The drain of the first PFET 692, $PFET_1$, and the drain of the first NFET 694, $NFET_1$, may be coupled to form a first input buffer output at a first voltage node 696.

The input buffer circuit 682 may further include a second input buffer circuit 698 operably coupled to the first input buffer output at the first voltage node 696. The second input buffer circuit 698 may include a second PFET 700, $PFET_2$, and a second NFET 702, $NFET_2$. The gate of the second PFET 700, $PFET_2$, and the gate of the second NFET 702, $NFET_2$, may be coupled to the drain of the first PFET 692, $PFET_1$, and the drain of the first NFET 694, $NFET_2$, at the first voltage node 696. The source of the second PFET 700, $PFET_2$, may be coupled to the circuit supply voltage, $V_{DD}$. The source of the second NFET 702, $NFET_2$, may be coupled to ground. The drain of the second PFET 700, $PFET_2$, and the drain of the second NFET 702, $NFET_2$, may be coupled to form a second input buffer output at a second voltage node 704.

During operation of the first input buffer circuit 690, when the input voltage, $V_{IN}$, at the first input buffer input 690A is sufficiently low such that the input voltage, $V_{IN}$ is substantially equal to or less than a logic low threshold voltage, the first PFET 692, $PFET_1$, is configured to be in a conducting state and couples the circuit supply voltage, $V_{DD}$, to the first voltage node 696. As a result, the voltage level at the first voltage node 696 is substantially equal to the circuit supply voltage, $V_{DD}$, and the first input buffer circuit 690 provides an output voltage level representative of a digital logic high state at the first voltage node 696. In addition, the first NFET 694, $NFET_1$, is configured to be in a non-conducting state when the input voltage, $V_{IN}$, at the first input buffer input 690A is sufficiently low such that the input voltage, $V_{IN}$ is substantially equal to or less than the logic low threshold voltage.

However, when the input voltage, $V_{IN}$, at the first input buffer input 690A is sufficiently high such that the input voltage, $V_{IN}$ is substantially equal to or greater than a logic high threshold voltage, the first NFET 694, $NFET_1$, is configured to be in a conducting state and couples the first voltage node 696 to ground. As a result, the voltage level at the first voltage node 696 is substantially equal to ground, and the first input buffer circuit 690 provides an output voltage level representative of a digital logic low state at the first voltage node 696. In addition, the first PFET 692, $PFET_1$, is configured to be in a non-conducting state when the input voltage, $V_{IN}$, at the first input buffer input 690A is sufficiently high such that the input voltage, $V_{IN}$ is substantially equal to or greater than the logic high threshold voltage.

In a similar fashion, the operation of the second input buffer circuit 698 is dependent on the voltage level at the first voltage node 696, which is coupled to the first input buffer output of the first input buffer circuit 690. Accordingly, when the first input buffer circuit 690 provides a digital logic low state at the first voltage node 696 such that the voltage level at the first voltage node 696 is substantially equal to or less than the logic low threshold voltage, the second PFET 700, $PFET_2$, is configured to be in a conducting state and couples the circuit supply voltage, $V_{DD}$, to the second voltage node 704. As a result, the voltage level at the second input buffer circuit 698 is substantially equal to the circuit supply voltage, $V_{DD}$, and the second input buffer circuit 698 provides a digital logic high state at the second voltage node 704. In addition, the second NFET 702, $NFET_2$, is configured to be in a non-conducting state when the first input buffer circuit 690 provides an output voltage level representative of a digital logic low state at the first voltage node 696.

However, in a similar fashion as the operation of the first input buffer circuit 690, when the first input buffer circuit 690 provides a digital logic high state at the first voltage node 696 such that the voltage level at the first voltage node 696 is substantially equal to or higher than the logic low threshold voltage, the second NFET 702, $NFET_2$, is configured to be in a conducting state and couples the second voltage node 704 to ground. As a result, the voltage level at the second input buffer circuit 698 is substantially equal to the ground voltage, and the second input buffer circuit 698 provides a digital logic low state at the second voltage node 704. In addition, the second PFET 700, $PFET_2$, is configured to be in a non-conducting state when the first input buffer circuit 690 provides an output voltage level representative of a digital logic high state at the first voltage node 696

It will be appreciated that the propagation time of the digital logic level signal, represented by the input voltage, $V_{IN}$, through the input buffer circuit may be considered as a first portion of a fixed delay provided by the programmable delay circuitry 432C and is a function of the switching time of the transistors. The first portion of the fixed delay time provided by the input buffer circuit 682 depends upon the switching time of the respective first input buffer circuit 690 and the second input buffer circuit 698. In some alternative embodiments of the programmable delay circuitry 432C, additional input buffer circuits, (not depicted in FIG. 4), may be added to the input buffer circuit 682 to increase the first portion of the fixed delay provided by the input buffer circuit 682. In addition to providing a first portion of the fixed delay time through the programmable delay circuitry 432C, the combination of the first input buffer circuit 690 and the second input buffer circuit 698, may also provide the further benefit of isolating analog characteristics of the input voltage, $V_{IN}$, that represents the digital logic level signal from the variable delay circuitry. In some embodiments of the programmable delay circuitry 432C, the number of input buffer circuits used to provide isolation between the input voltage, $V_{IN}$, and the variable delay circuitry 684 may result in improved controllability of the variable delay provided by the variable delay circuitry 684.

The variable delay circuitry 684 includes an input stage 706 including a third PFET 708, $PFET_3$, a third NFET 710, $NFET_3$, a fourth PFET 714, $PFET_4$, a fourth NFET 716, $NFET_4$, a fifth PFET 718, $PFET_5$, and a fifth NFET 720, $NFET_5$. As will be explained, a portion of the input stage 706 of the variable delay circuitry 684 may include a correction start voltage circuit 712 that is formed by the interconnections of the third PFET 708, $PFET_3$ and the third NFET 710, $NFET_3$, to the fourth PFET 714, $PFET_4$, and the fourth NFET 716, $NFET_4$. The variable delay circuitry 684 further includes a variable delay capacitor 722. In some embodiments, the variable delay capacitor 722 may be configured as a programmable capacitor array.

As depicted in FIG. 4, the variable delay capacitor 722 may be coupled between a third voltage node 724 and ground. The variable delay capacitor 722 is configured to have a variable delay capacitance, $C_{DELAY\_VAR}$. In addition, although not depicted in FIG. 4, the controller 50 (FIG. 1A) may be configured to govern or set various parameters to adjust the capacitance value of the variable delay capacitance, $C_{DELAY\_VAR}$, in order to adjust the variable delay time, $T_{VARIABLE\_DELAY\_TIME}$, provided by the variable delay circuitry 684. For example, in some embodiments of the programmable delay circuitry 432C, the variable delay capacitor 722 may be configured to couple to the controller 50 (not shown), where the controller 50 is configured to control the capacitance value of the variable delay capacitance, $C_{DELAY\_VAR}$. In some embodiments of the programmable delay circuitry 432C, the variable delay capacitor 722 may be configured to increase as the value of a binary capacitor control word, CNTR_CD, increases, as described relative to FIG. 7.

For example, in some embodiments of the variable delay circuitry 684, the variable delay capacitor 722 may be configured as a programmable capacitor array. The programmable capacitor array may include multiple capacitors, where each of the capacitors is arranged in series with a switch element. Each switch element may have a switch state (open or closed) that may be controlled by the controller 50 such that the effective capacitance of the programmable capacitor array has a desired effective capacitance. In some embodiments, the programmable capacitor array may be a linear capacitor array, where each of the capacitors has the same value. In other embodiments, the programmable capacitor array may be a binary weighted capacitor array. The controller 50 may adjust the effective capacitance of the programmable capacitor array by controlling the switch state (open or closed) of each switch to combine different combinations of the multiple capacitors in parallel. Alternatively, the variable delay capacitor 722 may be a programmable varactor configured to be controlled by the controller 50. Depending on the topology and type of programmable capacitor, for example, the controller 50 may govern the effective capacitance of the programmable varactor by changing the distance between the two parallel plates that form the varactor or a voltage applied across the terminals of the varactor.

The variable delay circuitry 684 may further include an output buffer stage 726. By way of example, and not by way of limitation, the output buffer stage 726 depicted in FIG. 4 includes only one level of output buffering. Thus, as depicted in FIG. 4, the output buffer stage 726 includes a sixth PFET 728, PFET6, and a sixth NFET 730, $NFET_6$, operably coupled to form an output buffer having an output buffer output 732. The output buffer output 732 is formed by coupling the drain of the sixth PFET 728, PFET6, to the drain of the sixth NFET 730, $NFET_6$. The source of the sixth PFET 728, PFET6, is coupled to the circuit supply voltage, $V_{DD}$. The source of the sixth NFET 730, $NFET_6$ is coupled to ground.

However, similar to the input buffer circuit, some alternative embodiments of the variable delay circuitry 684 may include an embodiment of the output buffer stage 726 that includes multiple levels of output buffering in order to provide additional isolation between the interior circuitry of the variable delay circuitry 684 and the digital logic level signal to be generated by the programmable delay circuitry 432C. For example, some alternative embodiments of the variable delay circuitry 684 may include additional output buffering to improve the drive level at the output of the programmable delay circuitry 432C.

The operation of the output buffer stage 726 depends upon the voltage level at the third voltage node 724. When the voltage level at the third voltage node 724 is equal to or less than the logic low threshold voltage such that the sixth PFET 728, $PFET_6$, is turned on and in the saturation state, the output buffer output 732 is effectively coupled to the circuit supply voltage, $V_{DD}$, through the sixth PFET 728, $PFET_6$. Simultaneously, the sixth NFET 730, $NFET_6$, is configured to be turned off when the sixth PFET 728, $PFET_6$ is turned on. As a result, the output buffer stage 726 provides an output voltage, $V_{OUT}$, substantially equal to the circuit supply voltage, $V_{DD}$, which represents a digital logic high state. Thus, when the voltage level at the third voltage node 724 is equal to or less than the logic low threshold voltage such that the sixth PFET 728, $PFET_6$ is turned, the output buffer stage 726 is triggered to transition from a digital logic low state to a digital logic low state at the output buffer output 732.

However, when the voltage level at the third voltage node 724 is equal to or greater than the logic high threshold voltage, such that the sixth NFET 730, $NFET_6$, is turned on and in the saturation state, the output buffer output 732 is effectively coupled to the ground through the sixth NFET 730, $NFET_6$. Simultaneously, the sixth PFET 728, $PFET_6$, is configured to be turned off when the sixth NFET 730, $NFET_6$ is turned on. As a result, the output buffer stage 726 provides an output voltage, $V_{OUT}$, substantially equal to ground, which represents a digital logic low state. Thus, when the voltage level at the third voltage node 724 is equal to or greater than the logic high threshold voltage such that the sixth PFET 728, $PFET_6$, is turned, the output buffer stage 726 is triggered to transition from a digital logic high state to a digital logic low state at the output buffer output 732.

The time period during which the digital logic level signal, represented by the voltage level at the third voltage node 724, propagates through the output buffer stage 726 may be a second portion of the fixed delay time provided by the programmable delay circuitry 432C. The second portion of the fixed delay time provided by the output buffer stage 726 depends on the switching time of the output buffer stage 726. Some alternative embodiments of the variable delay circuitry 684 may include additional output buffering. Accordingly, the propagation time through the output buffer stage of the variable delay circuitry 684 may be increased by addition of additional output buffering. Thus, the fixed delay time of the programmable delay circuitry 432C includes the first portion of the fixed delay time of the input buffer circuit 682 and the second portion of the fixed delay time of the output buffer stage 726.

Returning to the description of the variable delay circuitry 684 depicted in FIG. 4, to form the input stage 706 of the variable delay circuitry 684, the gate of the fourth PFET 714, $PFET_4$, and the gate of the fourth NFET 716, $NFET_4$, are coupled to the second input buffer output at the second voltage node 704. The source of the fourth PFET 714, $PFET_4$, is coupled to the drain of the fifth PFET 718, $PFET_5$. The source of the fifth PFET 718, $PFET_5$, is coupled to the circuit supply voltage, $V_{DD}$. The source of the fourth NFET 716, $NFET_4$, is coupled to the drain of the fifth NFET 720, $NFET_5$. The source of the fifth NFET 720, $NFET_5$, is coupled to ground. As will be described with respect to the operation of the voltage divider circuit 686 and the bias current and mirror circuit 688, the bias current and mirror circuit 688 is configured to generate a first gate voltage on the gate of the fifth PFET 718, $PFET_5$, such that the fifth PFET 718, $PFET_5$, is configured to provide a first bias current, $I_{BIAS\_1}$, when the fourth PFET 714, $PFET_4$, is turned on. Similarly, the bias current and mirror circuit 688 is further configured to generate a second gate voltage on the gate of the fifth NFET 720, $NFET_5$, such that the fifth NFET 720, $NFET_5$, is configured to sink a second bias current, $I_{BIAS\_2}$, when the fourth NFET 716, $PFET_4$, is turned on. The drain of the fourth PFET 714, $PFET_4$, is coupled to the drain of the fourth NFET 716, $NFET_4$, to provide an input stage output at the third voltage node 724. The variable delay capacitor 722 is coupled between the third voltage node 724 and ground. As a result, the variable delay capacitor 722 is coupled to the drain of the fourth PFET 714, $PFET_4$, the drain of the fourth NFET 716, $NFET_4$, the gate of the sixth PFET 728, $PFET_6$, and the gate of the sixth NFET 730, $NFET_6$. The fourth PFET 714, $PFET_4$, and the fourth NFET 716, $NFET_4$, are configured such that when the fourth PFET 714, $PFET_4$, is in a conducting mode of operation (ON), the fourth NFET 716, $NFET_4$, is in a non-conducting mode (OFF). Likewise, the fourth PFET 714, $PFET_4$, and the fourth NFET 716, $NFET_4$, are configured such that when the fourth NFET 716, $NFET_4$, is in a conducting mode (ON) of operation, the fourth PFET 714, $PFET_4$, is in a non-conducting mode (OFF).

Accordingly, the fixed delay time of the programmable delay circuitry 432C may further include a third portion of the fixed delay time, where the third portion of the fixed delay time is associated with the switching time of the fourth PFET 714, $PFET_4$, and the switching time of the fourth NFET 716, $NFET_4$.

As a result, when the voltage level on the second voltage node 704 is substantially equal to or less than the logic low threshold voltage such that the fourth PFET 714, $PFET_4$, is in the conducting mode of operation (ON), the first bias current, $I_{BIAS\_1}$, passes through the fourth PFET 714, $PFET_4$, pushes charge into the variable delay capacitor 722 to charge the variable delay capacitor 722. As the variable delay capacitor 722 is charged, the voltage across the variable delay capacitor 722, which is substantially equal to the voltage level on the third voltage node 724, increases. However, when the voltage level on the second voltage node 704 is substantially equal to or greater than the logic high threshold voltage such that the fourth NFET 716, $NFET_4$, is in the conducting mode of operation (ON), the second bias current, $I_{BIAS\_2}$, sunk by the fifth NFET 720, $NFET_5$, passes through the fourth NFET 716, $NFET_4$, and pulls charge from the variable delay capacitor 722 to discharge the variable delay capacitor 722. As a result, the voltage across the variable delay capacitor 722, which is substantially equal to the voltage level on the third voltage node 724, falls.

The correction start voltage circuit 712 is formed by coupling the gate of the third PFET 708, $PFET_3$ and the gate of the third NFET 710, $NFET_3$, to the second voltage node 704, such that the gates of the third PFET 708, $PFET_3$, the third NFET 710, $NFET_3$, the fourth PFET 714, $PFET_4$, and the fourth NFET 716, $NFET_4$, are coupled. The source of the third PFET 708, $PFET_3$, is coupled to the circuit supply voltage, $V_{DD}$. The drain of the third PFET 708, $PFET_3$, is coupled to the source of the fourth NFET 716, $NFET_4$, and the drain of the fifth NFET 720, $NFET_5$. The source of the third NFET 710, $NFET_3$, is coupled to ground. The drain of the third NFET 710, $NFET_3$, is coupled to the source of the fourth PFET 714, $PFET_4$, and the drain of the fifth PFET 718, $PFET_5$.

The correction start voltage circuit 712 is configured to provide a first known voltage level at the source of the fourth PFET 714, $PFET_4$, while the fourth PFET 714, $PFET_4$, is in the non-conducting state such that the voltage level present at the source of the fourth PFET 714, $PFET_4$, is at the first known voltage level at the moment the fourth PFET 714, $PFET_4$ transitions from the non-conducting state to the conducting state. In order to provide the first known voltage level at the source of the fourth PFET 714, $PFET_4$, while the fourth PFET 714, $PFET_4$, is in the non-conducting state, the third NFET 710, $NFET_3$, is configured to be turned on when the while the fourth PFET 714, $PFET_4$, is in the non-conducting state. As a result, the source of the fourth PFET 714, $PFET_4$, is coupled to ground through the third NFET 710, $NFET_3$. In the embodiment of the correction start voltage circuit 712 depicted in FIG. 4, the first known voltage is substantially equal to ground. However, in alternative embodiments, the source of the third NFET 710, NFET$_3$. may be coupled to a voltage level other than ground such that the first known voltage is not substantially equal to ground. As an example, in some embodiments, the correction start voltage circuit 712 may be configured such that the first known voltage is substantially equal to one half the circuit supply voltage, $V_{DD}/2$.

In some embodiments of the correction start voltage circuit 712, the parasitic capacitance of the source of the fourth PFET 714, PFET$_4$, the parasitic capacitance of the drain of the fifth PFET 718, PFET$_5$, and/or a combination thereof is configured such that the voltage level present on the source of the fourth PFET 714, PFET$_4$, remains at the first known voltage level momentarily at the moment the fourth PFET 714, PFET$_4$ transitions from the non-conducting state to the conducting state. In other embodiments of the correction start voltage circuit 712, the parasitic capacitance of the drain of the third NFET 710, NFET$_3$, may also be configured to improve the ability of the correction start voltage circuit 712 to provide the first known voltage on the source of the fourth PFET 714, PFET$_4$, momentarily at the moment the fourth PFET 714, PFET$_4$, transitions from the non-conducting state to the conducting state. In addition, the third NFET 710, NFET$_3$ may be further configured to turn off just prior to or coincidentally with the fourth PFET 714, PFET$_4$, transitioning from the non-conducting state to the conducting state. Otherwise, after the charge present in the parasitic capacitance(s) is discharged, the voltage level on the source of the fourth PFET 714, PFET$_4$, is determined by the operational state of the fourth PFET 714, PFET$_4$, and the first bias current, $I_{BIAS\_1}$, provided by the fifth PFET 718, PFET$_5$.

In a similar fashion, the correction start voltage circuit 712 is configured to provide a second known voltage level at the source of the fourth NFET 716, NFET$_4$, while the fourth NFET 716, NFET$_4$, is in the non-conducting state such that the voltage level present at the source of the fourth NFET 716, NFET$_4$, is at the second known voltage level at the moment the fourth NFET 716, NFET$_4$ transitions from the non-conducting state to the conducting state. In order to provide the second known voltage level at the source of the fourth NFET 716, NFET$_4$, while the fourth NFET 716, NFET$_4$, is in the non-conducting state, the third PFET 708, PFET$_3$, is configured to be turned on when the fourth NFET 716, NFET$_4$, is in the non-conducting state. As a result, the source of the fourth NFET 716, NFET$_4$, is coupled through the third PFET 708, PFET$_3$, to the circuit supply voltage $V_{DD}$. As a result, in the embodiment of the correction start voltage circuit 712 depicted in FIG. 4, the second known voltage is substantially equal to the circuit supply voltage, $V_{DD}$. However, in alternative embodiments, the source of the third PFET 708, PFET$_3$. may be coupled to a voltage level other than the circuit supply voltage, $V_{DD}$, such that the second known voltage is not substantially equal to the circuit supply voltage, $V_{DD}$. As an example, in some embodiments, the correction start voltage circuit 712 may be configured such that the second known voltage is substantially equal to one half the circuit supply voltage, $V_{DD}/2$.

In some embodiments of the correction start voltage circuit 712, the parasitic capacitance of the source of the fourth NFET 716, NFET$_4$, the parasitic capacitance of the drain of the fifth NFET 720, NFET$_5$, and/or a combination thereof is configured such that the voltage level present on the source of the fourth NFET 716, NFET$_4$, remains at the second known voltage level momentarily at the moment the fourth NFET 716, NFET$_4$ transitions from the non-conducting state to the conducting state. In other embodiments of the correction start voltage circuit 712, the parasitic capacitance of the drain of the third PFET 708, PFET$_3$, may also be configured to improve the ability of the correction start voltage circuit 712 to provide the second known voltage on the source of the fourth NFET 716, NFET$_4$, momentarily at the moment the fourth NFET 716, NFET$_4$, transitions from the non-conducting state to the conducting state. In addition, the third PFET 708, PFET$_3$ may be further configured to turn off just prior to or coincidentally with the fourth NFET 716, NFET$_4$, transitioning from the non-conducting state to the conducting state. Otherwise, after the charge present in the parasitic capacitance(s) is discharged, the voltage level on the source of the fourth NFET 716, NFET$_4$, is determined by the operational state of the fourth NFET 716, NFET$_4$, and the second bias current, $I_{BIAS\_2}$, sunk by the fifth NFET 720, NFET$_5$.

Advantageously, because the correction start voltage circuit 712 is configured to ensure the voltage level on the source of the fourth PFET 714, PFET$_4$, is substantially equal to the first known voltage when the fourth PFET 714, PFET$_4$, is in the non-conducting state and the voltage level on the source of the fourth NFET 716, NFET$_4$, is substantially equal to the second known voltage when the fourth NFET 716, NFET$_4$, is in the non-conducting state, the initial change in the voltage level at the third voltage node 724 that occurs as a result of charge stored in the capacitances associated with the source of the fourth PFET 714, PFET$_4$, or the charge stored in the capacitances associated with the source of the fourth NFET 716, NFET$_4$, (referred to as a state transition voltage charge) is predictable and substantially consistent. As a result, the state transition voltage charge may be controlled such that the voltage across the variable delay capacitor 722 is not substantially disturbed when either the fourth PFET 714, PFET$_4$, or the fourth NFET 716, NFET$_4$, transitions to be in the conducting state.

For example, as previously described, when the second input buffer circuit 698 provides a digital logic high state, the second input buffer provides an output voltage at the second voltage node 704 substantially equal to the circuit supply voltage, $V_{DD}$. In this case, the gate of the fourth NFET 716, NFET$_4$, is greater than the logic high threshold level. As a result, the fourth NFET 716, NFET$_4$, turns on and discharges the variable delay capacitor 722 until the voltage level at the third voltage node 724 is substantially equal to ground. In addition, the third NFET 710, NFET$_3$, of the correction start voltage circuit 712 is configured to turn on and couple the source of the fourth PFET 714, PFET$_4$, to ground such that the charge stored on the source of the fourth PFET 714, PFET$_4$, is at a voltage level substantially equal to ground. As a result, the charge stored on the source of the fourth PFET 714, PFET$_4$, minimally affects the charging period, $\Delta T_{CHARGING\_PERIOD}$, of the variable delay circuitry 684, where the charging period, $\Delta T_{CHARGING\_PERIOD}$, is a period of time during which the variable delay capacitor 722 is being charged until the third voltage node 724 is equal to or exceeds the logic high threshold voltage of the output buffer stage 726.

Similarly, when the second input buffer circuit 698 provides a digital logic low state, the second input buffer provides an output voltage at the second voltage node 704 substantially equal to ground. In this case, the gate of the fourth PFET 714, PFET$_4$, is less than the logic low threshold level. As a result, fourth PFET 714, PFET$_4$, turns on and charges the variable delay capacitor 722 until the voltage level at the third voltage node 724 is substantially equal to the circuit supply voltage, $V_{DD}$. In addition, the third PFET 708, PFET$_3$, of the correction start voltage circuit 712 is configured to turn on and couple the source of the fourth NFET 716, NFET$_4$, to the circuit supply voltage, V$_{DD}$, such that the charge stored on the source of the fourth NFET 716, NFET$_4$, is at a voltage level substantially equal to ground. As a result, the charge stored on the source of the fourth NFET 716, NFET$_4$, minimally affect the charging period, $\Delta T_{DISCHARGING\_PERIOD}$, of the variable delay circuitry 684, where the charging period, $\Delta T_{DISCHARGING\_PERIOD}$, is a period of time during which the variable delay capacitor 722 is being discharged until the third voltage node 724 is equal to or less than the logic low threshold voltage of the output buffer stage 726.

Otherwise, if the correction start voltage circuit 712 is not present, the source of the fourth PFET 714, PFET$_4$, and the source of the fourth NFET 716, NFET$_4$, will each tend to float to an undetermined voltage level when either the fourth PFET 714, PFET$_4$, or the fourth NFET 716, NFET$_4$, are in the non-conducting state. As a result, state transition voltage change is unpredictable.

The operation of the output buffer stage 726 depends upon the voltage level at the third voltage node 724. When the voltage level at the third voltage node 724 is equal to or less than the logic low threshold voltage such that the sixth PFET 728, PFET$_6$ is turned on and in the saturation state, the output buffer output 732 is effectively coupled to the circuit supply voltage, V$_{DD}$, through the sixth PFET 728, PFET$_6$. Simultaneously, sixth NFET 730, NFET$_6$, is configured to be turned off when the sixth PFET 728, PFET$_6$ is turned on. As a result, the output buffer stage 726 provides an output voltage, V$_{OUT}$, substantially equal to the circuit supply voltage, V$_{DD}$, which represents a digital logic high state.

However, when the voltage level at the third voltage node 724 is equal to or greater than the logic high threshold voltage such that the sixth NFET 730, NFET$_6$ is turned on and in the saturation state, the output buffer output 732 is effectively coupled to the ground through the sixth NFET 730, NFET$_6$. Simultaneously, the sixth PFET 728, PFET$_6$, is configured to be turned off when the sixth NFET 730, NFET$_6$ is turned on. As a result, the output buffer stage 726 provides an output voltage, V$_{OUT}$, substantially equal to ground, which represents a digital logic low state.

The variable delay time, T$_{VARIABLE\_DELAY\_TIME}$, provided by the variable delay circuitry 684 is a function of a charging period, $\Delta T_{CHARGING\_PERIOD}$ and a discharging period, $\Delta T_{DISCHARGING\_PERIOD}$, of the variable delay capacitor. The charging period, $\Delta T_{CHARGING\_PERIOD}$, is a period of time during which the variable delay capacitor 722 is being charged until the third voltage node is equal to or exceeds the logic high threshold voltage. During the charging period, $\Delta T_{CHARGING\_PERIOD}$, the change in the voltage across the variable delay capacitor 722, necessary to change the digital logic state at the input of the output buffer stage 726, is the charging voltage change, $\Delta_{DELAY\_VAR\_CAP\_CHARGING}$. The discharging period, $\Delta T_{DISCHARGING\_PERIOD}$, is a period of time during which the variable delay capacitor 722 is being charged until the third voltage node 724 is equal to or exceed the logic high threshold voltage. During the discharging period, $\Delta T_{DISCHARGING\_PERIOD}$, the change in the voltage across the variable delay capacitor 722, necessary to change the digital logic state at the input of the output buffer stage 726, is the discharging voltage change, $\Delta_{DELAY\_VAR\_CAP\_DISCHARGING}$.

The average variable delay time, T$_{AVERAGE\_VARIABLE\_DELAY}$, provided by the variable delay circuitry 684 is provided by equation (1):

$$T_{AVERAGE\_VARIABLE\_DELAY} = \frac{T_{CHARGEING\_PERIOD} + T_{DISCHARGING\_PERIOD}}{2}. \quad (1)$$

The charging period, $\Delta T_{CHARGING\_PERIOD}$, of the variable delay capacitor 722 is dependent upon the capacitance value of the variable delay capacitance, $C_{DELAY\_VAR}$, and the magnitude of the variable delay capacitor current, $I_{C\_VAR}$, where the magnitude of the variable delay capacitor current, $I_{C\_VAR}$, is substantially equal to the first bias current, $I_{BIAS\_1}$ during the charging period, $\Delta T_{CHARGING\_PERIOD}$. Similarly, the discharging period, $\Delta T_{DISCHARGING\_PERIOD}$, of the variable delay capacitor 722 is dependent upon the capacitance value of the variable delay capacitance, $C_{DELAY\_VAR}$, and the magnitude of the variable delay capacitor current, $I_{C\_VAR}$, where the magnitude of the variable delay capacitor current, $I_{C\_VAR}$, is substantially equal to the second bias current, $I_{\text{-}BIAS\_2}$ during the discharging period, $\Delta T_{DISCHARGING\_PERIOD}$.

During the charging period, $\Delta T_{CHARGING\_PERIOD}$, the variable delay capacitor current, $I_{C\_VAR}$, is given by equation (2):

$$I_{C\_VAR} = \frac{\Delta V_{DELAY\_VAR\_CAP\_CHARGING} \times C_{DELAY\_VAR}}{\Delta T_{CHARGING\_PERIOD}} \quad (2)$$

Similarly, during the discharging period, $\Delta T_{DISCHARGING\_PERIOD}$, the variable delay capacitor current, $I_{C\_VAR}$, is given by equation (3) as follows:

$$I_{C\_VAR} = \frac{\Delta V_{DELAY\_VAR\_CAP\_DISCHARGING} \times C_{DELAY\_VAR}}{\Delta T_{DISCHARGING\_PERIOD}} \quad (3)$$

Assuming the variable delay capacitor current, $I_{C\_VAR}$, is substantially equal to the first bias current, $I_{BIAS\_1}$, provided by the fifth PFET 718, PFET$_5$, during the charging period, $\Delta T_{CHARGING\_PERIOD}$, the charging period, $\Delta T_{CHARGING\_PERIOD}$, is given by equation (4) as follows:

$$\Delta T_{CHARGING\_PERIOD} = \frac{\Delta V_{DELAY\_VAR\_CAP\_CHARGING} \times C_{DELAY\_VAR}}{I_{BIAS\_1}}. \quad (4)$$

Likewise, assuming the magnitude of the variable delay capacitor current, $I_{C\_VAR}$, is substantially equal to the second bias current, $I_{BIAS\_2}$, sunk by the fifth NFET 720, NFET$_5$, during the discharging period, $\Delta T_{DISCHARGING\_PERIOD}$, the discharging period, $\Delta T_{DISCHARGING\_PERIOD}$, is given by equation (5):

$$\Delta T_{DISCHARGEING\_PERIOD} = \frac{\Delta V_{DELAY\_VAR\_CAP\_DISCHARGING} \times C_{DELAY\_VAR}}{I_{BIAS\_2}}. \quad (5)$$

In some embodiments of the programmable delay circuitry 432C the channel width of the fifth PFET 718, PFET$_5$, and the channel width of the fifth NFET 720, NFET$_5$, are configured such that the first bias current, $I_{BIAS\_1}$, is substantially equal to the second bias current, $I_{BIAS\_2}$, where the magnitude of the first bias current, $I_{BIAS\_1}$, and the magnitude of the second bias current, $I_{BIAS\_2}$, are substantially equal to a bias current, $I_{BIAS}$.

Some embodiments of the output buffer stage 726 may be configured such that the charging voltage change, $\Delta_{DELAY\_VAR\_CAP\_CHARGING}$, is substantially equal to the discharging voltage change, $\Delta_{DELAY\_VAR\_CAP\_DISCHARGING}$. For example, in some embodiments, the output buffer stage 726 logic low threshold voltage and a logic high threshold are configured such that the voltage change, $\Delta_{DELAY\_VAR\_CAP\_CHARGING}$, is substantially equal to the discharging voltage change, $\Delta_{DELAY\_VAR\_CAP\_DISCHARGING}$. In the case where the magnitude of the charging voltage change, $\Delta_{DELAY\_VAR\_CAP\_CHARGING}$, is substantially equal to the magnitude of the discharging voltage change, $\Delta_{DELAY\_VAR\_CAP\_DISCHARGING}$, such that the magnitude of the charging voltage change, $\Delta_{DELAY\_VAR\_CAP\_CHARGING}$, and the magnitude of the discharging voltage change, $\Delta_{DELAY\_VAR\_CAP\_DISCHARGING}$, are substantially equal to a transition voltage change, $\Delta_{DELAY\_VAR\_CAP\_TRANSITION}$, the variable delay time, $T_{VARIABLE\_DELAY\_TIME}$, of the variable delay circuitry 684 is given by equation (6):

$$\Delta T_{VARIABLE\_DELAY\_TIME} = \frac{\Delta V_{DELAY\_VAR\_CAP\_TRANSITION} \times C_{DELAY\_VAR}}{I_{BIAS}}. \quad (6)$$

In other embodiments of the programmable delay circuitry 432C, the channel width of the fifth PFET 718, PFET$_5$, and the channel width of the fifth NFET 720, NFET$_5$, may be configured such that the first bias current, $I_{BIAS\_1}$, is not substantially equal to the second bias current, $I_{BIAS\_2}$. In this case, the charging period, $\Delta T_{CHARGING\_PERIOD}$, and the discharging period, $\Delta T_{DISHARGING\_PERIOD}$, may not be substantially equal. As an example, in some embodiments, the charging period, $\Delta T_{CHARGING\_PERIOD}$, is longer than the discharging period, $\Delta T_{DISHARGING\_PERIOD}$. In other embodiments, the charging period, $\Delta T_{CHARGING\_PERIOD}$, is less than the discharging period, $\Delta T_{DISHARGING\_PERIOD}$.

As an alternative embodiment, the logic low threshold voltage and the logic high threshold of the output buffer stage 726 may be configured such the charging voltage change, $\Delta_{DELAY\_VAR\_CAP\_CHARGING}$, is substantially equal to the discharging voltage change, $\Delta_{DELAY\_VAR\_CAP\_DISCHARGING}$.

Figure 7:
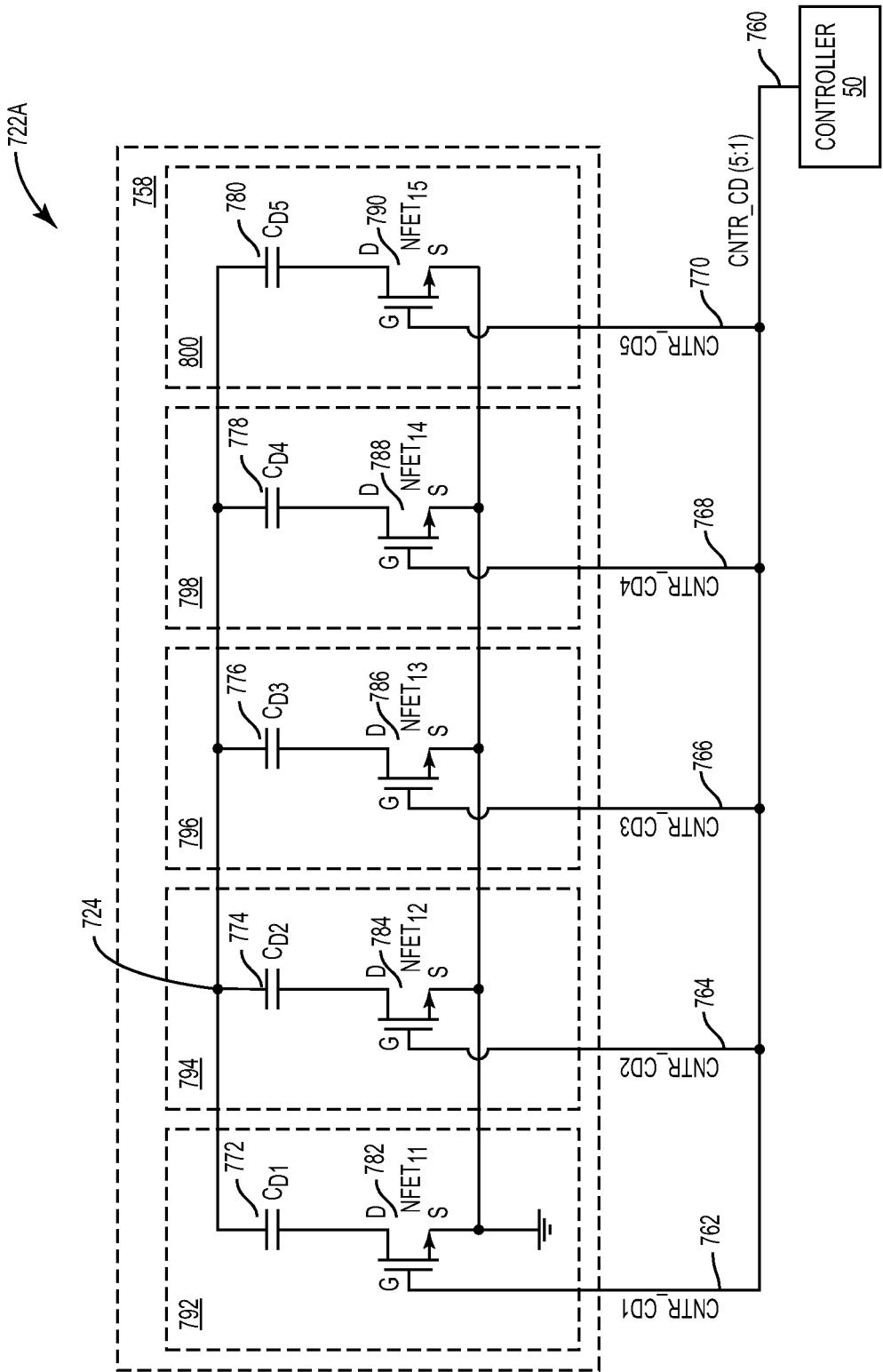
FIG. 7 depicts an example embodiment of a variable delay capacitor.

In addition, as discussed above, in some embodiments of the programmable delay circuitry 432C, the controller 50 (FIG. 1A) may be coupled to the variable delay capacitor 722. The controller 50 may be configured to control the capacitance value of the variable delay capacitance, $C_{DELAY\_VAR}$, based on a binary capacitor control word, CNTR_CD, such that as the value of the binary capacitor control word, CNTR_CD increases, the variable delay capacitance, $C_{DELAY\_VAR}$, linearly increases or decreases in a substantially linear fashion. In some alternative embodiments of the variable delay capacitor 722, the variable delay capacitance, $C_{DELAY\_VAR}$, has a minimum capacitance value, $C_{DELAY\_VAR\_MIN}$, that corresponds to the minimum delay provided by charging and discharging of the variable delay capacitor 722 of the variable delay circuitry 684. As an example, the minimum capacitance value, $C_{DELAY\_VAR\_MIN}$, of the variable delay capacitor 722 may be provided by a fixed capacitance (not depicted) in parallel with a programmable binary capacitor array. An example of a programmable binary capacitor array is depicted in FIG. 7.

Furthermore, as discussed above, in some embodiments of the programmable delay circuitry 432C, the controller 50 (FIG. 1A), may be configured to control the capacitance value of the variable delay capacitance, $C_{DELAY\_VAR}$, based on a binary capacitor control word, CNTR_CD, such that as the value of the binary capacitor control word, CNTR_CD increases, the variable delay capacitance, $C_{DELAY\_VAR}$, linearly increases or decreases in a substantially linear fashion. As a result, the variable delay circuitry 684 may be configured such that the variable delay time, $T_{VARIABLE\_DELAY\_TIME}$, increases in a substantially linear fashion as the variable delay capacitance, $C_{DELAY\_VAR}$, increases in a substantially linear fashion. In addition, the delay step size, $\Delta_{VARIABLE\_DELAY\_TIME}$, of the variable delay circuitry 684 between any two adjacent values of the variable delay capacitance, $C_{DELAY\_VAR}$, may be substantially equal.

Because the first input buffer circuit 690, the second input buffer circuit 698, the input stage 706 of the variable delay circuitry 684, the correction start voltage circuit 712, and the output buffer stage 726 are substantially symmetric in construction, the first input buffer circuit 690, the second input buffer circuit 698, the input stage 706 of the variable delay circuitry 684, the correction start voltage circuit 712, and the output buffer stage 726 may be configured such that the logic low threshold voltage and the logic high threshold voltage tend to proportionally track the circuit supply voltage, $V_{DD}$. As a result, the magnitude of the charging voltage change, $\Delta_{DELAY\_VAR\_CAP\_CHARGING}$, and the magnitude of the discharging voltage change, $\Delta_{DELAY\_VAR\_CAP\_DISCHARGING}$, will also tend to proportionally track the circuit supply voltage. However, the variations in the variable delay time, $T_{VARIABLE\_DELAY\_TIME}$, provided by the variable delay circuitry 684 due to changes in the voltage level of the circuit supply voltage, $V_{DD}$, may be minimized by configuring the programmable delay circuitry 432C such that the magnitude of the first bias current, $I_{BIAS\_1}$, and the magnitude of the second bias current, $I_{BIAS\_2}$, change proportionally with respect to a change in the voltage level of the circuit supply voltage, $V_{DD}$.

As an example, the voltage divider circuit 686 and bias current and mirror circuit 688 may be configured such that the first bias current, $I_{BIAS\_1}$, provided by the fifth PFET 718, PFET$_5$, and the second bias current, $I_{BIAS\_2}$, sunk by the fifth NFET 720, NFET$_5$, are related to the voltage level of the circuit supply voltage, $V_{DD}$, such that the variations in the variable delay time, $T_{VARIABLE\_DELAY\_TIME}$, provided by the variable delay circuitry 684 due to changes in the voltage level of the circuit supply voltage, $V_{DD}$, may be minimized.

The bias current and mirror circuit 688 includes a seventh PFET 734, PFET$_7$, a seventh NFET 736, NFET$_7$, an eighth PFET 738, PFET$_8$, an eighth NFET 740, PFET$_9$, a bias reference current setting resistor 744, and a bias resistor 746. The bias reference current setting resistor 744 has a bias reference current setting resistance, $R_3$. The bias resistor 746 has a bias resistance, $R_4$.

The source of the seventh PFET 734, PFET$_7$, is coupled to the circuit supply voltage, $V_{DD}$. The gate of the seventh PFET 734, PFET$_7$, is coupled to the source of the seventh PFET 734, NFET$_7$, and the drain of the eighth NFET 740, NFET$_8$. In addition, the gate and drain of the seventh PFET 734, PFET$_7$, is coupled to the gate of the fifth PFET 718, PFET$_5$.

The gate and drain of the seventh PFET 734, PFET$_7$, is coupled to the drain of the eighth NFET 740, NFET$_8$, The source of the eighth NFET 740, NFET$_8$, is coupled to the drain of the seventh NFET 736, NFET$_7$. The sources of the eighth NFET 740, NFET$_8$, and the seventh NFET 736, NFET$_7$, are coupled to ground. The gate of the seventh NFET 736, NFET$_7$, is coupled to the drain and gate of the ninth NFET 742, NFET$_9$. In addition, the gate of the seventh NFET 736, NFET$_7$, and the gate and drain of the ninth NFET 742, NFET$_9$, are coupled to the gate of the fifth NFET 720, NFET$_5$, of the variable delay circuitry 684.

The bias reference current setting resistor 744 is coupled between the circuit supply voltage, $V_{DD}$, and the source of the eighth PFET 738, PFET$_8$. The bias resistor 746 is coupled between the drain of the eighth PFET 738, PFET$_8$, and the drain and gate of the ninth NFET 742, NFET$_9$, and the gate of the seventh NFET 736, NFET$_7$.

The voltage divider circuit 686 includes a first voltage divider resistor 748, a tenth PFET 750, PFET$_{10}$, an eleventh PFET 752, PFET$_{11}$, and a second voltage divider resistor 754. The first voltage divider resistor 748 has a first voltage divider resistance, R$_1$. The second voltage divider resistor 754 has a second voltage divider resistance, R$_2$. The first voltage divider resistance, R$_1$, of the first voltage divider resistor 748 is substantially equal to the second voltage divider resistance, R$_2$, of the second voltage divider resistor 754.

The first voltage divider resistor 748 is coupled between the circuit supply voltage, V$_{DD}$, and the source of the tenth PFET 750, PFET$_{10}$. The gate of the tenth PFET 750, PFET$_{10}$, is coupled to the drain of the tenth PFET 750, PFET$_{10}$ and the source of the eleventh PFET 752, PFET$_{11}$. The gate of the eleventh PFET 752, PFET$_{11}$, is coupled to the drain of the eleventh PFET 752, PFET$_{11}$. The second voltage divider resistor 754 is coupled between the drain of the eleventh PFET 752, PFET$_{11}$, and ground. Because the gate of the tenth PFET 750, PFET$_{10}$, is coupled to the drain of the tenth PFET 750, and the gate of the eleventh PFET 752, PFET$_{11}$, is coupled to the drain of the eleventh PFET 752, PFET$_{11}$, both the tenth PFET 750, PFET$_{10}$, and the eleventh PFET 752, PFET$_{11}$, are biased to be on in a saturation mode of operation. The source-to-drain voltage across the tenth PFET 750, PFET$_{10}$, and the source-to-drain voltage across the eleventh PFET 752, PFET$_{11}$, are substantially equal. Because the first voltage divider resistance, R$_1$, of the first voltage divider resistor 748 is substantially equal to the second voltage divider resistance, R$_2$, of the second voltage divider resistor 754, the voltage divider circuit 686 may be configured to set a bias voltage substantially equal to one-half of the circuit supply voltage, V$_{DD}$, on the drain of the tenth PFET 750, PFET$_{10}$, and the source of the eleventh PFET 752, PFET$_{11}$.

The operation of the bias current and mirror circuit 688 is now explained with reference to the voltage divider circuit 686. The bias current and mirror circuit 688 is coupled to the voltage divider circuit 686 by coupling the gate of the eighth PFET 738, PFET$_8$, to the gate and drain of the eleventh PFET 752, PFET$_{11}$. The eighth PFET 738, PFET$_8$, of the bias current and mirror circuit 688 and the eleventh PFET 752, PFET$_{11}$, of the voltage divider circuit 686 are configured such that the gate-to-source voltage of the eighth PFET 738, PFET$_8$, is substantially equal to the gate-to-source voltage of the eleventh PFET 752, PFET$_{11}$. As a result, the voltage on the source of the eighth PFET 738, PFET$_8$, is substantially equal to the voltage on the source of the eleventh PFET 752, PFET$_{11}$. As discussed above with respect to the operation of the voltage divider circuit 686, the voltage on the source of the eleventh PFET 752, PFET$_{11}$, is substantially equal to V$_{DD}$/2. Accordingly, the voltage on the source of the eighth PFET 738, PFET$_8$, is also substantially equal to V$_{DD}$/2. The current through the bias reference current setting resistor 744, which is the reference bias current, I$_{BIAS\_REF}$, is provided by equation (7) as follows:

$$I_{BIAS\_REF} = \frac{V_{DD} - \frac{V_{DD}}{2}}{R_3} = \frac{V_{DD}}{2 \times R_3} \quad (7)$$

Accordingly, the drain-to-source current of the ninth NFET 742, NFET$_9$, is substantially equal to I$_{BIAS\_REF}$.

Because the gate and drain of the ninth NFET 742, NFET$_9$, are coupled to the gate of the seventh NFET 736, NFET$_7$, and the gate of the fifth NFET 720, NFET$_5$, the source-to-drain current flowing through the ninth NFET 742, NFET$_9$, is mirrored such that the drain-to-source current flowing through the seventh NFET 736, NFET$_7$, and the drain-to-source current flowing through the fifth NFET 720, NFET$_5$, are proportional to the drain-to-source current flowing through the ninth NFET 742, NFET$_9$. Furthermore, the source-to-drain current flowing through the seventh PFET 734, PFET$_7$, is substantially equal to the drain-to-source current flowing through the seventh NFET 736, NFET$_7$. Because the gate-to-source voltage of the fifth PFET 718, PFET$_5$, is substantially equal to the gate voltage of the seventh PFET 734, PFET$_7$, the source-to-drain current of the seventh PFET 734, PFET$_7$, is proportional to the bias reference current, I$_{BIAS\_REF}$, where the bias reference current setting resistance, R$_3$, of the bias reference current setting resistor 744 sets the bias reference current, I$_{BIAS\_REF}$. As a result, the first bias current, I$_{BIAS\_1}$, proportionally tracks the circuit supply voltage, V$_{DD}$. Similarly, the second bias current, I$_{BIAS\_2}$, proportionally tracks the circuit supply voltage, V$_{DD}$.

Accordingly, the bias reference current setting resistance, R$_3$, resistance value may be configured to minimize the sensitivity of the variable delay time, T$_{VARIABLE\_DELAY\_TIME}$, provided by the variable delay circuitry 684 to a change in the voltage level of the circuit supply voltage, V$_{DD}$. In addition, in some embodiments, the channel width ratios of the channel width of the ninth NFET 742, NFET$_9$, to each of the channel widths of the seventh PFET 734, PFET$_7$, the seventh NFET 736, NFET$_7$, the fifth PFET 718, PFET$_5$ and the fifth NFET 720, NFET$_5$, may be configured to minimize the sensitivity of the variable delay time, T$_{VARIABLE\_DELAY\_TIME}$, provided by the variable delay circuitry 684 due to changes in the voltage level of the circuit supply voltage, V$_{DD}$.

FIG. 7 depicts an example embodiment of the variable delay capacitor 722, depicted in FIG. 4, as variable delay capacitor 722A. The variable delay capacitor 722A may be configured as a programmable capacitor array 758. The programmable capacitor array 758 may be coupled to the controller 50 via a variable capacitance control bus 760, CNTR_CD (5:1). The variable delay capacitor 722A has a variable delay capacitance, C$_{DELAY\_VAR}$. The controller 50 may be configured to control the variable delay capacitance, C$_{DELAY\_VAR}$, of the variable delay capacitor 722A by configuring the programmable capacitor array 758.

The variable capacitance control bus 760, CNTR_CD (5:1), may include a first capacitor control signal 762, CNTR_CD1, a second capacitor control signal 764, CNTR_CD2, a third capacitor control signal 766, CNTR_CD3, a fourth capacitor control signal 768, CNTR_CD4, and a fifth capacitor control signal 770, CNTR_CD5.

The programmable capacitor array 758 may include a first array capacitor 772, a second array capacitor 774, a third array capacitor 776, a fourth array capacitor 778, and a fifth array capacitor 780. The first array capacitor 772 may have a capacitance substantially equal to a first array capacitor capacitance, C$_{D1}$. The second array capacitor 774 may have a capacitance substantially equal to a second array capacitor capacitance, C$_{D2}$. The third array capacitor 776 may have a capacitance substantially equal to a third array capacitor capacitance, C$_{D3}$. The fourth array capacitor 778 may have a capacitance substantially equal to a fourth array capacitor capacitance, C$_{D4}$. The fifth array capacitor 780 may have a capacitance substantially equal to a fifth array capacitor capacitance, C$_{D5}$.

In addition, the programmable capacitor array 758 may further include a first switch element 782, $NFET_{11}$, a second switch element 784, $NFET_{12}$, a third switch element 786, $NFET_{13}$, a fourth switch element 788, $NFET_{14}$, and a fifth switch element 790, $NFET_{15}$. In FIG. 7, by way of example and not by way of limitation, the first switch element 782, $NFET_{11}$, the second switch element 784, $NFET_{12}$, the third switch element 786, $NFET_{13}$, the fourth switch element 788, $NFET_{14}$, and the fifth switch element 790, $NFET_{15}$ are each depicted as NFET devices.

The programmable capacitor array 758 includes a first programmable capacitance 792, a second programmable capacitance 794, a third programmable capacitance 796, a fourth programmable capacitance 798, and a fifth programmable capacitance 800. The first programmable capacitance 792 may be formed by coupling the first array capacitor 772 between the third voltage node 724 and the drain of the first switch element 782, $NFET_{11}$, where the source of the first switch element 782, $NFET_{11}$, is coupled to ground and the gate of first switch element 782, $NFET_{11}$, is coupled to the first capacitor control signal 762, CNTR_CD1, of the variable capacitance control bus 760, CNTR_CD (5:1). The second programmable capacitance 794 may be formed by coupling the second array capacitor 774 between the third voltage node 724 and the drain of the second switch element 784, $NFET_{12}$, where the source of the second switch element 784, $NFET_{12}$, is coupled to ground and the gate of second switch element 784, $NFET_{12}$, is coupled to the second capacitor control signal 764, CNTR_CD2, of the variable capacitance control bus 760, CNTR_CD (5:1). The third programmable capacitance 796 may be formed by coupling the third array capacitor 776 between the third voltage node 724 and the drain of the third switch element 786, $NFET_{13}$, where the source of the third switch element 786, $NFET_{13}$, is coupled to ground and the gate of third switch element 786, $NFET_{13}$, is coupled to the third capacitor control signal 766, CNTR_CD3, of the variable capacitance control bus 760, CNTR_CD (5:1). The fourth programmable capacitance 798 may be formed by coupling the fourth array capacitor 778 between the third voltage node 724 and the drain of the fourth switch element 788, $NFET_{14}$, where the source of the fourth switch element 788, $NFET_{14}$, is coupled to ground and the gate of fourth switch element 788, $NFET_{14}$, is coupled to the fourth capacitor control signal 768, CNTR_CD4, of the variable capacitance control bus 760, CNTR_CD (5:1). The fifth programmable capacitance 800 may be formed by coupling the fifth array capacitor 780 between the third voltage node 724 and the drain of the fifth switch element 790, $NFET_{15}$, where the source of the fifth switch element 790, $NFET_{15}$, is coupled to ground and the gate of the fifth switch element 790, $NFET_{15}$, is coupled to the fifth capacitor control signal 770, CNTR_CD5, of the variable capacitance control bus 760, CNTR_CD (5:1).

As an example, in some embodiments, the variable delay capacitor 722A is configured such that the programmable capacitor array 758 is a linearly programmable capacitor array. The variable delay capacitor 722A may be configured to be a linearly programmable capacitor array by configuring the first array capacitor capacitance, $C_{D1}$, the second array capacitor capacitance, $C_{D2}$, the third array capacitor capacitance, $C_{D3}$, the fourth array capacitor capacitance, $C_{D4}$, and the fifth array capacitor capacitance, $C_{D5}$, to have the same capacitance value.

As an alternative example, in some embodiments of the variable delay capacitor 722A, the programmable capacitor array 758 may be configured as a binary weighted programmable capacitor array. The binary weighted programmable capacitor array may be configured such that the second array capacitor capacitance, $C_{D2}$, has substantially twice the capacitance as the first array capacitor capacitance, $C_{D1}$, the third array capacitor capacitance, $C_{D3}$, has substantially twice the capacitance as the second array capacitor capacitance, $C_{D2}$, the fourth array capacitor capacitance, $C_{D4}$, has substantially twice the capacitance as the third array capacitor capacitance, $C_{D3}$, and the fifth array capacitor capacitance, $C_{D5}$, has substantially twice the capacitance as the fourth array capacitor capacitance, $C_{D4}$.

The controller 50 may be configured to selectively control the variable capacitance bus, CNTR_CD (5:1), to set the capacitance value of the variable delay capacitance, $C_{DELAY\_VAR}$, of the variable delay capacitor 722A. The first capacitor control signal 762, CNTR_CD1, the second capacitor control signal 764, CNTR_CD2, the third capacitor control signal 766, CNTR_CD3, the fourth capacitor control signal 768, CNTR_CD4, and the fifth capacitor control signal 770, CNTR_CD5, may form a binary capacitor control word, CNTR_CD, where 0≥CNTR_CD≥31.

Accordingly, the programmable capacitor array 758 may be configured such that as the value of the binary capacitor control word, CNTR_CD increases from 0 to 31, the effective capacitance of the programmable capacitor array 758 changes linearly.

Accordingly, returning to FIG. 4, in those embodiments of the programmable delay circuitry 432C that include an embodiment of the variable delay capacitor 722A, depicted in FIG. 7, the delay step size, $\Delta_{VARIABLE\_DELAY\_TIME}$, of the variable delay circuitry 684 between any two adjacent values of the variable delay capacitance, $C_{DELAY\_VAR}$, may be a function of the granularity of the effective capacitance of the binary capacitor control word, CNTR_CD changes, and the number of array capacitors present in the binary weighted programmable capacitor array. In some embodiments of the programmable delay circuitry 432C, the variable delay circuitry 684 may be configured such that the average delay step size, $\Delta_{VARIABLE\_DELAY\_TIME}$, of the variable delay time, $T_{VARIABLE\_DELAY\_TIME}$, is about 136 picoseconds. In other embodiments of the programmable delay circuitry 432C, the variable delay circuitry 684 may be configured such that the average delay step size, $\Delta_{VARIABLE\_DELAY\_TIME}$, of the variable delay time, $T_{VARIABLE\_DELAY\_TIME}$, is about 100 picoseconds.

Illustratively, by way of example, and not by limitation, in some embodiments of the programmable capacitor array 758 used to provide the variable delay capacitance, $C_{DELAY\_VAR}$, of the variable delay circuitry 684, the first array capacitor capacitance, $C_{D1}$, of the first array capacitor 772 may have a capacitance of around 18.25 pF. The second array capacitor capacitance, $C_{D2}$, of the second array capacitor 774 may have a capacitance of around 30.93 pF. The third array capacitor capacitance, $C_{D3}$, of the third array capacitor 776 may have a capacitance of around 61.86 pF. The fourth array capacitor capacitance, $C_{D4}$, of the fourth array capacitor 778 may have a capacitance of around 123.72 pF. The fifth array capacitor capacitance, $C_{D5}$, of the fifth array capacitor 780 may have a capacitance of around 247.45 pF.

The variable delay capacitance, $C_{DELAY\_VAR}$, of the variable delay capacitor 722, depicted in FIG. 4, may be configured by the controller 50 by incrementally changing the variable delay time, $T_{VARIABLE\_DELAY\_TIME}$, provided by the programmable delay circuitry 432C, depicted in FIG. 4, in steps substantially equal to the average delay step size, $\Delta_{VARIABLE\_DELAY\_TIME}$. For example, for the case where the average delay step size, $\Delta_{VARIABLE\_DELAY\_TIME}$, is substantially equal to 136 picoseconds, the high frequency ripple compensation current 416, $I_{COR}$, may be aligned to within an accuracy of less than 136 picoseconds. The precision of the average temporal alignment may be based upon the granularity of the capacitance values of the capacitors of the binary capacitor array.

Output Impedance Compensation of a Pseudo-Envelope Follower Power Management System A switch mode power supply converter, a parallel amplifier, and a parallel amplifier output impedance compensation circuit are disclosed. The switch mode power supply converter provides a switching voltage and generates an estimated switching voltage output, which is indicative of the switching voltage. The parallel amplifier generates a power amplifier supply voltage at a power amplifier supply output based on a compensated $V_{RAMP}$ signal. The parallel amplifier output impedance compensation circuit provides the compensated $V_{RAMP}$ signal based on a combination of a $V_{RAMP}$ signal and a high frequency ripple compensation signal. The high frequency ripple compensation signal is based on a difference between the $V_{RAMP}$ signal and the estimated switching voltage output.

In one embodiment of the parallel amplifier output impedance compensation circuit, the parallel amplifier output impedance compensation circuit compensates for a non-ideal output impedance of the parallel amplifier by providing the compensated $V_{RAMP}$ signal based on the combination of the $V_{RAMP}$ signal and a high frequency ripple compensation signal. In one embodiment of the parallel amplifier output impedance compensation circuit, the combination of the $V_{RAMP}$ signal and the high frequency ripple compensation signal is based on pre-filtering the $V_{RAMP}$ signal to equalize the overall frequency response of the switch mode power supply converter and the parallel amplifier to provide a proper transfer function of the switch mode power supply converter and the parallel amplifier.

Figure 5A:
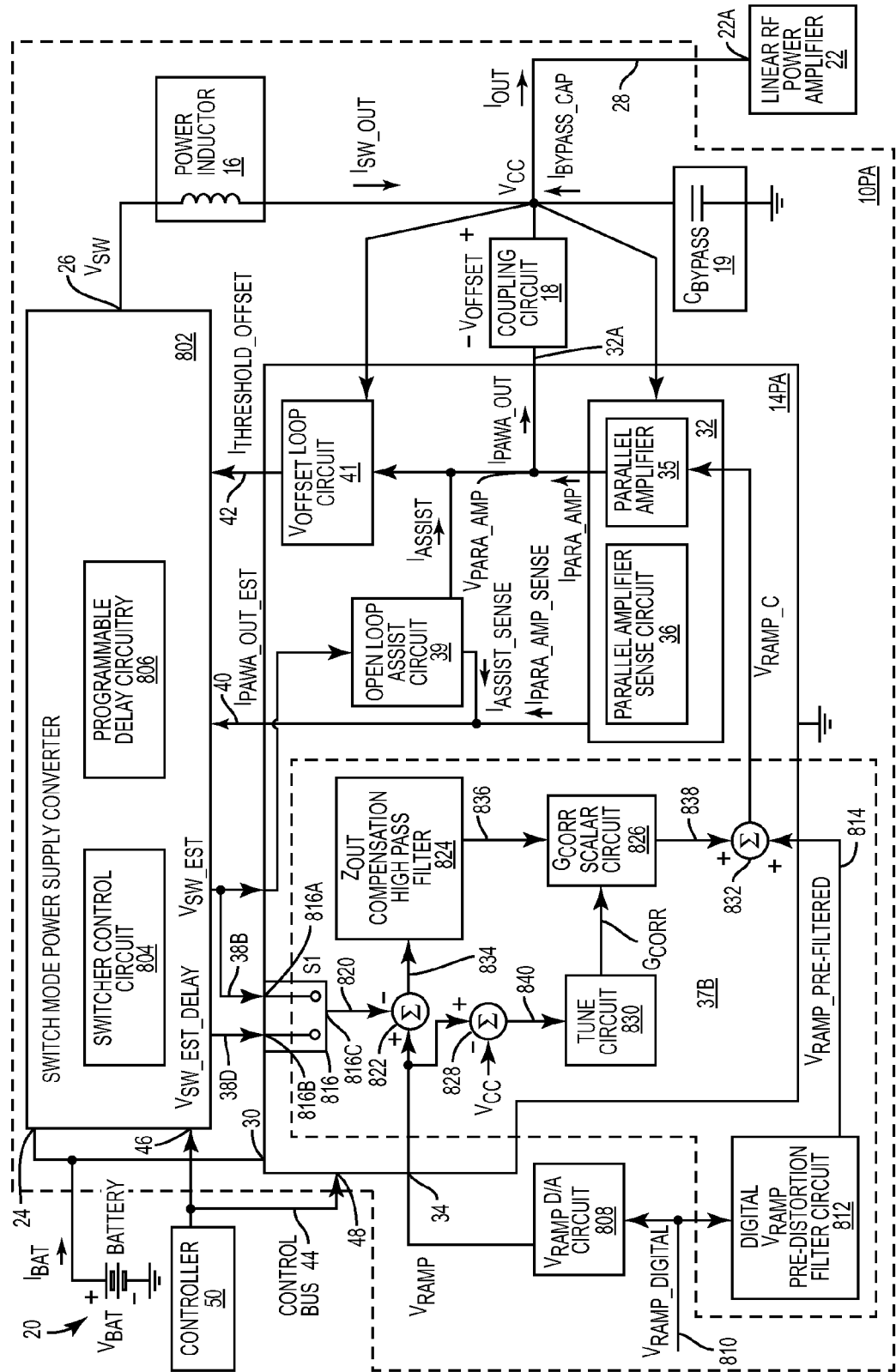
FIG. 5A depicts an embodiment of a parallel amplifier output impedance compensation circuit including a digital $V_{RAMP}$ pre-distortion filter circuit.

FIG. 5A depicts an example embodiment of a pseudo-envelope follower power management system 10PA that is similar in form and function to the pseudo-envelope follower power management system 10B, depicted in FIG. 2B. However, unlike the pseudo-envelope follower power management system 10B, depicted in FIG. 2B, the pseudo-envelope follower power management system 10PA may include a switch mode power supply converter 802 instead of the multi-level charge pump buck converter 12B. The switch mode power supply converter 802 may include a switcher control circuit 804 and programmable delay circuitry 806. In addition, unlike the pseudo-envelope follower power management system 10B, depicted in FIG. 2B, the pseudo-envelope follower power management system 10PA includes a parallel amplifier circuit 14PA.

The switch mode power supply converter 802 depicted in FIGS. 34A-34E may be either a multi-level charge pump buck converter or a buck converter. The switch mode power supply converter 802 uses the switcher control circuit 804 in combination with the programmable delay circuitry 806 to generate a delayed estimated switching voltage output, 38D, $V_{SW\_EST\_DELAY}$. The controller 50 may configure the delay provided by the programmable delay circuitry 806 to temporally shift the delayed estimated switching voltage output, 38D, $V_{SW\_EST\_DELAY}$, with respect to the estimated switching voltage output 38B, $V_{SW\_EST}$. Accordingly, the controller 50 may temporally align the generation of the delayed estimated switching voltage output 38D, $V_{SW\_EST\_DELAY}$, with respect to the $V_{RAMP}$ signal to improve performance of the circuitry and systems to be described.

In addition, some embodiments of the switch mode power supply converter 802 may include an FLL circuit (not depicted) similar to the FLL circuit 54 (FIG. 2A). Likewise, as a non-limiting example, the switch mode power supply converter 802 may be configured as a multi-level charge pump buck converter. Alternatively, as another non-limiting example, the switch mode power supply converter 802 may be configured as a buck converter.

Similar to the generation of the estimated switching voltage output 38B, $V_{SW\_EST}$, by the switcher control circuit 52 of the multi-level charge pump buck converter 12B, depicted in FIG. 2B, the delayed estimated switching voltage output 38D, $V_{SW\_EST\_DELAY}$, provides an indication of the switching voltage, $V_{SW}$, to be generated at the switching voltage output 26 based on the state of the switcher control circuit 804, except the delayed estimated switching voltage output 38D, $V_{SW\_EST\_DELAY}$, may be delayed by an alignment period, $T_{ALIGNMENT}$ to compensate for delays in either the switch mode power supply converter 802, the parallel amplifier circuit 14PA, or both.

The programmable delay circuitry 806 of the switch mode power supply converter 802 may be configured by the controller 50 to provide the alignment period, $T_{ALIGNMENT}$, in order to generate the delayed estimated switching voltage output 38D, $V_{SW\_EST\_DELAY}$. As a non-limiting example, the programmable delay circuitry 806 may be similar in form and function to the programmable delay circuitry 432A, depicted in FIG. 3A, the programmable delay circuitry 432B, depicted in FIG. 3B, or the programmable delay circuitry 432C, depicted in FIG. 4.

The controller 50 may configure the switch mode power supply converter 802 to scale the magnitude of the delayed estimated switching voltage output 38D, $V_{SW\_EST\_DELAY}$, such that the magnitude of the delayed estimated switching voltage output 38D, $V_{SW\_EST\_DELAY}$, tracks variations in the supply input 24, ($V_{BAT}$).

The pseudo-envelope follower power management system 10PA further includes a $V_{RAMP}$ digital-to-analog (D/A) circuit 808 and a parallel amplifier circuit 14PA that is similar in form and function to the parallel amplifier circuit 14B, depicted in FIG. 2B. However, unlike the parallel amplifier circuit 14B, the parallel amplifier circuit 14PA may be further configured to receive both the estimated switching voltage output 38B, $V_{SW\_EST}$, and the delayed estimated switching voltage output 38D, $V_{SW\_EST\_DELAY}$, generated by the switch mode power supply converter 802. In addition, the $V_{RAMP}$ digital-to-analog (D/A) circuit 808 may be configured to receive a digital $V_{RAMP}$ signal 810, $V_{RAMP\_DIGITAL}$, from a baseband portion of a transceiver or modem (not depicted). The $V_{RAMP}$ digital-to-analog (D/A) circuit 808 converts the digital $V_{RAMP}$ signal 810, $V_{RAMP\_DIGITAL}$, to provide a version of the $V_{RAMP}$ signal in the analog domain. The version of the $V_{RAMP}$ signal may be either a differential or a single ended signal. The $V_{RAMP}$ digital-to-analog (D/A) circuit 808 provides the $V_{RAMP}$ signal to the first control input 34 of the parallel amplifier circuit 14PA.

The pseudo-envelope follower power management system 10PA includes a parallel amplifier output impedance compensation circuit 37B configured to generate a compensated $V_{RAMP}$ signal, $V_{RAMP\_C}$, for use by the parallel amplifier 35 in lieu of the $V_{RAMP}$ signal in order to reduce the high frequency ripple voltages generated in the parallel amplifier output voltage, $V_{PARA\_AMP}$, by the parallel amplifier 35 at the parallel amplifier output 32A due to the non-ideal output impedance characteristics of the parallel amplifier 35. For example, one of the non-ideal output impedance characteristics of the parallel amplifier 35 is that the parallel amplifier 35 has an output impedance response that is inductive and increases approximately +6 dB/octave near and around the switching frequency of the switch mode power supply converter 802. Thus, for example, the output impedance of the parallel amplifier 35 may be characterized as having a parallel amplifier inductance, $L_{CORR}$.

Returning to FIG. 5A, in addition, the parallel amplifier output impedance compensation circuit 37B includes a digital $V_{RAMP}$ pre-distortion filter circuit 812. The frequency response of the digital $V_{RAMP}$ pre-distortion filter circuit 812 may be configured to equalize the response of the pseudo-envelope follower power management system 10PA. As an example, the digital $V_{RAMP}$ pre-distortion filter circuit 812 may be configured to pre-distort the digital $V_{RAMP}$ signal 810, $V_{RAMP\_DIGITAL}$, in order to compensate for different combinations of the power inductor inductance of the power inductor 16 and the bypass capacitance, $C_{BYPASS}$, of the bypass capacitor 19, the transfer function of the parallel amplifier 35, the power amplifier associated inductance, $L_{PA}$, (not shown), and the power amplifier filter associated capacitance, $C_{PA}$, (not shown), and/or some combination thereof.

For example, the power amplifier associated inductance, $L_{PA}$, (not shown) includes any parasitic inductance or filter inductance added between the power amplifier supply voltage, $V_{CC}$, controlled by the parallel amplifier circuit 14PA, and the power amplifier collector 22A of a linear RF power amplifier 22. The power amplifier associated capacitance, $C_{PA}$, (not shown) includes any parasitic capacitance of a load line between the power amplifier supply voltage, $V_{CC}$, controlled by the parallel amplifier circuit 14PA and any added decoupling capacitance related to a power amplifier decoupling capacitor (not shown) coupled to the power amplifier collector 22A. The power amplifier associated inductance, $L_{PA}$, and the power amplifier associated capacitance, $C_{PA}$, (not shown) may be determined at the time of calibration of an electronic device that includes the pseudo-envelope follower power management system 10PA. The power amplifier associated inductance, $L_{PA}$, (not shown) in combination with the power amplifier associated capacitance, $C_{PA}$, (not shown) may form a power amplifier low pass filter (not shown) such that the frequency response of the combination of the power amplifier low pass filter and the pseudo-envelope follower power management system 10PA is not substantially flat through the operating frequency range of the linear RF power amplifier 22. Accordingly, the frequency response of the digital $V_{RAMP}$ pre-distortion filter circuit 812 may be configured to compensate the frequency response of the pseudo-envelope follower power management system 10PA such that the overall frequency response, as measured between the digital $V_{RAMP}$ signal 810, $V_{RAMP\_DIGITAL}$, and the power amplifier collector 22A, is substantially flat through the operating frequency range of the linear RF power amplifier 22.

As depicted in FIG. 5A, in some embodiments of the parallel amplifier output impedance compensation circuit 37B, the digital $V_{RAMP}$ pre-distortion filter circuit 812 is located in a digital baseband processing portion of a transceiver or modem of a communication device (not shown). The digital $V_{RAMP}$ pre-distortion filter circuit 812 is in communication with the parallel amplifier circuit 14PA, and provides a pre-filtered $V_{RAMP}$ signal 814, $V_{RAMP\_PRE-FILTERED}$. In some alternative embodiments of the pseudo-envelope follower power management system 10PA, (not shown), the digital $V_{RAMP}$ pre-distortion filter circuit 812 may be included in the parallel amplifier circuit 14PA.

Accordingly, unlike the parallel amplifier circuit 14B, depicted in FIG. 2B, the parallel amplifier circuit 14PA, depicted in FIG. 5A, includes a portion of a parallel amplifier output impedance compensation circuit 37B that is in communication with a digital $V_{RAMP}$ pre-distortion filter circuit 812. Whereas the embodiment of the parallel amplifier output impedance compensation circuit 37, depicted in FIG. 2B, is depicted as receiving an analog $V_{RAMP}$ signal, the digital $V_{RAMP}$ pre-distortion filter circuit 812 of the parallel amplifier output impedance compensation circuit 37B is configured to receive a digital $V_{RAMP}$ signal 810, $V_{RAMP\_DIGITAL}$, from the baseband portion of a transceiver or modem. The digital $V_{RAMP}$ pre-distortion filter circuit 812 provides a pre-filtered $V_{RAMP}$ signal 814, $V_{RAMP\_PRE-FILTERED}$. As will be discussed, the digital $V_{RAMP}$ pre-distortion filter circuit 812 filters the digital $V_{RAMP}$ signal 810, $V_{RAMP\_DIGITAL}$, to generate the pre-filtered $V_{RAMP}$ signal 814, $V_{RAMP\_PRE-FILTERED}$, to equalize the overall frequency response of the pseudo-envelope follower power management system 10PA.

Figure 6:
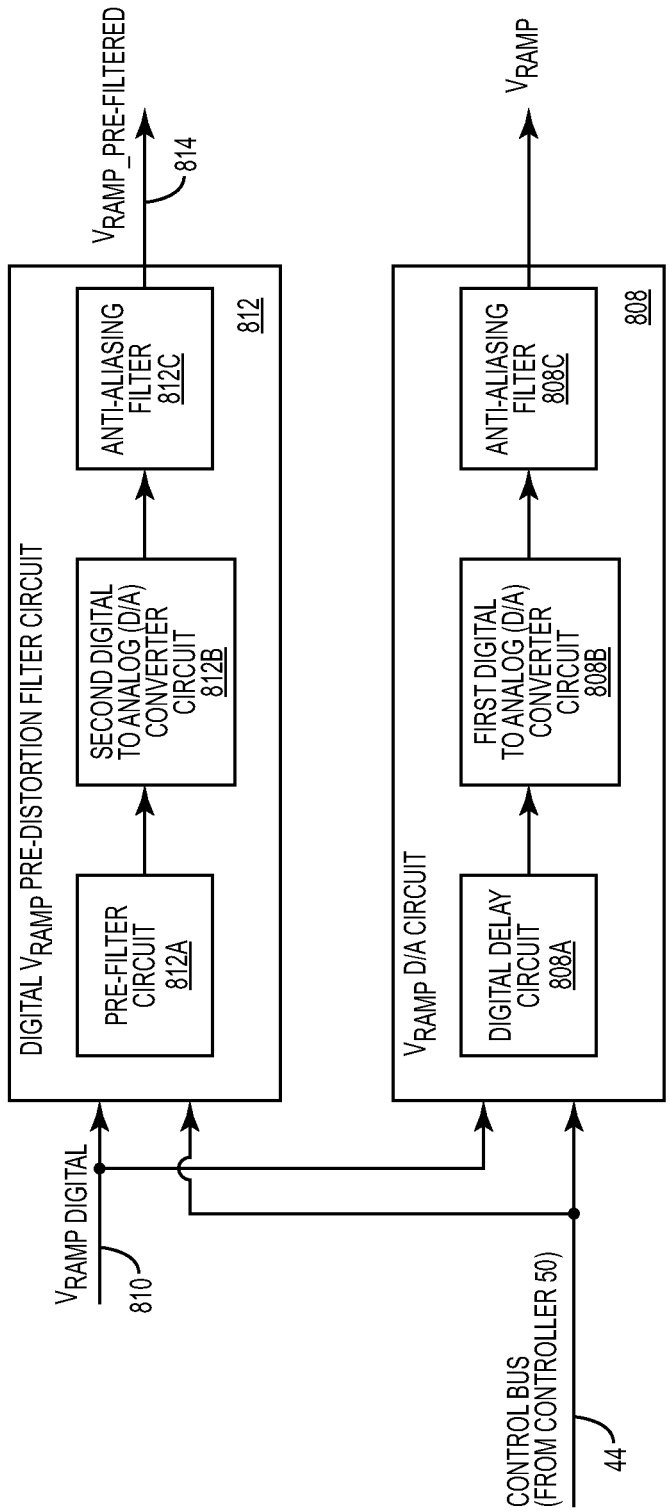
FIG. 6 depicts embodiments of the digital $V_{RAMP}$ pre-distortion filter and a $V_{RAMP}$ digital-to-analog (D/A) circuit.

FIG. 6 is described with continuing reference to FIG. 5A. FIG. 6 depicts an embodiment of $V_{RAMP}$ digital-to-analog (D/A) circuit 808 and the digital $V_{RAMP}$ pre-distortion filter circuit 812. As depicted in FIG. 6, the $V_{RAMP}$ digital-to-analog (D/A) circuit 808 may include a digital delay circuit 808A, a first digital-to-analog converter (D/A) circuit 808B, and an anti-aliasing filter 808C. The $V_{RAMP}$ digital-to-analog (D/A) circuit 808 may be coupled to the control bus 44 from controller 50 (not depicted), and configured to receive the digital $V_{RAMP}$ signal 810, $V_{RAMP\_DIGITAL}$. Via the control bus 44, the controller 50 may configure the operation of the digital delay circuit 808A, the first digital-to-analog (D/A) converter circuit 808B, and the anti-aliasing filter 808C. The $V_{RAMP}$ digital-to-analog (D/A) circuit 808 may be configured to generate the $V_{RAMP}$ signal in the analog domain. For example, in some embodiments, the $V_{RAMP}$ digital-to-analog (D/A) circuit 808 may generate a differential analog version of the $V_{RAMP}$ signal. The digital delay circuit 808A may be configured to receive the digital $V_{RAMP}$ signal 810, $V_{RAMP\_DIGITAL}$. The digital delay circuit 808A may be a programmable tapped delay line configured to delay the digital $V_{RAMP}$ signal 810, $V_{RAMP\_DIGITAL}$, such that the generated the $V_{RAMP}$ signal is temporally aligned with the pre-filtered $V_{RAMP}$ signal 814, $V_{RAMP\_PRE-FILTERED}$. The digital delay circuit provides the delayed version of the digital $V_{RAMP}$ signal 810, $V_{RAMP\_DIGITAL}$, to the first digital-to-analog (D/A) converter circuit 808B. The first digital-to-analog (D/A) converter circuit 808B converts the delayed version of the digital $V_{RAMP}$ signal 810, $V_{RAMP\_DIGITAL}$, into an analog representation of the $V_{RAMP}$ signal, which is anti-aliasing filtered by the anti-aliasing filter 808C to generate the $V_{RAMP}$ signal.

The digital $V_{RAMP}$ pre-distortion filter circuit 812 may include a pre-filter circuit 812A, a second digital-to-analog converter (D/A) circuit 812B, and an anti-aliasing filter 812C. The pre-filter circuit 812A may be configured to be either an infinite impulse response (IIR) filter or a finite impulse response (FIR) filter configured to receive the digital $V_{RAMP}$ signal 810, $V_{RAMP\_DIGITAL}$. The pre-filter circuit 812A may be configured by the controller 50 to control the frequency response of the pre-filter circuit 812A. The pre-filter circuit 812A may include one or more coefficients that may be configured by the controller 50 to shape the frequency response of the pre-filter circuit 812A.

As an example, in the case where the pre-filter circuit 812A is configured to be an infinite impulse response (IIR) filter, the pre-filter circuit 812A may include feed forward filter coefficients and feedback filter coefficients. Likewise, the pre-filter circuit 812A may be configured to be a multiple order filter. For example, in some embodiments of the digital $V_{RAMP}$ pre-distortion filter circuit 812, the pre-filter circuit 812A may be configured to be a first order filter. In alternative embodiments of the digital $V_{RAMP}$ pre-distortion filter circuit 812, the pre-filter circuit 812A may be a filter having two or more orders. As a result, the digital $V_{RAMP}$ pre-distortion filter circuit 812 may permit the controller to have additional degrees of control of the pre-distortion of the digital $V_{RAMP}$ signal 810, $V_{RAMP\_DIGITAL}$, which is used to provide a pre-distorted $V_{RAMP}$ signal. As an example, the controller 50 may configure the feed forward coefficients and the feedback coefficients of the digital $V_{RAMP}$ pre-distortion filter circuit 812 to provide frequency peaking to compensate for the low pass filter effect of the combination of the power amplifier associated inductance, $L_{PA}$, (not shown), and the power amplifier filter associated capacitance, $C_{PA}$, (not shown), as described above.

As an alternative case, in some embodiments the pre-filter circuit 812A may be a finite impulse response (FIR) filter having multiple weighting coefficients. The controller 50 may configure each of the weighting coefficients to configure the frequency response of the digital $V_{RAMP}$ pre-distortion filter circuit 812 to pre-distort the digital $V_{RAMP}$ signal, $V_{RAMP\_DIGITAL}$, to also equalize the overall frequency response of the pseudo-envelope follower power management system 10PA. In addition, the digital $V_{RAMP}$ pre-distortion filter circuit 812 may be further configured to compensate for the power amplifier associated inductance, $L_{PA}$, (not shown), and the power amplifier filter associated capacitance, $C_{PA}$, (not shown), such that the overall frequency response, as measured between the digital $V_{RAMP}$ signal 810, $V_{RAMP\_DIGITAL}$, and the power amplifier collector 22A, is substantially flat through the operating frequency range of the linear RF power amplifier 22.

The output of the pre-filter circuit 812A is digital to analog converted by the second digital-to-analog converter (D/A) circuit 812B, where the output of the second digital-to-analog converter (D/A) circuit 812B is anti-alias filtered by the anti-aliasing filter 812C to provide the pre-filtered $V_{RAMP}$ signal 814, $V_{RAMP\_PRE-FILTERED}$. The frequency response of the pre-filter circuit 812A may be configured to equalize the overall transfer function response between the digital $V_{RAMP}$ signal 810, $V_{RAMP\_DIGITAL}$, and the power amplifier collector 22A. As an example, the amount or shape of the equalization provided by the frequency response of the pre-filter circuit 812A, and thus the digital $V_{RAMP}$ pre-distortion filter circuit 812, may depend upon the bypass capacitance, $C_{BYPASS}$, of the bypass capacitor 19, the power amplifier associated inductance, $L_{PA}$, (not shown), the power amplifier associated capacitance, $C_{PA}$, (not shown), the frequency response of the parallel amplifier 35, and/or a combination thereof.

In addition, the controller 50 may adjust the frequency response of the pre-filter circuit 812A by modifying the one or more coefficients of the pre-filter circuit 812A to equalize the relative transfer function response between the power amplifier supply voltage $V_{CC}$, and the digital $V_{RAMP}$ signal 810, $V_{RAMP\_DIGITAL}$. The controller 50 adjusts the frequency response of the pre-filter circuit 812A such that the frequency response of the overall transfer function response between the digital $V_{RAMP}$ signal 810, $V_{RAMP\_DIGITAL}$, and the power amplifier collector 22A is substantially flattened through a desired frequency range. Illustratively, in some embodiments, the controller 50 may configure the equalization or frequency response of the pre-filter circuit 812A such that the frequency response of the overall transfer function response between the digital $V_{RAMP}$ signal 810, $V_{RAMP\_DIGITAL}$, and the power amplifier collector 22A is substantially flattened out to around 20 MHz.

As an example, where the pre-filter circuit 812A is configured as an IIR filter, the pre-filter circuit 812A is configured to operate at a clock rate of about 312 MHz. Illustratively, for the case where the bypass capacitance, $C_{BYPASS}$, of the bypass capacitor 19 is approximately 2 nF, the controller 50 may configure the frequency response of the pre-filter circuit 812A to have a pole at approximately 14.5 MHz and a zero at approximately 20 MHz.

In addition, in some embodiments of the digital $V_{RAMP}$ pre-distortion filter circuit 812, the controller 50 may configure the equalization or frequency response provided by the pre-filter circuit 812A as a function of the operational bandwidth of the linear RF power amplifier 22 need to provide the wide-band modulation corresponding to a specific LTE band number. As an example, in a case where the LTE band has a 15 MHz bandwidth, the controller 50 may configure the digital $V_{RAMP}$ pre-distortion filter circuit 812 to provide additional $V_{RAMP}$ pre-distortion such that the radio frequency signal generated by the linear RF power amplifier falls within the spectrum mask requirements for an LTE 15 MHz test case.

Returning to FIG. 5A, the parallel amplifier output impedance compensation circuit 37B may further include an estimated switching voltage output selection switch 816, $S_1$, having a first input 816A configured to receive the estimated switching voltage output 38B, $V_{SW\_EST}$, a second input 816B configured to receive the delayed estimated switching voltage output 38D, $V_{SW\_EST\_DELAY}$, and an estimated switching voltage output selection switch output 816C. The controller 50 may configure the estimated switching voltage output selection switch 816, $S_1$, to provide either the estimated switching voltage output 38B, $V_{SW\_EST}$, or the delayed estimated switching voltage output 38D, $V_{SW\_EST\_DELAY}$, as an estimated switching voltage input signal 820, $V_{SW\_I}$, at the estimated switching voltage output selection switch output 816C.

The parallel amplifier output impedance compensation circuit 37B further includes a first subtracting circuit 822, a $Z_{OUT}$ compensation high pass filter 824, a $G_{CORR}$ scalar circuit 826, a second subtracting circuit 828, a tune circuit 830, and a summing circuit 832. The first subtracting circuit 822 includes a positive terminal configured to receive the $V_{RAMP}$ signal provided to the first control input 34 of the parallel amplifier circuit 14PA and a negative terminal configured to receive the estimated switching voltage input signal 820, $V_{SW\_I}$. The first subtracting circuit 822 subtracts the estimated switching voltage input signal 820, $V_{SW\_I}$, from the $V_{RAMP}$ signal to generate an expected difference signal 834, which is provided to the $Z_{OUT}$ compensation high pass filter 824. The expected difference signal 834 represents the difference between the target voltage level of the power amplifier supply voltage $V_{CC}$, to be generated at the power amplifier supply output 28 in response to the $V_{RAMP}$ signal and the switching voltage, $V_{SW}$, to be provided at the switching voltage output 26 of the switch mode power supply converter 802 at the time when the parallel amplifier 35 generates the parallel amplifier output voltage, $V_{PARA\_AMP}$, at the parallel amplifier output 32A.

A frequency response of the $Z_{OUT}$ compensation high pass filter 824 may be configurable. As an example, the $Z_{OUT}$ compensation high pass filter 824 may include programmable time constants. The $Z_{OUT}$ compensation high pass filter 824 may include resistor arrays or capacitance arrays that may be configurable by the controller 50 to set the value of programmable time constants. For example, the resistor arrays may be binary weighted resistor arrays similar to the binary weighted resistor arrays previously described. The capacitor arrays may be binary weighted capacitor arrays similar to the binary weighted capacitor arrays previously described. The controller 50 may configure the programmable time constants of the $Z_{OUT}$ compensation high pass filter 824 to obtain a desired high pass filter response. In addition, the controller 50 may configure the programmable time constants of the $Z_{OUT}$ compensation high pass filter 824 to obtain a desired high pass filter response as a function of the operational bandwidth or the wide-bandwidth modulation associated with the LTE band number for which the linear RF power amplifier 22 is configured to operate.

Illustratively, in some embodiments, the $Z_{OUT}$ compensation high pass filter 824 may have a programmable time constant set to 40 nanoseconds. For example, the programmable time constant may be obtained by the controller 50 configuring the resistance of a programmable resistor to be substantially equal to 4K ohms and the capacitance of a programmable capacitor to be substantially equal to 10 pF. In this scenario, the high pass cutoff frequency, $f_{HPC}$, of the example $Z_{OUT}$ compensation high pass filter 824 may be approximately equal to 4 MHz. In some embodiments, the $Z_{OUT}$ compensation high pass filter 824 may be a multiple-order high pass filter having multiple programmable time constants. In the case where the $Z_{OUT}$ compensation high pass filter 824 is a multiple-order high pass filter, the controller 50 may be configured to set multiple programmable time constants to obtain a desired high pass frequency response from the $Z_{OUT}$ compensation high pass filter 824. As an example, the $Z_{OUT}$ compensation high pass filter 824 may be a second order high pass filter having a first time constant and a second time constant corresponding to a first high pass cutoff frequency, $f_{HPC1}$, and a second high pass cutoff frequency, $f_{HPC2}$. In this case, the controller 50 may configure the first time constant and the second time constant of the $Z_{OUT}$ compensation high pass filter 824 to obtain a desired high pass frequency response. In other embodiments, the $Z_{OUT}$ compensation high pass filter 824 may be configured as an active filter.

When the controller 50 configures the estimated switching voltage output selection switch 816, $S_1$, to provide the delayed estimated switching voltage output 38D, $V_{SW\_EST\_DELAY}$, as the estimated switching voltage input signal 820, $V_{SW\_I}$, the controller 50 may configure the programmable delay circuitry 806 to provide a delay substantially equal to an alignment period, $T_{ALIGNMENT}$, in order to time align the indication of the switching voltage, $V_{SW}$, represented by the estimated switching voltage input signal 820, $V_{SW\_I}$, with the $V_{RAMP}$ signal. The expected difference signal 834 is provided to the $Z_{OUT}$ compensation high pass filter 824. The $Z_{OUT}$ compensation high pass filter 824 high pass filters the expected difference signal 834 to generate an estimated high frequency ripple signal 836. The high pass filtering of the $Z_{OUT}$ compensation high pass filter 824 substantially extracts only the high frequency content of the expected difference signal 834, where the high frequency content of the expected difference signal 834 represents a scaled derivative of the ripple current in the inductor current, $I_{SW\_OUT}$, of the power inductor 16 generated by the switch mode power supply converter 802 due to the changes in the switching voltage, $V_{SW}$, associated with the estimated switching voltage input signal 820, $V_{SW\_I}$. Thus, the estimated high frequency ripple signal 836 represents an estimated high frequency ripple current at the power amplifier supply output 28 that may cause the parallel amplifier 35 to generate high frequency ripple voltages in the parallel amplifier output voltage, $V_{PARA\_AMP}$, at the parallel amplifier output 32A. The delay period provided by the programmable delay circuitry 806 may be configured by the controller 50 to temporally align the delayed estimated switching voltage output 38D, $V_{SW\_EST\_DELAY}$, with the $V_{RAMP}$ signal to improve the accuracy of the estimated high frequency ripple signal 836.

In contrast, the controller 50 may configure the estimated switching voltage output selection switch 816, $S_1$, to provide the estimated switching voltage output 38B, $V_{SW\_EST}$, as the estimated switching voltage input signal 820, $V_{SW\_I}$, to the $Z_{OUT}$ compensation high pass filter 824. In this case, the $Z_{OUT}$ compensation high pass filter 824 high pass filters the expected difference signal 834 to generate the estimated high frequency ripple signal 836. The estimated high frequency ripple signal 836 substantially corresponds to a scaled derivative of a switcher ripple current in the inductor current, $I_{SW\_OUT}$, of the power inductor 16 based on the estimated switching voltage output 38B, $V_{SW\_EST}$. However, because the generation of the estimated switching voltage output 38B, $V_{SW\_EST}$, cannot be temporally aligned by adjusting a delay period provided by the programmable delay circuitry 806, the controller 50 may not configure the programmable delay circuitry 806 to minimize the peak-to-peak ripple voltages on the power amplifier supply voltage, $V_{CC}$, by improving the temporal alignment of the estimated switching voltage output 38B, $V_{SW\_EST}$, with respect to the $V_{RAMP}$ signal.

As previously discussed, the $Z_{OUT}$ compensation high pass filter 824 high pass filters the expected difference signal 834 generated based on the estimated switching voltage output 38B, $V_{SW\_EST}$, to generate the estimated high frequency ripple signal 836. The pass band of the $Z_{OUT}$ compensation high pass filter 824 extract only the high frequency content of the estimated switching voltage input signal 820, $V_{SW\_I}$, where the expected difference signal 834 represents the expected difference between the switching voltage, $V_{SW}$, and the target voltage level of the power amplifier supply voltage, $V_{CC}$, based on the $V_{RAMP}$ signal.

Because the $Z_{OUT}$ compensation high pass filter 824 high pass filters the expected difference signal 834, the direct current content of the expected difference signal 834 is not present in the estimated high frequency ripple signal 836. The $G_{CORR}$ scalar circuit 826 scales the estimated high frequency ripple signal 836 based on a scaling factor, $G_{CORR}$, to generate a high frequency ripple compensation signal 838.

The high frequency ripple compensation signal 838 is added to the pre-filtered $V_{RAMP}$ signal 814, $V_{RAMP\_PRE-FILTERED}$, by the summing circuit 832 to generate the compensated $V_{RAMP}$ signal, $V_{RAMP\_C}$. The high frequency ripple compensation signal 838 is added to the pre-filtered $V_{RAMP}$ signal 814, $V_{RAMP\_PRE}$-FILTERED, to compensate for the non-ideal output impedance of the parallel amplifier 35. The compensated $V_{RAMP}$ signal, $V_{RAMP\_C}$, is provided as an input to the parallel amplifier 35. The parallel amplifier generates the parallel amplifier output voltage, $V_{PARA\_AMP}$, based on the difference between the compensated $V_{RAMP}$ signal, $V_{RAMP\_C}$, and the power amplifier supply voltage, $V_{CC}$.

Generation of the scaling factor, $G_{CORR}$, will now be discussed. The second subtracting circuit 828 is configured to subtract the power amplifier supply voltage, $V_{CC}$, from the $V_{RAMP}$ signal to provide a $G_{CORR}$ feedback signal 840 that is received by the tune circuit 830. In some embodiments of the parallel amplifier output impedance compensation circuit 37B, the tune circuit 830 may be configured to dynamically provide the scaling factor, $G_{CORR}$, to the $G_{CORR}$ scalar circuit 826 based on the $G_{CORR}$ feedback signal 840. As an example, the controller 50 may configure the tune circuit 830 to provide a different value of the scaling factor, $G_{CORR}$, on a block-by-block transmission basis dependent upon the operational mode of the linear RF power amplifier 22. For example, the tune circuit 830 may be configured by the controller 50 during a calibration procedure to develop at least one $G_{CORR}$ curve. In other embodiments, the tune circuit 830 may have multiple $G_{CORR}$ curves that may be used to provide a scaling factor, $G_{CORR}$, based on the $G_{CORR}$ feedback signal 840 and the operational mode of the linear RF power amplifier 22. As an example, the controller 50 may configure the tune circuit 830 to use a particular one of the $G_{CORR}$ curves depending on the configuration and/or operational mode of the pseudo-envelope follower power management system 10PA, the parallel amplifier 35, or a combination thereof. Each $G_{CORR}$ curve may include several coefficients or values for the scaling factor, $G_{CORR}$, that correspond to the magnitude of the $G_{CORR}$ feedback signal 840. In some embodiments, the controller 50 may select a $G_{CORR}$ curve to be used on a block-by-block transmission basis depending on the operational mode of the linear RF power amplifier 22.

For example, the controller 50 may select a first $G_{CORR}$ curve to be used by the tune circuit 830 when the linear RF power amplifier 22 is in a first operational mode. The controller 50 may select a second $G_{CORR}$ curve to be used by the tune circuit 830 when the linear RF power amplifier 22 is in a second operational mode. In still other embodiments of the parallel amplifier output impedance compensation circuit 37B, the tune circuit 830 may only have one $G_{CORR}$ curve to be used by the tune circuit 830 to provide the scaling factor, $G_{CORR}$, to the $G_{CORR}$ scalar circuit 826 based on the $G_{CORR}$ feedback signal 840.

As an example, in some embodiments of the parallel amplifier output impedance compensation circuit 37B, the scaling factor, $G_{CORR}$, is tuned by the tune circuit 830 based on a built-in calibration sequence that occurs at power start-up. As an example, the controller 50 may configure the switch mode power supply converter 802 to operate with a switching frequency that is a fixed frequency to create a switcher ripple current in the inductor current, $I_{SW\_OUT}$, of the power inductor 16 at a frequency of concern for the pseudo-envelope follower power management system 10PA. In those cases where the switch mode power supply converter 802 is configured as a multi-level charge pump buck converter, the controller 50 may configure the switch mode power supply converter 802 to operate in a "bang-bang mode" of operation. When operating in the "bang-bang mode" of operation, the controller 50 configures the switcher control circuit 804 such that the switch mode power supply converter 802 operates in a fashion similar to a buck converter. Thus, when operating in the "bang-bang mode" of operation, the switch mode power supply converter 802 switcher control circuit 804 does not permit the switch mode power supply converter 802 to provide a boosted output voltage at the switching voltage output 26.

As a non-limiting example, to tune the scaling factor, $G_{CORR}$, the controller 50 may configure the switch mode power supply converter 802 to operate at a calibration frequency with a fixed duty cycle in order to create a switcher ripple current at the calibration frequency. For example, the controller 50 may set the calibration frequency to 10 MHz. The $V_{RAMP}$ signal is set to a constant value in order to create a constant output value for the power amplifier supply voltage, $V_{CC}$, at the power amplifier supply output 28. As discussed previously, the controller 50 may configure the switch mode power supply converter 802 to operate in a "bang-bang mode" of operation. The direct current voltage present at the power amplifier supply voltage, $V_{CC}$, will be primarily set by the duty cycle of the switch mode power supply converter 802. The DC voltage may be mainly set by the duty cycle on the switching voltage output 26 of the switch mode power supply converter 802. The tune circuit 830 determines the peak-to-peak ripple voltage on the power amplifier supply voltage, $V_{CC}$, based on the $G_{CORR}$ feedback signal 840. Based on the magnitude of the peak-to-peak ripple voltage on the power amplifier supply voltage, $V_{CC}$, the tune circuit 830 adjusts the value of the scaling factor, $G_{CORR}$, until the peak-to-peak ripple voltage on the $G_{CORR}$ feedback signal 840 is minimized. In some embodiments, to adjust the value of the scaling factor, $G_{CORR}$, based on the $G_{CORR}$ feedback signal 840, the controller 50 may determine the degree of adjustment to provide based on the estimated power inductor inductance parameter, $L_{EST}$, the estimated bypass capacitor capacitance parameter, $C_{BYPASS\_EST}$, and the estimated power amplifier transconductance parameter, $K_{I\_OUT\_EST}$, as previously described. Based on the scaling factor, $G_{CORR}$, that provides the minimum the peak-peak ripple voltage on the power amplifier supply voltage, $V_{CC}$, the tune circuit 830 selects the scaling factor, $G_{CORR}$, to be provided to the $G_{CORR}$ scalar circuit 826. In some embodiments, the controller 50 may configure the switch mode power supply converter 802 to operate at various calibration frequencies to develop one or more $G_{CORR}$ curves, where each $G_{CORR}$ curve corresponds to an operational mode of the linear RF power amplifier 22.

The determination of the scaling factor, $G_{CORR}$, and/or the development of the $G_{CORR}$ curves is substantially orthogonal to the temporal alignment of the delayed estimated switching voltage output 38D, $V_{SW\_EST\_DELAY}$. Thus, following calibration of the tune circuit 830 to provide the scaling factor, $G_{CORR}$, appropriate for the operational mode of the linear RF power amplifier 22, the controller 50 may be further configure to adjust the alignment period, $T_{ALIGNMENT}$, associated with the programmable delay circuitry 806 to temporally align the delayed estimated switching voltage output 38D, $V_{SW\_EST\_DELAY}$, in order to further minimize the peak-to-peak ripple voltage on the power amplifier supply voltage, $V_{CC}$. Thus, after the controller 50 completes the calibration of the tune circuit 830 to minimize the peak-to-peak ripple voltage on the power amplifier supply voltage, $V_{CC}$, the controller 50 may configure the programmable delay circuitry 806 to iteratively adjust the alignment period, $T_{ALIGNMENT}$, provided by the programmable delay circuitry 806 to further minimize the peak-to-peak ripple voltage on the power amplifier supply voltage, $V_{CC}$. In some embodiments, the controller 50 may determine the alignment period, to be provided by the programmable delay circuitry 806, for different operational modes of the linear RF power amplifier 22.

Figure 5B:
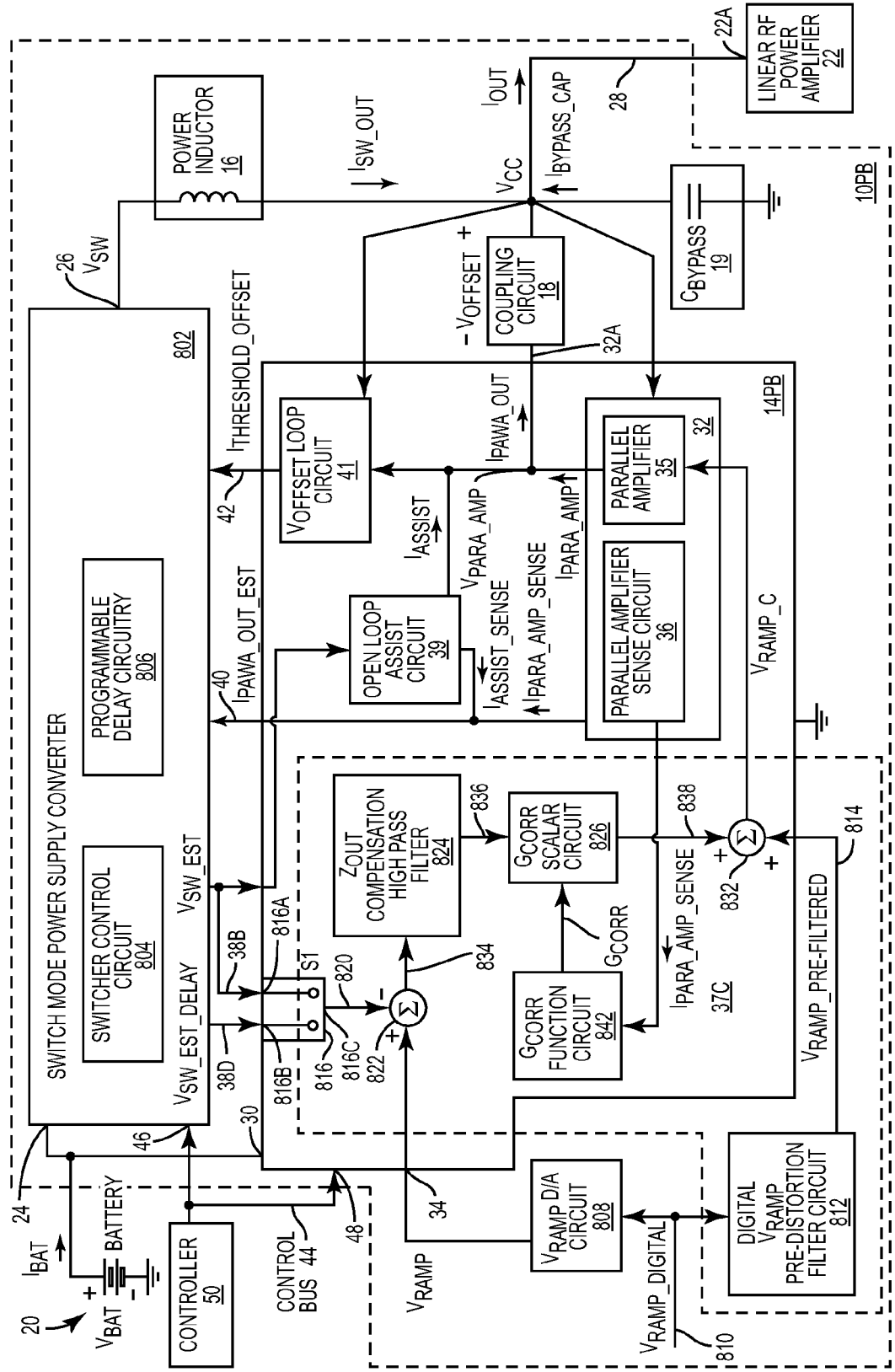
FIG. 5B depicts an alternative embodiment of a parallel amplifier output impedance compensation circuit.

FIG. 5B depicts another example embodiment of a pseudo-envelope follower power management system 10PB that is similar in form and function to the pseudo-envelope follower power management system 10PA, depicted in FIG. 5A. However, unlike the pseudo-envelope follower power management system 10PA, the pseudo-envelope follower power management system 10PB includes a parallel amplifier output impedance compensation circuit 37C that is divided between a parallel amplifier circuit 14PB and the digital baseband processing portion of a transceiver or modem. The example embodiment of the parallel amplifier output impedance compensation circuit 37C is similar in form and function to the parallel amplifier output impedance compensation circuit 37B, depicted in FIG. 5A, except the scaling factor, $G_{CORR}$, is provided by a $G_{CORR}$ function circuit 842 instead of the tune circuit 830, depicted in FIG. 5A.

The $G_{CORR}$ function circuit 842 is configured to receive the scaled parallel amplifier output current estimate, $I_{PARA\_AMP\_SENSE}$, generated by the parallel amplifier sense circuit 36 of the parallel amplifier circuitry 32. The value of the scaling factor, $G_{CORR}$, may be based on a $G_{CORR}$ scaling function, $G_{CORR}(I_{PARA\_AMP\_SENSE})$, where the $G_{CORR}$ scaling function, $G_{CORR}(I_{PARA\_AMP\_SENSE})$, characterizes values of the scaling factor, $G_{CORR}$, as a function of the scaled parallel amplifier output current estimate, $I_{PARA\_AMP\_SENSE}$. In some embodiments, the $G_{CORR}$ scaling function, $G_{CORR}(I_{PARA\_AMP\_SENSE})$, may be a polynomial function. In other embodiments, the $G_{CORR}$ scaling function, $G_{CORR}(I_{PARA\_AMP\_SENSE})$, may be a linear function. For example, the $G_{CORR}$ scaling function, $G_{CORR}(I_{PARA\_AMP\_SENSE})$, may have $G_{CORR}$ scaling function coefficients that may be configurable by the controller 50 via the control bus 44. As a non-limiting example, equation (8) provides an example of the $G_{CORR}$ scaling function, $G_{CORR}(I_{PARA\_AMP\_SENSE})$, having two $G_{CORR}$ scaling function coefficients. For example, the $G_{CORR}$ scaling function coefficients may include a first $G_{CORR}$ scaling function coefficient, $G_{CORR}(0)$, and a second $G_{CORR}$ scaling function coefficient, $G_{CORR}(1)$, where the $G_{CORR}$ scaling function, $G_{CORR}(I_{PARA\_AMP\_SENSE})$, is a linear function characterized by equation (8) as follows:

$$G_{CORR}(I_{PARA\_AMP\_SENSE}) = G_{CORR}(0) + G_{CORR}(1) \times I_{PARA\_AMP\_SENSE} \quad (8)$$

The first $G_{CORR}$ scaling function coefficient, $G_{CORR}(0)$, may represent a scaling factor that is independent of the scaled parallel amplifier output current estimate, $I_{PARA\_AMP\_SENSE}$, and the second $G_{CORR}$ scaling function coefficient, $G_{CORR}(1)$, represents a first order coefficient of the $G_{CORR}$ scaling function, $G_{CORR}(I_{PARA\_AMP\_SENSE})$, that captures the dependency of the scaling factor, $G_{CORR}$, on the change of value of the parallel amplifier inductance, $L_{CORR}$, as a function of the parallel amplifier output current, $I_{PARA\_AMP}$. For example, in some embodiments, the second $G_{CORR}$ scaling function coefficient, $G_{CORR}(1)$ may be based on the parallel amplifier inductance estimate parameter, $L_{CORR\_EST}$, where the parallel amplifier inductance estimate parameter, $L_{CORR\_EST}$, is an estimated inductance of the parallel amplifier 35 between the frequencies 10 MHz and 30 MHz.

In addition, because the parallel amplifier output current, $I_{PARA\_AMP}$, may change depending upon the operational mode of the linear RF power amplifier 22, the values of the first $G_{CORR}$ scaling function coefficient, $G_{CORR}(0)$, and the value of the second $G_{CORR}$ scaling function coefficient, $G_{CORR}(1)$, may be calibrated for each mode of operation of the linear RF power amplifier 22. As an example, the $G_{CORR}$ function circuit 842 may include a first set of $G_{CORR}$ scaling function coefficients that correspond to a first LTE band number and a second set of $G_{CORR}$ scaling function coefficients that correspond to a second LTE band number. In other words, the controller 50 may configure the $G_{CORR}$ function circuit 842 to adaptively determine the $G_{CORR}$ scaling function coefficients to be used to characterize the $G_{CORR}$ scaling function, $G_{CORR}(I_{PARA\_AMP\_SENSE})$, based upon the operational mode of the pseudo-envelope follower power management system 10PB and/or the band of operation at which the linear RF power amplifier 22 is transmitting.

In some alternative embodiments, the $G_{CORR}$ function circuit 842 may be configured by the controller 50 to provide a fixed value of the scaling factor, $G_{CORR}$, as depicted in equation (9) as follows:

$$G_{CORR} = \frac{L_{CORR\_EST}}{L_{EST}} \quad (9)$$

where the estimated power inductor inductance parameter, $L_{EST}$, represents the measured or estimated inductance of the power inductor 16 between a specific range of frequencies and the parallel amplifier inductance estimate parameter, $L_{CORR\_EST}$, estimates the inductance of the parallel amplifier 35 between a specific range of frequencies, as discussed above.

Figure 5C:
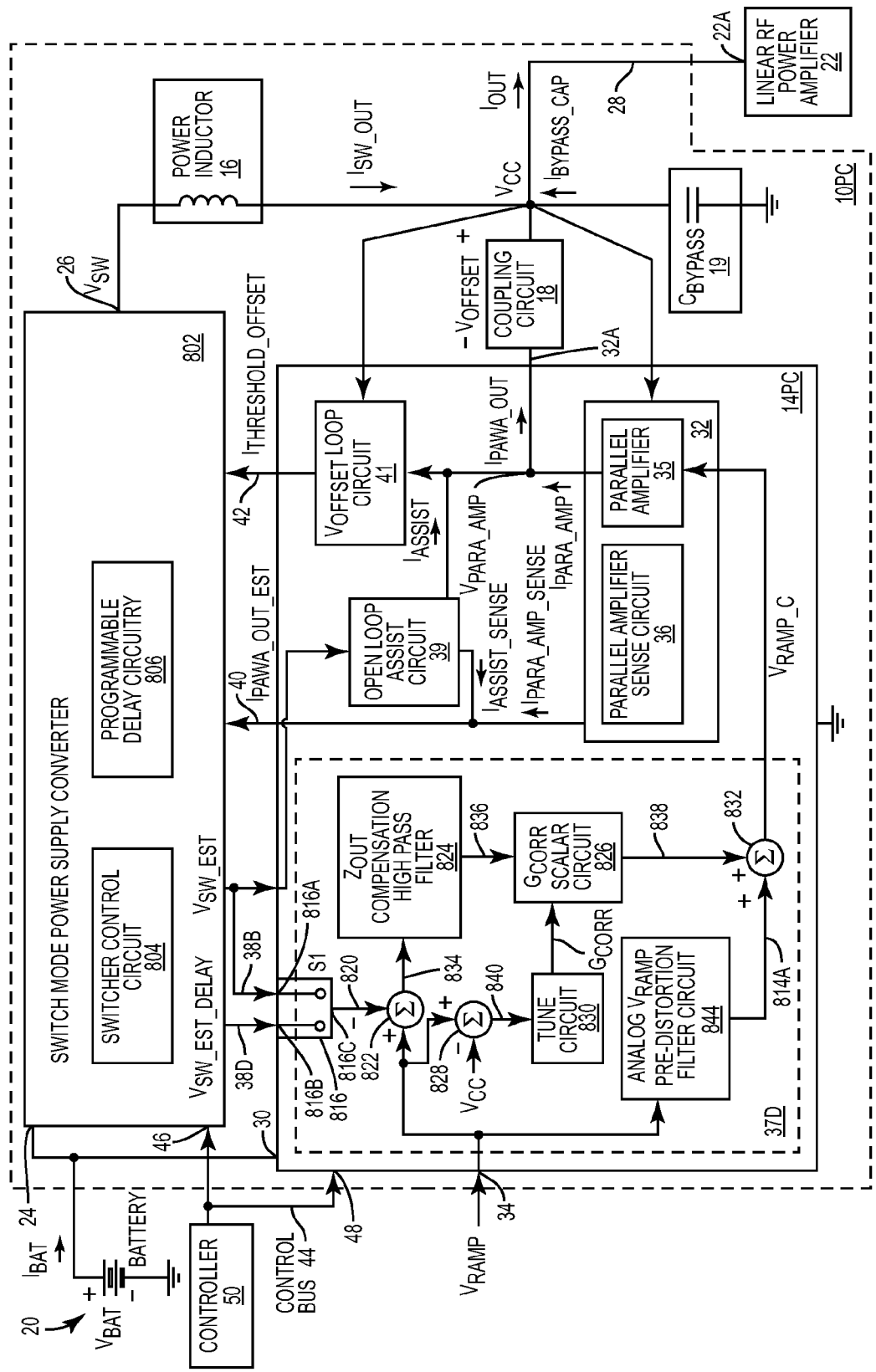
FIG. 5C depicts another embodiment of a parallel amplifier output impedance compensation circuit including an analog $V_{RAMP}$ pre-distortion filter circuit.

FIG. 5C depicts an example embodiment of a pseudo-envelope follower power management system 10PC that is similar in form and function to the pseudo-envelope follower power management system 10PA, depicted in FIG. 5A. However, unlike the pseudo-envelope follower power management system 10PA, depicted in FIG. 5A, the pseudo-envelope follower power management system 10PC includes a parallel amplifier circuit 14PC that includes a parallel amplifier output impedance compensation circuit 37D. Unlike the parallel amplifier output impedance compensation circuit 37B of the pseudo-envelope follower power management system 10PA, depicted in FIG. 5A, the parallel amplifier output impedance compensation circuit 37D, depicted in FIG. 5C, includes an analog $V_{RAMP}$ pre-distortion filter circuit 844 configured to receive the $V_{RAMP}$ signal in the analog domain. Similar to the digital $V_{RAMP}$ pre-distortion filter circuit 812, depicted in FIG. 5A, the analog $V_{RAMP}$ pre-distortion filter circuit 844 pre-distorts the $V_{RAMP}$ signal in the frequency domain to generate an analog pre-filtered $V_{RAMP}$ signal 814A, $V_{RAMP\_ANALOG\_PRE-FILTERED}$. The controller 50 may configure the analog $V_{RAMP}$ pre-distortion filter circuit 844 to filter the $V_{RAMP}$ signal such that the analog pre-filtered $V_{RAMP}$ signal 814A, $V_{RAMP\_ANALOG\_PRE-FILTERED}$, may be used to equalize the response of the pseudo-envelope follower power management system 10PC and compensate for the bypass capacitance, $C_{BYPASS}$, of the bypass capacitor 19, the power amplifier associated inductance, $L_{PA}$, (not shown), the power amplifier filter associated capacitance, $C_{PA}$, (not shown), and the frequency response of the transfer function of the parallel amplifier 35.

As a non-limiting example, the analog $V_{RAMP}$ pre-distortion filter circuit 844 may include programmable time constants that may be configured by the controller 50. The controller 50 may configure the frequency response of the analog $V_{RAMP}$ pre-distortion filter circuit 844 to equalize the response of the pseudo-envelope follower power management system 10PA by adjusting the value of the programmable time constants.

In some embodiments of the parallel amplifier circuit 14PC, the analog $V_{RAMP}$ pre-distortion filter circuit 844 may be configured to compensate for the transfer function of the parallel amplifier 35 in conjunction with the power amplifier filter associated capacitance, $C_{PA}$, the power amplifier associated inductance, $L_{PA}$, (not shown), and the bypass capacitance, $C_{BYPASS}$, of the bypass capacitor 19. For example, the controller 50 may configure the analog $V_{RAMP}$ pre-distortion filter circuit 844 to provide frequency peaking to compensate for the low pass filter response due to the combination of the power amplifier associated inductance, $L_{PA}$, (not shown) and the power amplifier associated capacitance, $C_{PA}$, (not shown) associated with the linear RF power amplifier 22. In some embodiments, the Laplace transfer function of the analog $V_{RAMP}$ pre-distortion filter circuit 844 may be represented by equation (10), as follows:

$$H(s)_{Analog\ Pre-Distortion\ Filter\ Circuit} = \frac{(1 + \tau_{ZERO\_PRE}s)}{(1 + \tau_{POLE\_PRE}s)} \quad (10)$$

where, $\tau_{ZERO\_PRE}$ is a first time constant associated with a real-zero in the Laplace transfer function of the analog $V_{RAMP}$ pre-distortion filter circuit 844, and $\tau_{POLE\_PRE}$ is a second time constant associated with real-pole in the Laplace transfer function of the analog $V_{RAMP}$ pre-distortion filter circuit 844. The first time constant, $\tau_{ZERO\_PRE}$, and the second time constant, $\tau_{POLE\_PRE}$, may be configured by the controller 50 to pre-distort the $V_{RAMP}$ signal prior to adding the high frequency ripple compensation signal 838 to compensate for the non-ideal parallel amplifier output impedance of the parallel amplifier 35. The controller 50 $\tau_{POLE\_PRE}$, of the analog $V_{RAMP}$ pre-distortion filter circuit 844 based on the RF modulation bandwidth of the linear RF power amplifier 22 associated with a wide-bandwidth modulation of a mode of operation of a communication device that includes the pseudo-envelope follower power management system 10PC. As an example, the controller 50 may configure the first time constant, $\tau_{ZERO\_PRE}$, and second time constant, $\tau_{POLE\_PRE}$, to provide peaking of the $V_{RAMP}$ signal in order to flatten the overall modulation frequency response of the pseudo-envelope follower power management system 10PC based on the wide-bandwidth modulation of a mode of operation of a communication device.

As another example, the controller 50 may configure the analog $V_{RAMP}$ pre-distortion filter circuit 844 to pre-distort the frequency response of the $V_{RAMP}$ signal such that the overall transfer function between the first control input 34, which receives the $V_{RAMP}$ signal, and the power amplifier collector 22A of the linear RF power amplifier 22 is substantially flat through the operating frequency range of the linear RF power amplifier 22. As a non-limiting example, the controller 50 may configure the first time constant, $\tau_{ZERO\_PRE}$, to place a real-zero at around 11 MHz and the second time constant, $\tau_{POLE\_PRE}$, to locate a real-pole at around 20 MHz. Accordingly, the analog $V_{RAMP}$ pre-distortion filter circuit 844 may be configured to provide a peaking response in order to compensate for the frequency response of the pseudo-envelope follower power management system 10PC and the low pass filter effects of the combination of the power amplifier associated inductance, $L_{PA}$, (not shown), and the power amplifier filter associated capacitance, $C_{PA}$, (not shown).

Otherwise, similar to the parallel amplifier output impedance compensation circuit 37B, depicted in FIG. 5A, the parallel amplifier output impedance compensation circuit 37D, depicted in FIG. 5C, may include an estimated switching voltage output selection switch 816, $S_1$, having a first input 816A configured to receive the estimated switching voltage output 38B, $V_{SW\_EST}$, a second input 816B configured to receive the delayed estimated switching voltage output 38D, $V_{SW\_EST\_DELAY}$, and an estimated switching voltage output selection switch output 816C. The controller 50 may configure the estimated switching voltage output selection switch 816, $S_1$, to provide either the estimated switching voltage output 38B, $V_{SW\_EST}$, or the delayed estimated switching voltage output 38D, $V_{SW\_EST\_DELAY}$, as an estimated switching voltage input signal 820, $V_{SW\_I}$, at the estimated switching voltage output selection switch output 816C.

The parallel amplifier output impedance compensation circuit 37D also includes the first subtracting circuit 822, the $Z_{OUT}$ compensation high pass filter 824, the $G_{CORR}$ scalar circuit 826, the second subtracting circuit 828, the tune circuit 830, and the summing circuit 832. The first subtracting circuit 822 is configured to subtract the estimated switching voltage input signal 820, $V_{SW\_I}$, from the $V_{RAMP}$ signal to generate an expected difference signal 834, which is provided to the $Z_{OUT}$ compensation high pass filter 824. As discussed previously, the controller 50 may configure the programmable time constants associated with the $Z_{OUT}$ compensation high pass filter 824 to high pass filter the expected difference signal 834 in order to generate an estimated high frequency ripple signal 836.

Alternatively, the controller 50 may configure the estimated switching voltage output selection switch 816, $S_1$, to provide the estimated switching voltage output 38B, $V_{SW\_EST}$, as the estimated switching voltage input signal 820, $V_{SW\_I}$, to the $Z_{OUT}$ compensation high pass filter 824. In this case, the $Z_{OUT}$ compensation high pass filter 824 high pass filters the expected difference signal 834 to generate the estimated high frequency ripple signal 836. As such, the estimated high frequency ripple signal 836 substantially corresponds to a scaled derivative of a switcher ripple current in the inductor current, $I_{SW\_OUT}$, of the power inductor 16 based on the estimated switching voltage output 38B, $V_{SW\_EST}$. Similar to the parallel amplifier output impedance compensation circuit 37B, when the controller configures the estimated switching voltage output selection switch 816, $S_1$, to provide the estimated switching voltage output 38B, $V_{SW\_EST}$, as the estimated switching voltage input signal 820, $V_{SW\_I}$, the controller does not have the ability to adjust temporal alignment of the estimated switching voltage output 38B, $V_{SW\_EST}$, with the $V_{RAMP}$ signal in order to minimize the peak-to-peak ripple voltage on the power amplifier supply voltage, $V_{CC}$, due to the non-ideal output impedance of the parallel amplifier 35.

In contrast, when the controller 50 configures the estimated switching voltage output selection switch 816, $S_1$, to provide the delayed estimated switching voltage output 38D, $V_{SW\_EST\_DELAY}$, as the estimated switching voltage input signal 820, $V_{SW\_I}$, the controller 50 may adjust the delay provided by the programmable delay circuitry 806 to temporally align the delayed estimated switching voltage output 38D, $V_{SW\_EST\_DELAY}$, with the $V_{RAMP}$ signal.

The $Z_{OUT}$ compensation high pass filter 824 high pass filters the expected difference signal 834 to generate an estimated high frequency ripple signal 836 that may be scaled by the $G_{CORR}$ scalar circuit 826 to create the high frequency ripple compensation signal 838. The high frequency ripple compensation signal 838 is added to the analog pre-filtered $V_{RAMP}$ signal 814A, $V_{RAMP\_ANALOG\_PRE-FILTERED}$, to form the compensated $V_{RAMP}$ signal, $V_{RAMP\_C}$. The compensated $V_{RAMP}$ signal, $V_{RAMP\_C}$, is provided as an input to the parallel amplifier 35. The parallel amplifier generates the parallel amplifier output voltage, $V_{PARA\_AMP}$, based on the difference between the compensated $V_{RAMP}$ signal, $V_{RAMP\_C}$, and the power amplifier supply voltage, $V_{CC}$, at the power amplifier supply output 28.

The operation, configuration, and calibration of the tune circuit 830 of the parallel amplifier output impedance compensation circuit 37D, depicted in FIG. 5C, is substantially similar to the operation of the tune circuit 830 previously described with respect to the embodiment of the parallel amplifier output impedance compensation circuit 37B, depicted in FIG. 5A. As such, a detailed description of the operation of the tune circuit 830 herein is omitted.

Figure 5D:
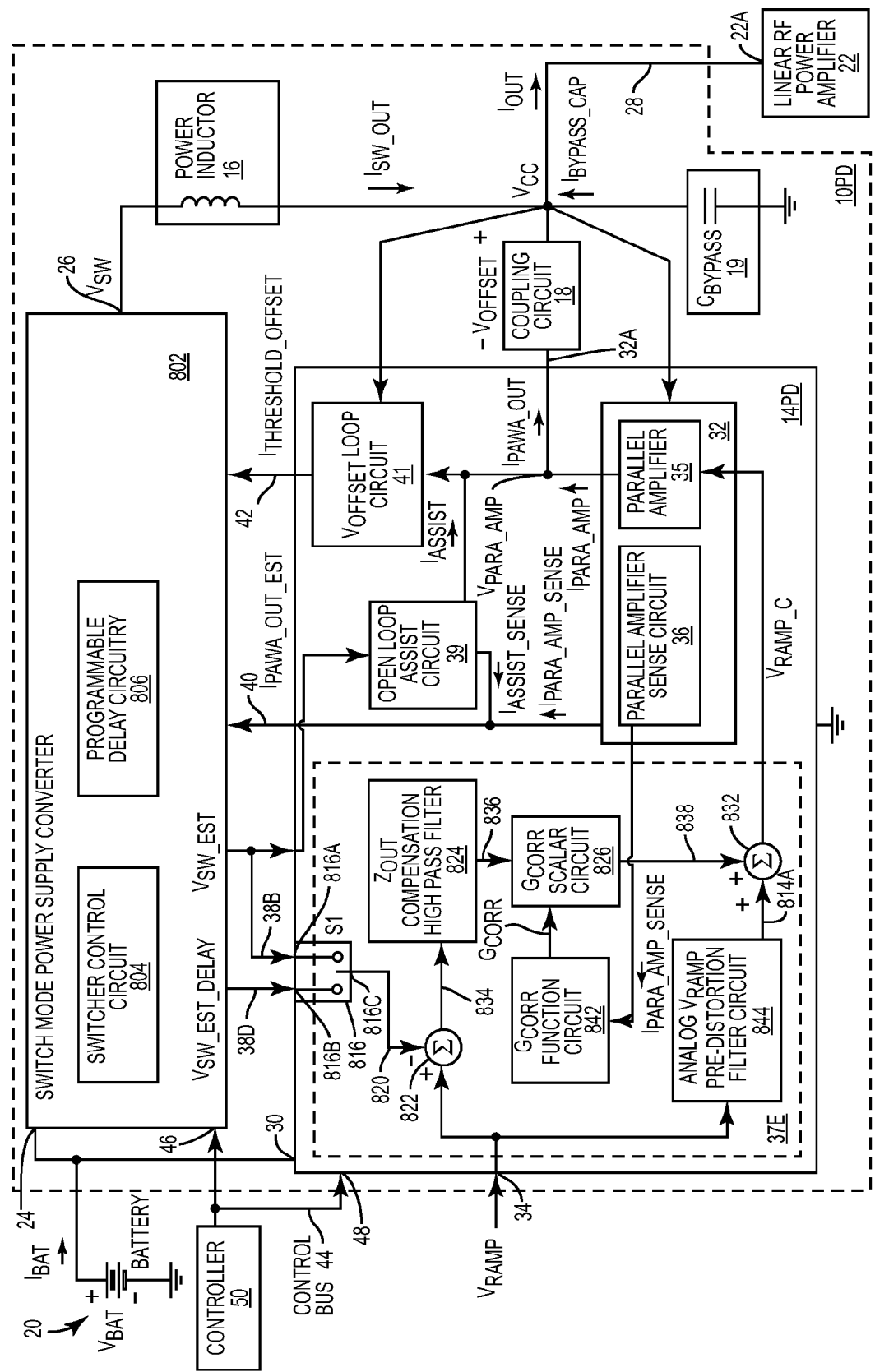
FIG. 5D depicts an alternative embodiment of a parallel amplifier output impedance compensation circuit.

FIG. 5D depicts an example embodiment of a pseudo-envelope follower power management system 10PD that is similar to the pseudo-envelope follower power management system 10PC, depicted in FIG. 5C. However, the pseudo-envelope follower power management system 10PD includes a parallel amplifier circuit 14PD. The parallel amplifier circuit 14PD includes a parallel amplifier output impedance compensation circuit 37E configured to provide the compensated $V_{RAMP}$ signal, $V_{RAMP\_c}$ to the parallel amplifier 35. Similar to the parallel amplifier output impedance compensation circuit 37D, depicted in FIG. 5C, the parallel amplifier output impedance compensation circuit 37E includes an analog $V_{RAMP}$ pre-distortion filter circuit 844 configured to receive the $V_{RAMP}$ signal in the analog domain. In addition, as previously described with respect to the analog $V_{RAMP}$ pre-distortion filter circuit 844, the controller 50 may configure the frequency response of the analog $V_{RAMP}$ pre-distortion filter circuit 844 to pre-distort the received the $V_{RAMP}$ signal.

Illustratively, as described before, the first time constant, $\tau_{ZERO\_PRE}$, and second time constant, $\tau_{POLE\_PRE}$, may be adjusted by the controller 50 to provide peaking of the $V_{RAMP}$ signal in order to equalize the overall frequency response between the first control input 34, which received the $V_{RAMP}$ signal, and the power amplifier collector 22A of a linear RF power amplifier 22. The controller 50 may configure the frequency response of the analog $V_{RAMP}$ pre-distortion filter circuit 844 to equalize the response of the pseudo-envelope follower power management system 10PA by adjusting the value of the programmable time constants of the analog $V_{RAMP}$ pre-distortion filter circuit 844, as previously described. In addition, similar to the parallel amplifier output impedance compensation circuit 37D, the controller 50 may configure the analog $V_{RAMP}$ pre-distortion filter circuit 844 of the parallel amplifier output impedance compensation circuit 37E to pre-distort the frequency response of the $V_{RAMP}$ signal such that the overall transfer function between the first control input 34, which received the $V_{RAMP}$ signal, and the power amplifier collector 22A of a linear RF power amplifier 22 is substantially flat through the operating frequency range of the linear RF power amplifier 22. For example, as described above, the controller 50 may configure the analog $V_{RAMP}$ pre-distortion filter circuit 844 to provide frequency peaking to compensate for the low pass filter response due to the combination of the power amplifier associated inductance, $L_{PA}$, (not shown) and the power amplifier associated capacitance, $C_{PA}$, (not shown) associated with the linear RF power amplifier 22.

However, unlike the parallel amplifier output impedance compensation circuit 37D, depicted in FIG. 5C, the parallel amplifier output impedance compensation circuit 37E, depicted in FIG. 5D, is configured to provide a high frequency ripple compensation signal 838 to generate the compensated $V_{RAMP}$ signal, $V_{RAMP\_C}$, in a fashion that is similar to the parallel amplifier output impedance compensation circuit 37C, depicted in FIG. 5B, where the scaling factor, $G_{CORR}$, is provided by the $G_{CORR}$ function circuit 842. Thus, similar to the parallel amplifier output impedance compensation circuit 37C, depicted in FIG. 5B, the parallel amplifier output impedance compensation circuit 37E includes a $C_{CORR}$ function circuit 842 configured to provide the scaling factor, $G_{CORR}$, to the $C_{CORR}$ scalar circuit 826. The form and function of the $C_{CORR}$ function circuit 842 of the parallel amplifier output impedance compensation circuit 37E is similar to the operation of the $G_{CORR}$ function circuit 842 of parallel amplifier output impedance compensation circuit 37C, depicted in FIG. 5B.

Accordingly, the parallel amplifier output impedance compensation circuit 37E, may include an estimated switching voltage output selection switch 816, $S_1$, having a first input 816A configured to receive the estimated switching voltage output 38B, $V_{SW\_EST}$, a second input 816B configured to receive the delayed estimated switching voltage output 38D, $V_{SW\_EST\_DELAY}$, and an estimated switching voltage output selection switch output 816C. The controller 50 may configure the estimated switching voltage output selection switch 816, $S_1$, to provide either the estimated switching voltage output 38B, $V_{SW\_EST}$, or the second input configured to receive the delayed estimated switching voltage output 38D, $V_{SW\_EST\_DELAY}$, as a estimated switching voltage input signal 820, $V_{SW\_P}$, at the estimated switching voltage output selection switch output 816C. As discussed above, if the controller 50 configures the estimated switching voltage output selection switch 816, $S_1$, to provide the delayed estimated switching voltage output 38D, $V_{SW\_EST\_DELAY}$, the controller 50 may configure the delay provided by the programmable delay circuitry 806 to temporally optimize the relationship between estimated switching voltage input signal 820, $V_{SW\_P}$, and the $V_{RAMP}$ signal to minimize the high frequency voltage ripple generated as a result of the non-ideal output impedance characteristics of the parallel amplifier 35.

Similar to the parallel amplifier output impedance compensation circuit 37C, the parallel amplifier output impedance compensation circuit 37E also includes the first subtracting circuit 822, $Z_{OUT}$ compensation high pass filter 824, the $G_{CORR}$ scalar circuit 826, and the summing circuit 832. The first subtracting circuit 822 is configured to subtract the estimated switching voltage input signal 820, $V_{SW\_P}$, from the $V_{RAMP}$ signal to generate an expected difference signal 834, which is provided to the $Z_{OUT}$ compensation high pass filter 824. Similar to the operation of the parallel amplifier output impedance compensation circuit 37D, depicted in FIG. 5C, the controller 50 may configure the programmable time constants associated with of the $Z_{OUT}$ compensation high pass filter 824 to high pass filter the expected difference signal 834 in order to generate an estimated high frequency ripple signal 836, which is scaled by $G_{CORR}$ scalar circuit 826 to create the high frequency ripple compensation signal 838.

Unlike the parallel amplifier output impedance compensation circuit 37D, depicted in FIG. 5C, the parallel amplifier output impedance compensation circuit 37E, depicted in FIG. 5D, provides the scaling factor, $G_{CORR}$, to the $G_{COOR}$ scalar circuit 826 from the $G_{CORR}$ function circuit 842. The $G_{CORR}$ function circuit 842 of the parallel amplifier output impedance compensation circuit 37E, depicted in FIG. 5D, is similar in form and function to the $G_{CORR}$ function circuit 842 of the parallel amplifier output impedance compensation circuit 37C, depicted in FIG. 5B. For example, the $G_{CORR}$ function circuit 842 of the parallel amplifier output impedance compensation circuit 37E may be configured to receive the scaled parallel amplifier output current estimate, $I_{PARA\_AMP\_SENSE}$, generated by the parallel amplifier sense circuit 36 of the parallel amplifier circuitry 32. In some embodiments of the parallel amplifier output impedance compensation circuit 37E, the $G_{CORR}$ function circuit 842 provides the scaling factor, $G_{CORR}$, to the $G_{CORR}$ scalar circuit 826 as a function of the scaled parallel amplifier output current estimate, $I_{PARA\_AMP\_SENSE}$, as previously described with respect to the parallel amplifier output impedance compensation circuit 37C, depicted in FIG. 5B. Alternatively, in some embodiments of the parallel amplifier output impedance compensation circuit 37E, the $G_{CORR}$ function circuit 842 may be configured by the controller 50 to provide the scaling factor, $G_{CORR}$, based on the ratio of the parallel amplifier inductance estimate parameter, $L_{CORR\_EST}$, to the estimated power inductor inductance parameter, $L_{EST}$, of the pseudo-envelope follower power management system 10PD, as described in equation (9), which is described above.

Alternatively, in some embodiments of the parallel amplifier output impedance compensation circuit 37E, controller 50 characterizes the $G_{CORR}$ function circuit 842 during either calibration of the pseudo-envelope follower power management system 10PD as described relative to the parallel amplifier output impedance compensation circuit 37C depicted in FIG. 5B, the details of which are omitted here for the sake of brevity.

Figure 5E:
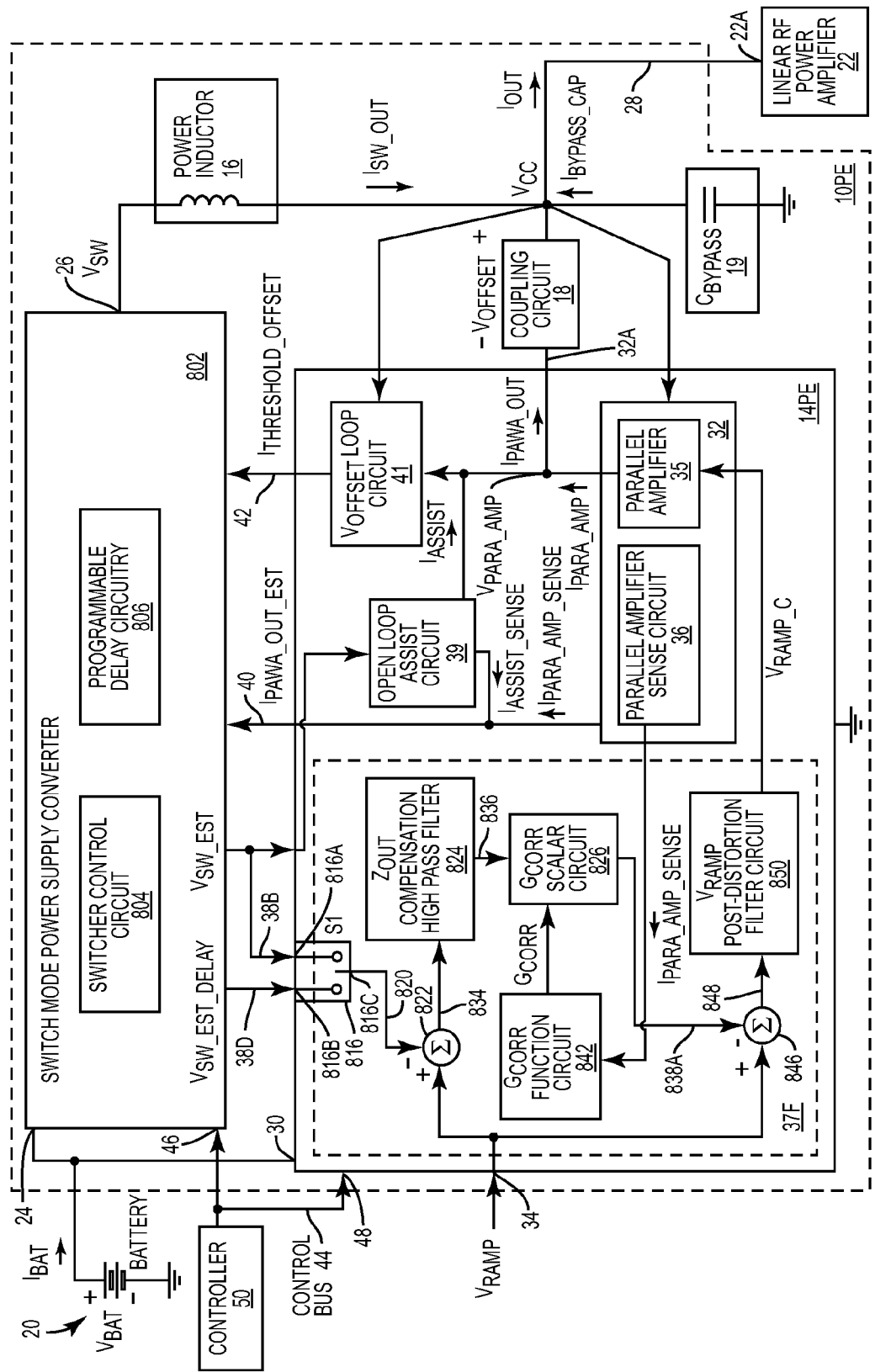
FIG. 5E depicts an alternative embodiment of a parallel amplifier output impedance compensation circuit.

FIG. 5E depicts an example embodiment of a pseudo-envelope follower power management system 10PE that is similar to the pseudo-envelope follower power management system 10PD, depicted in FIG. 5D. However, the pseudo-envelope follower power management system 10PE includes a parallel amplifier circuit 14PE. The parallel amplifier circuit 14PE includes a parallel amplifier output impedance compensation circuit 37F that is similar to the parallel amplifier output impedance compensation circuit 37E. However, unlike the parallel amplifier output impedance compensation circuit 37E, depicted in FIG. 5D, the parallel amplifier output impedance compensation circuit 37F, depicted in FIG. 5E, applies a parallel output impedance correction signal 838A to the $V_{RAMP}$ signal prior to applying equalization of the input signal provided to the parallel amplifier 35.

Similar to the parallel amplifier output impedance compensation circuit 37E, depicted in FIG. 5D, the parallel amplifier output impedance compensation circuit 37E, depicted in FIG. 34F, may include an estimated switching voltage output selection switch 816, $S_1$, having a first input 816A configured to receive the estimated switching voltage output 38B, $V_{SW\_EST}$, a second input 816B configured to receive the delayed estimated switching voltage output 38D, $V_{SW\_EST\_DELAY}$. The controller 50 may configure the estimated switching voltage output selection switch 816, $S_1$, to provide either the estimated switching voltage output 38B, $V_{SW\_EST}$, or the delayed estimated switching voltage output 38D, $V_{SW\_EST\_DELAY}$, as the estimated switching voltage input signal 820, $V_{SW\_I}$, to the first subtracting circuit 822. The first subtracting circuit 822 is configured to subtract the estimated switching voltage input signal 820, $V_{SW\_I}$, from the $V_{RAMP}$ signal to generate an expected difference signal 834, which is provided to the $Z_{OUT}$ compensation high pass filter 824. As previously described, the controller 50 may configure the programmable time constants associated with of the $Z_{OUT}$ compensation high pass filter 824 to high pass filter the expected difference signal 834 in order to generate an estimated high frequency ripple signal 836. The estimated high frequency ripple signal 836 is then scaled by the $G_{CORR}$ scalar circuit 826 based on the scaling factor, $G_{CORR}$, received from the $G_{CORR}$ function circuit 842 to generate the high frequency ripple compensation signal 838A. The operation and configuration of the $G_{CORR}$ function circuit 842, depicted in FIG. 5E, is similar in form and function as the $G_{CORR}$ function circuit 842, previously described and depicted in FIG. 5B and FIG. 5D, and therefore a detailed description of the calibration, function and operation of the $G_{CORR}$ function circuit 842 is hereby omitted.

Unlike the previously described embodiments of the parallel amplifier output impedance compensation circuits 37B-E, depicted in FIG. 5A-D, the parallel amplifier output impedance compensation circuit 37F, depicted in FIG. 5E, includes a pre-distortion subtraction circuit 846 configured to subtract the high frequency ripple compensation signal 838A from the $V_{RAMP}$ signal prior to pre-distorting the $V_{RAMP}$ signal to form a non-filtered parallel amplifier output impedance compensated signal 848. The non-filtered parallel amplifier output impedance compensated signal 848 represents a $V_{RAMP}$ signal that has been compensated to take into consideration the non-ideal output impedance characteristics of the parallel amplifier 35. The parallel amplifier output impedance compensation circuit 37F further includes a $V_{RAMP}$ post-distortion filter circuit 850 configured to filter the non-filtered parallel amplifier output impedance compensated signal 848 to generate the compensated $V_{RAMP}$ signal, $V_{RAMP\_C}$.

The $V_{RAMP}$ post-distortion filter circuit 850 may have a Laplace transfer function similar to the transfer function described by equation (11), as follows:

$$H(s)_{V_{RAMP}\text{Post-Distortion Filter Circuit}} = \frac{(1 + \tau_{ZERO\_POST}s)}{(1 + \tau_{POLE\_POST}s)} \quad (11)$$

where, $\tau_{ZERO\_POST}$, is a first post distortion time constant associated with zero in the $V_{RAMP}$ post-distortion filter circuit 850 and, $\tau_{POLE\_POST}$, is a second post distortion time constant associated with pole of the $V_{RAMP}$ post-distortion filter circuit 850. The first post distortion time constant, $\tau_{ZERO\_POST}$ and the second post distortion time constant, $\tau POLE_{\_POST}$, may be configured to distort the non-filtered parallel amplifier output impedance compensated signal 848 to equalize the overall modulation frequency response of the pseudo-envelope follower power management system 10PE. As an example, similar to the analog $V_{RAMP}$ pre-distortion filter circuit 844, depicted in FIG. 5C and FIG. 5D, the controller 50 may be configured to adjust the first post distortion time constant, $\tau_{ZERO\_POST}$, and the post distortion time constant, $\tau_{POLE\_POST}$, to provide peaking of the non-filtered parallel amplifier output impedance compensation signal 848 in order to equalize the overall modulation frequency response of the pseudo-envelope follower power management system 10PE, depicted in FIG. 5E, as well as the low pass filtering characteristics of the combination of the power amplifier associated inductance, $L_{PA}$, (not shown), and the power amplifier filter associated capacitance, $C_{PA}$, (not shown). The controller 50 may configure of the first post distortion time constant, $\tau_{ZERO\_POST}$, and the second post distortion time constant, $\tau_{POLE\_POST}$, such that the transfer function of the $V_{RAMP}$ post-distortion filter circuit 850 is based on the RF modulation bandwidth of the linear RF power amplifier 22 associated with a wide-bandwidth modulation of a mode of operation of electronic device or mobile terminal that includes the pseudo-envelope follower power management system 10PE. As an example, the controller 50 may configure the first post distortion time constant, $\tau_{ZERO\_PRE}$, and second post distortion time constant, $\tau_{POLE\_POST}$, to provide peaking of the non-filtered parallel amplifier output impedance compensation signal 848 in order to flatten the overall modulation frequency response of the pseudo-envelope follower power management system 10PC based on the wide-bandwidth modulation of a mode of operation of electronic device or mobile terminal.

Those skilled in the art will recognize improvements and modifications to the embodiments of the present disclosure. All such improvements and modifications are considered within the scope of the concepts disclosed herein and the claims that follow.

What is claimed:
1. Circuitry comprising:
a switch mode power supply converter configured to generate an estimated switching voltage output, which is indicative of a switching voltage;
a parallel amplifier configured to generate a power amplifier supply voltage at a power amplifier supply output based on a combination of a $V_{RAMP}$ signal and a high frequency ripple compensation signal; and
a parallel amplifier output impedance compensation circuit configured to provide the high frequency ripple compensation signal based on a difference between the $V_{RAMP}$ signal and the estimated switching voltage output.

2. The circuitry of claim 1 wherein the estimated switching voltage output is a delayed estimated switching voltage output and a controller is configured to temporally align the delayed estimated switching voltage output with respect to the $V_{RAMP}$ signal.

3. The circuitry of claim 1 wherein the switch mode power supply converter comprises programmable delay circuitry configured to delay generation of the estimated switching voltage output by an alignment period to temporally align the estimated switching voltage output with the $V_{RAMP}$ signal.

4. The circuitry of claim 3 wherein the alignment period is set to minimize a peak-to-peak ripple voltage on the power amplifier supply voltage.

5. The circuitry of claim 1 wherein the parallel amplifier output impedance compensation circuit comprises a subtracting circuit configured to provide an expected difference signal based on the difference between the $V_{RAMP}$ signal and the estimated switching voltage output.

6. The circuitry of claim 5 wherein the parallel amplifier output impedance compensation circuit further comprises:
a $Z_{OUT}$ compensation high pass filter configured to high pass filter the expected difference signal to generate an estimated high frequency ripple signal; and
a scalar circuit configured to scale the estimated high frequency ripple signal based on a scaling factor to generate the high frequency ripple compensation signal.

7. The circuitry of claim 1 wherein the parallel amplifier output impedance compensation circuit comprises a scalar circuit configured to scale an estimated high frequency ripple signal based on a scaling factor to generate the high frequency ripple compensation signal, wherein the estimated high frequency ripple signal is based on the difference between the $V_{RAMP}$ signal and the estimated switching voltage output.

8. The circuitry of claim 7 wherein the scaling factor is based on a band of operation of a radio frequency power amplifier.

9. The circuitry of claim 7 wherein the scaling factor is based on an estimated inductance associated with the parallel amplifier between frequencies of 10 MHz and 30 MHz.

10. The circuitry of claim 7 wherein the scaling factor is based on a scaled parallel amplifier output current estimate associated with the parallel amplifier.

11. The circuitry of claim 7 wherein the parallel amplifier output impedance compensation circuit further comprises a tune circuit configured to provide the scaling factor based on a difference between the $V_{RAMP}$ signal and the power amplifier supply voltage.

12. The circuitry of claim 11 wherein the parallel amplifier output impedance compensation circuit further comprises a subtracting circuit configured to subtract the power amplifier supply voltage from the combination of the $V_{RAMP}$ signal and the high frequency ripple compensation signal to provide a feedback signal, wherein the scaling factor is further based on the feedback signal.

13. The circuitry of claim 1 wherein the parallel amplifier output impedance compensation circuit further comprises a $V_{RAMP}$ pre-distortion filter circuit configured to pre-distort the $V_{RAMP}$ signal to provide a pre-filtered $V_{RAMP}$ signal, wherein the combination of the $V_{RAMP}$ signal and the high frequency ripple compensation signal is based on a combination of the pre-filtered $V_{RAMP}$ signal and the high frequency ripple compensation signal.

14. The circuitry of claim 13 wherein the $V_{RAMP}$ pre-distortion filter circuit is further configured to pre-distort the $V_{RAMP}$ signal to provide a frequency response that is substantially flattened through a desired frequency range.

15. The circuitry of claim 13 wherein the $V_{RAMP}$ pre-distortion filter circuit is further configured to pre-distort the $V_{RAMP}$ signal to provide frequency peaking to compensate for a low pass filter effect of a combination of a power amplifier associated inductance and a power amplifier associated capacitance.

16. The circuitry of claim 13 wherein the parallel amplifier output impedance compensation circuit further comprises a summing circuit configured to add the pre-filtered $V_{RAMP}$ signal to the high frequency ripple compensation signal to provide the combination of the $V_{RAMP}$ signal and the high frequency ripple compensation signal.

17. The circuitry of claim 1 wherein the parallel amplifier output impedance compensation circuit further comprises a pre-distortion subtraction circuit configured to subtract the high frequency ripple compensation signal from the $V_{RAMP}$ signal to provide a non-filtered parallel amplifier output impedance compensation signal, such that the combination of the $V_{RAMP}$ signal and the high frequency ripple compensation signal is based on the non-filtered parallel amplifier output impedance compensation signal.

18. The circuitry of claim 1 wherein the parallel amplifier output impedance compensation circuit further comprises a $V_{RAMP}$ post-distortion filter circuit configured to filter a non-filtered parallel amplifier output impedance compensation signal, such that the non-filtered parallel amplifier output impedance compensation signal is based on the combination of the $V_{RAMP}$ signal and the high frequency ripple compensation signal.

19. The circuitry of claim 1 further comprising a coupling circuit coupled between the parallel amplifier and the power amplifier supply output.

20. The circuitry of claim 1 wherein the switch mode power supply converter is configured as a multi-level charge pump buck converter.

21. A method comprising:
generating an estimated switching voltage output, which is indicative of a switching voltage;
generating a power amplifier supply voltage at a power amplifier supply output based on a combination of a $V_{RAMP}$ signal and a high frequency ripple compensation signal; and
providing the high frequency ripple compensation signal based on a difference between the $V_{RAMP}$ signal and the estimated switching voltage output.

* * * * *